United States Patent
Tak

(10) Patent No.: US 12,155,181 B2
(45) Date of Patent: Nov. 26, 2024

(54) SUB-MODULE

(71) Applicant: LS ELECTRIC CO., LTD., Anyang-si (KR)

(72) Inventor: Sungjun Tak, Anyang-si (KR)

(73) Assignee: LS ELECTRIC CO., LTD., Anyang-si (KR)

( * ) Notice: Subject to any disclaimer, the term of this patent is extended or adjusted under 35 U.S.C. 154(b) by 231 days.

(21) Appl. No.: 17/797,239

(22) PCT Filed: Jan. 5, 2021

(86) PCT No.: PCT/KR2021/000053
§ 371 (c)(1),
(2) Date: Aug. 3, 2022

(87) PCT Pub. No.: WO2021/157874
PCT Pub. Date: Aug. 12, 2021

(65) Prior Publication Data
US 2023/0064311 A1 Mar. 2, 2023

(30) Foreign Application Priority Data
Feb. 3, 2020 (KR) .................. 10-2020-0012773

(51) Int. Cl.
*H05K 5/02* (2006.01)
*H02B 1/16* (2006.01)
(Continued)

(52) U.S. Cl.
CPC ............... *H02B 1/16* (2013.01); *H02B 1/20* (2013.01); *H05K 5/0247* (2013.01); *H05K 7/14* (2013.01)

(58) Field of Classification Search
CPC ..................... H05K 5/0247; H05K 7/14
(Continued)

(56) References Cited

U.S. PATENT DOCUMENTS
2021/0198052 A1* 7/2021 Nagelmüller ...... H05K 7/14325

FOREIGN PATENT DOCUMENTS
KR 101410731 B1 6/2014
KR 20140115666 A 10/2014
(Continued)

OTHER PUBLICATIONS
International Search Report for related International Application No. PCT/KR2021/000053; action dated Aug. 12, 2021; (5 pages).
(Continued)

*Primary Examiner* — Hung S. Bui
(74) *Attorney, Agent, or Firm* — K&L Gates LLP

(57) ABSTRACT

A sub-module is disclosed. A sub-module according to an embodiment of the present invention comprises a short-circuiting control part. The short-circuiting control part comprises a movable member slidably coupled to a frame on which capacitor assemblies are seated. A variable connector is coupled to the movable member. Moreover, a plurality of short-circuiting blocks are arranged on the frame while being spaced away from each other. When the movable member has slid, the variable connector comes into contact with one or more short-circuiting blocks adjacent to each other to be electrically conductive. The short-circuiting blocks are connected to the capacitor assemblies, respectively, to be electrically conductive. Therefore, a plurality of capacitor elements can be short-circuited simultaneously only by moving the movable member.

17 Claims, 20 Drawing Sheets

(51) Int. Cl.
*H02B 1/20* (2006.01)
*H05K 7/14* (2006.01)

(58) Field of Classification Search
USPC .......................................................... 361/728
See application file for complete search history.

(56) References Cited

FOREIGN PATENT DOCUMENTS

| KR | 101512188 B1 | 4/2015 |
| KR | 20160122015 A | 10/2016 |
| KR | 20170051938 A | 5/2017 |
| KR | 20170070599 A | 6/2017 |
| KR | 20170090928 A | 8/2017 |

OTHER PUBLICATIONS

Written Opinion for related International Application No. PCT/KR2021/000053; action dated Aug. 12, 2021; (5 pages).
Korean Notice of Allowance for related Korean Application No. 10-2020-0012773; action dated Jan. 20, 2022; (2 pages).
Korean Office Action for related Korean Application No. 10-2020-0012773; action dated Jul. 19, 2021; (3 pages).

* cited by examiner (a)

(b)

SUB-MODULE

CROSS-REFERENCE TO RELATED APPLICATIONS

This application is the National Stage filing under 35 U.S.C. 371 of International Application No. PCT/KR2021/000053, filed on Jan. 5, 2021, which claims the benefit of earlier filing date of and rights of priority to Korean Patent Application No. 10-2020-0012773 filed on Feb. 3, 2020, the contents of all these applications are hereby expressly incorporated by reference into the present application.

FIELD

The present disclosure relates to a sub-module, and more particularly, to a sub-module having a structure in which a capacitor element provided in each of a plurality of sub-modules can be easily short-circuited.

BACKGROUND

A flexible transmission system or a new power transmission system (FACTS, Flexible AC Transmission System) is an operating technology that increases flexibility of a power system by introducing a power electronic control technology to an AC power system.

Specifically, the flexible transmission system may control transmission power by using a semiconductor switching element for power. Such a flexible transmission system can maximize facility utilization of a power transmission line, increase a power transmission capacity, and minimize a voltage fluctuation.

The power transmission capacity of the flexible power transmission system may change depending on the number or capacity of capacitor elements for storing power. That is, in order to increase the power transmission capacity, a plurality of capacitor elements must be provided or the capacity of each capacitor element must be increased.

In the case, additional members for controlling the capacitor elements are required as the total power transmission capacity increases. In addition, there is inconvenience in that a complicated process is required to electrically connect additional capacitor elements and additional members.

Recently, a technology of configuring a single module by combining a capacitor element and a connector that controls the capacitor element and is electrically connected to the capacitor element has been introduced. That is, just by adding one module, the power transmission capacity is increased and each member necessary for this is provided.

The capacitor elements are electrically connected to one another. When a user approaches the module in a state in which the capacitor element is conducted with a high voltage due to power stored therein, there is a fear that an electric accident may occur.

Therefore, an operation for lowering the voltage of the capacitor element should be first carried out before performing maintenance or the like. However, when the flexible transmission system is configured by a set of modules, there is inconvenience of having to drop the voltage of the capacitor element provided in each of the module.

Korean Registration Patent Document No. 10-1512188 discloses a method and apparatus for operating a modular multilevel converter. Specifically, an operating method for controlling a current flowing through a converter using a current reference value in each valve and an operating apparatus for implementing the same are disclosed.

However, the prior art document does not suggest a method for short-circuiting or grounding each capacitor provided in a modular form at the same time, although there are considerations on the method for controlling the current.

Korean Registration Patent Document No. 10-1410731 discloses a method of suppressing a circulation current of a modular multilevel converter for high-voltage direct current transmission. Specifically, a method for removing an AC component remaining in a circulation current which circulates between modular multilevel converters is disclosed.

However, the prior art document only suggests the method related to the component control of the circulation current which circulates between modules, and does not suggest a method for short-circuiting to each other or simultaneously grounding each capacitor provided in the modular form.

In addition, the prior art documents teach electric circuits and controls, but fails to suggest a detailed structure for implementing the same.

SUMMARY

The present disclosure is directed to providing a sub-module having a structure capable of solving those problems and other drawbacks.

First, one aspect of the present disclosure is to provide a sub-module having a structure capable of easily grounding a capacitor element provided in the sub-module.

Another aspect of the present disclosure is to provide a sub-module having a structure capable of easily short-circuiting each capacitor element provided in a plurality of sub-modules.

Still another aspect of the present disclosure is to provide a sub-module having a structure capable of easily grounding each capacitor element provided in a plurality of sub-modules.

Still another aspect of the present disclosure is to provide a sub-module having a structure capable of simultaneously short-circuiting or grounding each capacitor element provided in a plurality of sub-modules.

Still another aspect of the present disclosure is to provide a sub-module having a structure capable of simultaneously releasing each short-circuited or grounded capacitor element provided in a plurality of sub-modules.

Still another aspect of the present disclosure is to provide a sub-module having a structure capable of preventing safety accidents that may occur in the process of performing those operations.

Still another aspect of the present disclosure is to provide a sub-module having a structure capable of easily detecting whether a plurality of sub-modules are short-circuited or electrically spaced apart from one another.

To achieve those aspects and other advantages according to an implementation of the present disclosure, there is provided a sub-module that may include a variable connector electrically connected to external electronic equipment, a movable member coupled to the variable connector and extending in one direction, and a short-circuiting block electrically brought into contact with or spaced apart from the variable connector. The electronic equipment may be seated on one surface of the frame, the short-circuiting block may be coupled to another surface of the frame, and the movable member may be coupled to the another surface of the frame to be slidable in the one direction or in a direction opposite to the one direction.

The short-circuiting block of the sub module may be provided in plurality disposed to be spaced apart from each other by a predetermined distance. The variable connector may be located between adjacent short-circuiting blocks of the plurality of short-circuiting blocks, and moved together with the movable member when the movable member is slid in the one direction or the opposite direction to the one direction, so as to be located at a first position where the variable connector is electrically brought into contact with at least one of the adjacent short-circuiting blocks, and a second position where the variable connector is spaced apart from all of the adjacent short-circuiting blocks.

The electronic equipment of the sub-module may be provided in plurality, which may be electrically connected to a plurality of variable connectors, respectively.

The plurality of electronic equipment of the sub module which is electrically connected to the short-circuiting blocks adjacent to each other, respectively, may be short-circuited to each other when the variable connector is electrically brought into contact with the short-circuiting blocks.

The electronic equipment of the sub-module may be a capacitor assembly accommodating a capacitor element therein.

Surfaces, facing each other, of the adjacent short-circuiting blocks of the sub-module may be inclined away from each other in a direction toward the movable member.

The short-circuiting block of the sub-module may have a trapezoidal shape with a cross-section in which an extension length of one surface coupled to the frame in the one direction is longer than an extension length of another surface facing the one surface in the one direction.

The variable connector of the sub-module may extend in the one direction.

The variable connector of the sub-module may include a first connector end portion that is an end portion facing any one of the short-circuiting blocks adjacent to each other, and a second connector end portion that is an end portion located opposite to the first connector end portion and facing another one of the short-circuiting blocks adjacent to each other.

The first connector end portion of the sub-module may be electrically brought into contact with the one of the short-circuiting blocks adjacent to each other, and the second connector end portion may be electrically brought into contact with or spaced apart from the another short-circuiting block when the movable member is slid in the one direction or the opposite direction to the one direction.

Each of the first connector end portion and the second connector end portion of the sub-module may be formed such that one side facing the frame is rounded.

The variable connector of the sub-module may include a portion extending between the first connector end portion and the second connector end portion. Each of the first connector end portion and the second connector end portion may form an obtuse angle with the portion and extend toward the frame, such that a cross-section thereof has a shape of a part of a trapezoid.

The movable member of the sub-module may include a plurality of end portion insertion grooves formed therethrough and extending in the one direction, and the plurality of end portion insertion grooves may be spaced apart from each other by a predetermined distance. The variable connector may be disposed to face the frame with the movable member interposed therebetween, and extend between the end portion insertion grooves adjacent to each other.

The variable connector of the sub-module may extend in the one direction. Any one of end portions of the variable connector in the extending direction may extend through one of the end portion insertion grooves adjacent to each other, and another one of the end portions of the variable connector tors in the extending direction may extend through another one of the end portion insertion grooves adjacent to each other.

The sub-module may further include a link member coupled to the movable member, and a short-circuiting control lever coupled to the link member. The movable member may be moved in the one direction or the opposite direction to the one direction when the short-circuiting control lever is rotated.

The link member of the sub-module may include a rotation shaft portion coupled to the short-circuiting control lever, a first link coupled to the rotation shaft portion to perform an orbiting motion according to a rotation of the rotation shaft portion, and a second link coupled to the first link to perform a translational motion by the orbiting motion of the first link. The movable member may be coupled to the second link.

The sub-module may include an indicator housing to which the short-circuiting control lever is rotatably coupled. The indicator housing may include a first display and a second display spaced apart from the first display by a predetermined distance.

The first display of the sub-module may be located to be biased in one direction in which the short-circuiting control lever is rotated, and the second display may be located to be biased in a direction opposite to the one direction in which the short-circuiting control lever is rotated.

The short-circuiting control lever of the sub-module may be located to cover the first display when the short-circuiting control lever is rotated at a predetermined angle in the one direction, and the short-circuiting control lever may be located to cover the second display when the short-circuiting control lever is rotated at a predetermined angle in the opposite direction to the one direction.

According to the present disclosure, the following effects can be achieved.

First, a capacitor assembly including a capacitor element therein is mounted on a frame. A movable member to which a variable connector is coupled is slidably coupled to the frame.

When the movable member is moved, the variable connector can be electrically connected by being in contact with a short-circuiting block. Accordingly, the capacitor element provided in a sub-module can be easily grounded.

The short-circuiting block and the variable connector may be provided in plurality. The variable connector can be moved together with the movable member between short-circuiting blocks adjacent to each other. When the movable member is moved, the variable connector is electrically brought into contact with the short-circuiting blocks adjacent to each other.

Accordingly, capacitor elements included in a plurality of sub-modules, respectively, can be easily short-circuited to each other.

The short-circuiting block is electrically connected to a blocking plate. The blocking plate functions as a ground. When the movable member is moved, the variable connector is electrically brought into contact with all of the short-circuiting blocks adjacent to each other, each electrically connected to the blocking plate.

Accordingly, the capacitor elements included in the plurality of sub-modules, respectively, can be easily grounded.

When the movable member is slid while the variable connector is in contact with any one of the short-circuiting blocks adjacent to each other, the variable connector can be brought into contact with all of the short-circuiting blocks adjacent to each other.

Therefore, the capacitor elements included in the plurality of sub-modules can be simultaneously short-circuited or grounded by simply sliding the movable member.

When the movable member is slid while the variable connector is in contact with all of the short-circuiting blocks adjacent to each other, the variable connector can be brought into contact with any one of the short-circuiting blocks adjacent to each other.

Therefore, the short-circuited or grounded state between the capacitor elements included in the plurality of sub-modules can be released simply by sliding the movable member.

The movable member is connected to a link member. The link member is connected to a short-circuiting control lever which is rotated by a user. When the short-circuiting control lever is rotated, the link member converts a rotational motion into a linear motion of the movable member.

Accordingly, the user can realize the short-circuited or grounded state between the capacitor elements provided in the plurality of sub-modules simply by rotating the short-circuiting control lever.

In addition, an indicator housing to which the short-circuiting control lever is rotatably coupled is spaced apart from the sub-module. The user can perform the operation by manipulating the short-circuiting control lever spaced apart from the sub-module.

Accordingly, the user can manipulate the short-circuiting control lever without approaching the sub-module. This can prevent a safety accident that may occur during the operation.

In addition, the indicator housing includes a first display and a second display. When the short-circuiting control lever is rotated to one side, any one of the first display and the second display is covered by the short-circuiting control lever. The covered display may output a state different from a state formed by the short-circuiting control lever.

This can facilitate the user to confirm the electrical connection state by rotating the short-circuiting control lever. Accordingly, the user's convenience can be improved.

DETAILED DESCRIPTION

Hereinafter, a sub-module according to an implementation of the present disclosure will be described in detail, with reference to the accompanying drawings.

In the following description, descriptions of some components will be omitted to help understanding of the present disclosure.

1. Definition of Terms

The term "electrical connection" used in the following description refers to a state in which an electrical signal such as a current is transmitted between one or more members. In one implementation, the electrically-connected state may be enabled by a wire or the like.

The term "communication" used in the following description refers to a state in which one or more members are connected such that a fluid can flow. In one implementation, the communicated state may be enabled by a pipe or the like.

The term "cooling fluid" used in the following description refers to any fluid that can exchange heat with another member. In one implementation, the cooling fluid may be water.

Figure 1:
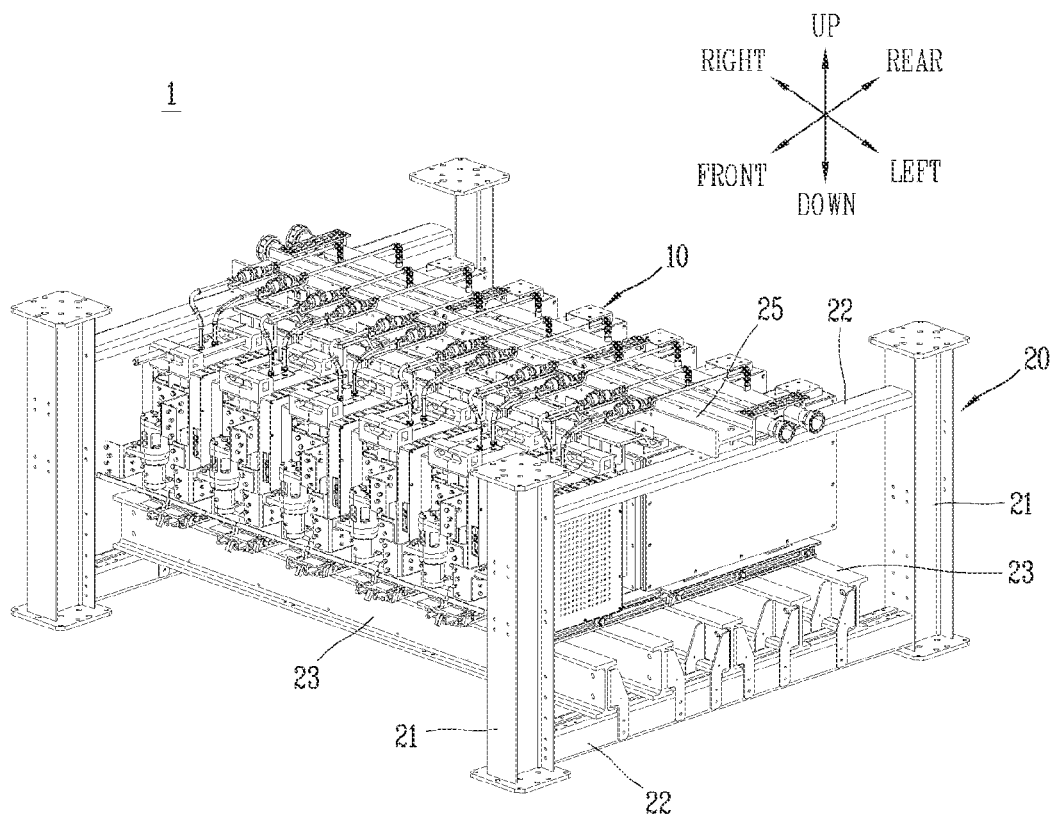
FIG. 1 is a perspective view illustrating a modular multilevel converter including sub-modules in accordance with an implementation of the present disclosure.
Figure 2:
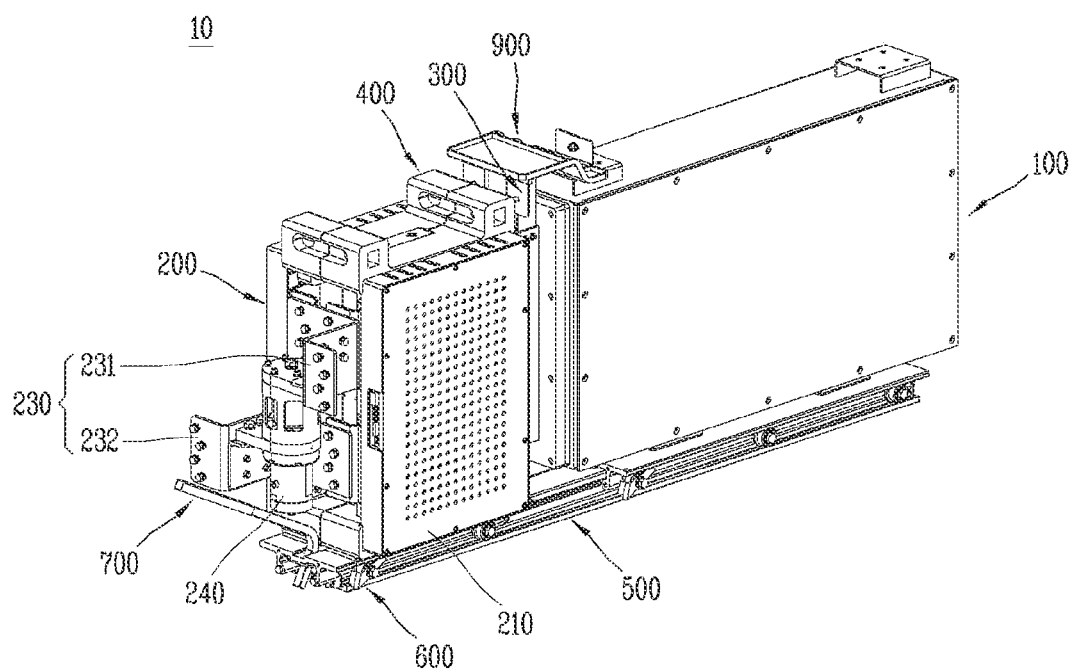
FIG. 2 is a perspective view illustrating a sub-module in accordance with one implementation.
Figure 3:
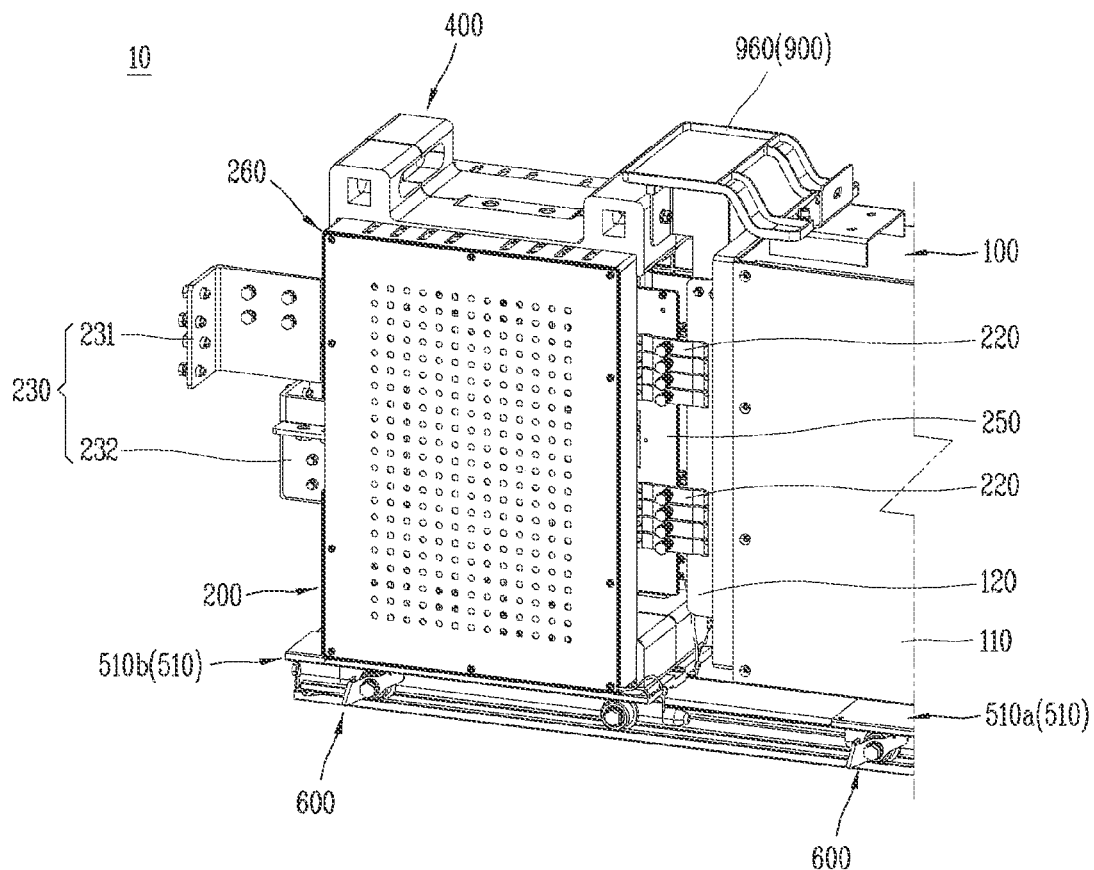
FIG. 3 is a partially enlarged perspective view illustrating a connection relationship between a capacitor assembly and a valve assembly of the sub-module of FIG. 2.
Figure 4:
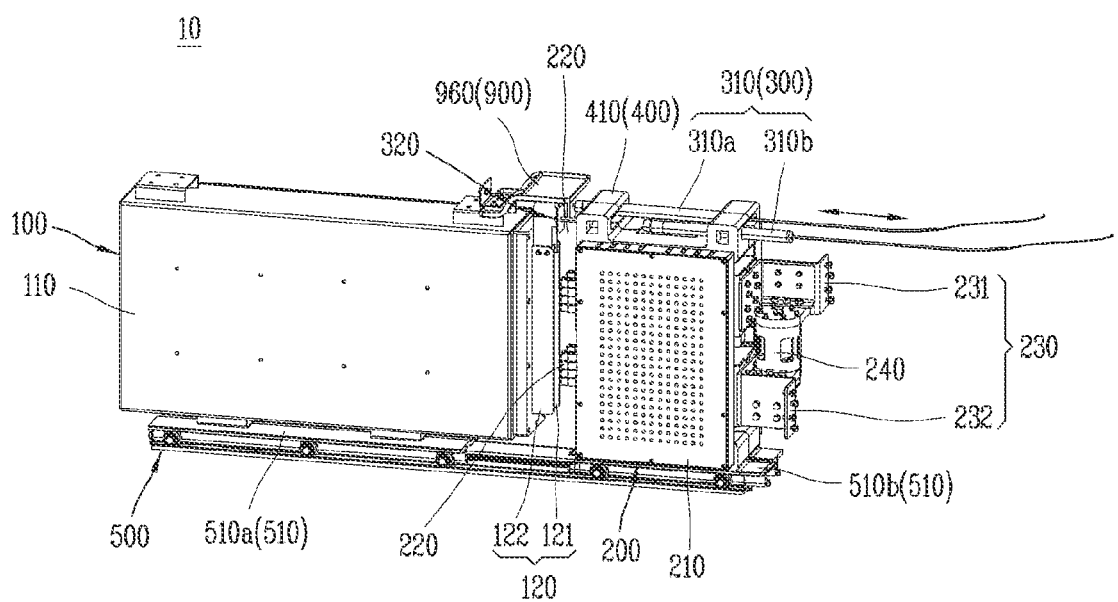
FIG. 4 is a perspective view illustrating the sub-module of FIG. 2, viewed from another angle.
Figure 5:
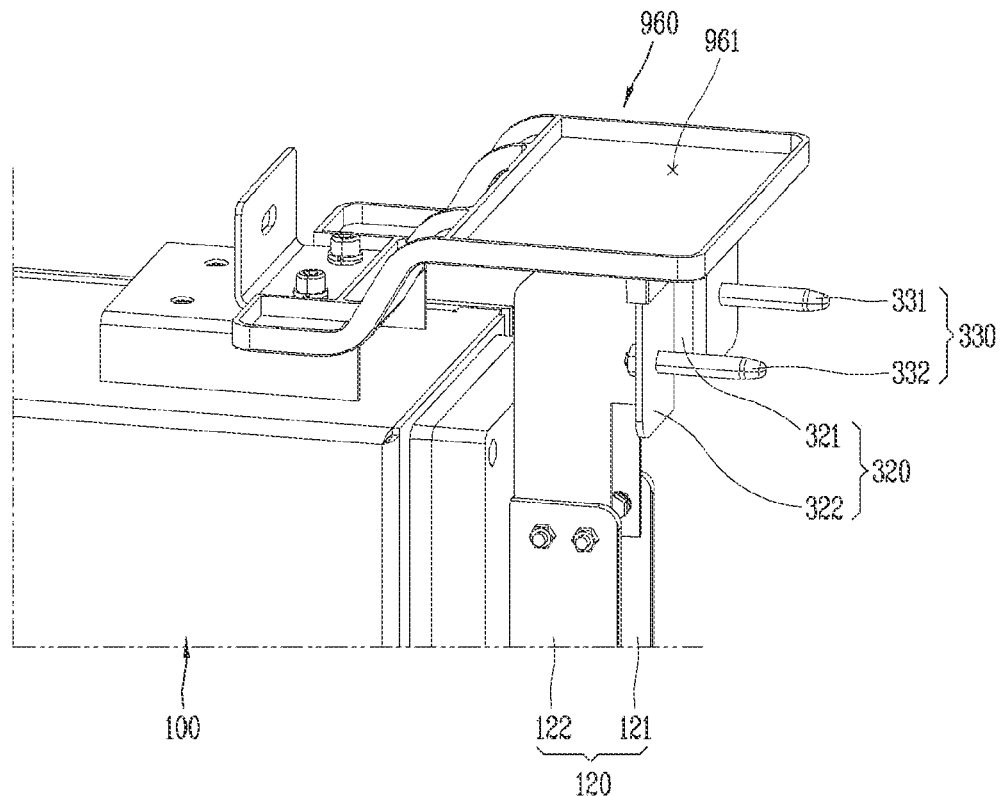
FIG. 5 is a partially enlarged perspective view illustrating a grounding part coupled to the capacitor assembly of the sub-module of FIG. 2.
Figure 6:
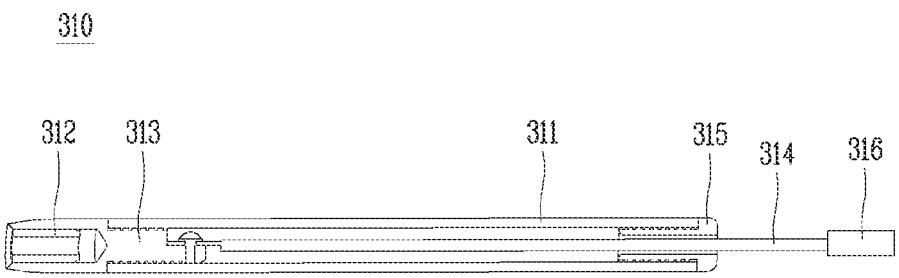
FIG. 6 is a cross-sectional view illustrating an internal configuration of a grounding rod unit electrically connected to the grounding part of FIG. 5.

The terms "front", "rear", "left", "right", "top or upper" and "bottom or lower" used in the following description will be understood based on a coordinate system illustrated in FIG. 1. That is, in the following description, it is assumed that a valve assembly 200 is located at the front of a capacitor assembly 100.

2. Description of Configuration of Modular Multilevel Converter 1 According to Implementation Referring to FIG. 1, a modular multilevel converter 1 according to an implementation is illustrated. The modular multilevel converter 1 may function as a STATCOM (Static Synchronous Compensator).

That is, the modular multilevel converter 1 is a kind of static Var compensator, and functions to improve stability by supplementing a voltage lost during transmission and distribution of electricity or power.

The multilevel converter 1 according to the implementation includes a plurality of sub-modules 10 and a frame 20.

The sub-module 10 substantially performs the function of the modular multilevel converter 1. The sub-module 10 may be provided in plurality. According to the number of sub-modules 10 provided, the capacity of the modular multilevel converter 1 may be increased.

The sub-modules 10 are electrically connected to one another. In one implementation, the sub-modules 10 may be connected in series.

In the illustrated implementation, totally six sub-modules 10 may be provided and disposed in a left and right direction to be spaced apart from one another by predetermined distances. The number of sub-modules 10 provided may vary.

The sub-module 10 is supported by the frame 20. In the illustrated implementation, the sub-module 10 is supported by a frame 20 forming one layer.

The frame 20 defines the framework of the modular multilevel converter 1. The frame 20 supports the sub-module 10 from an upper side or a lower side.

A detailed description of the sub-module 10 will be described later.

The frame 20 may be formed of a material having high rigidity. In one implementation, the frame 20 may be formed of steel. In addition, the frame 20 may be formed in the shape of an H-beam, so as to reinforce the rigidity of the frame 20 in an axial direction.

The frame 20 may be provided in plurality. The plurality of frames 20 may be stacked on one another. The sub-modules 10 supported by the frame 20 may also be arranged in a plurality of layers. Accordingly, the capacity of the modular multilevel converter 1 can be increased.

Figure 22:
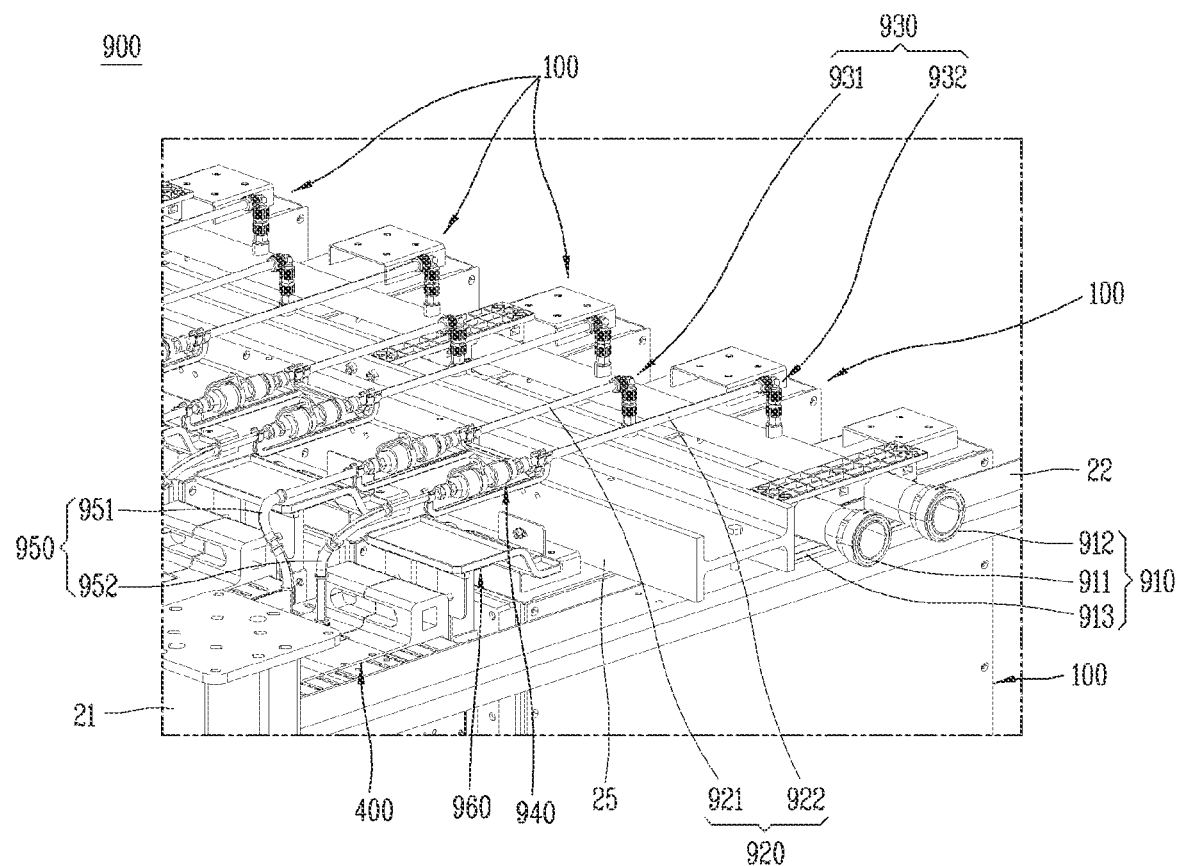
FIG. 22 is a perspective view illustrating a cooling passage part provided in the sub-module of FIG. 2.
Figure 23:
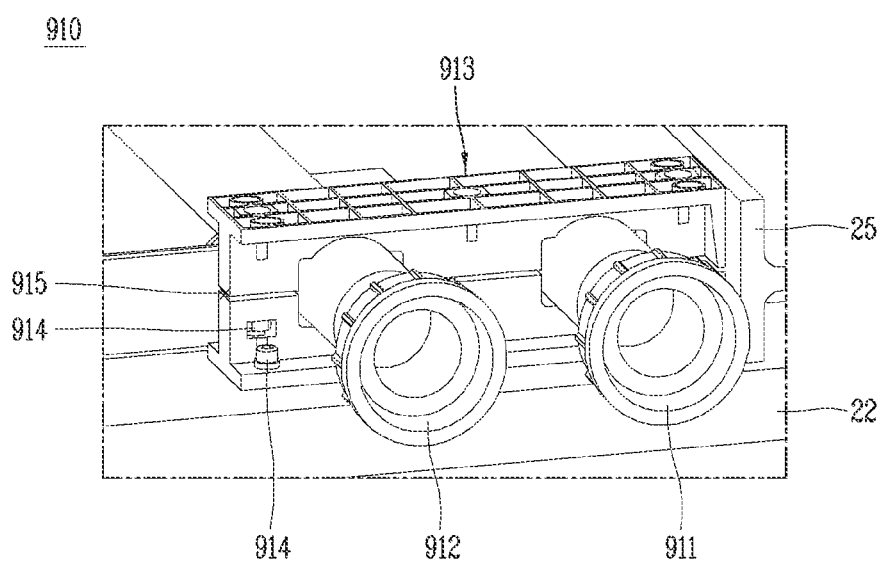
FIG. 23 is a partially enlarged perspective view illustrating a main pipe unit of the cooling passage part of FIG. 22, viewed from another angle.
Figure 24:
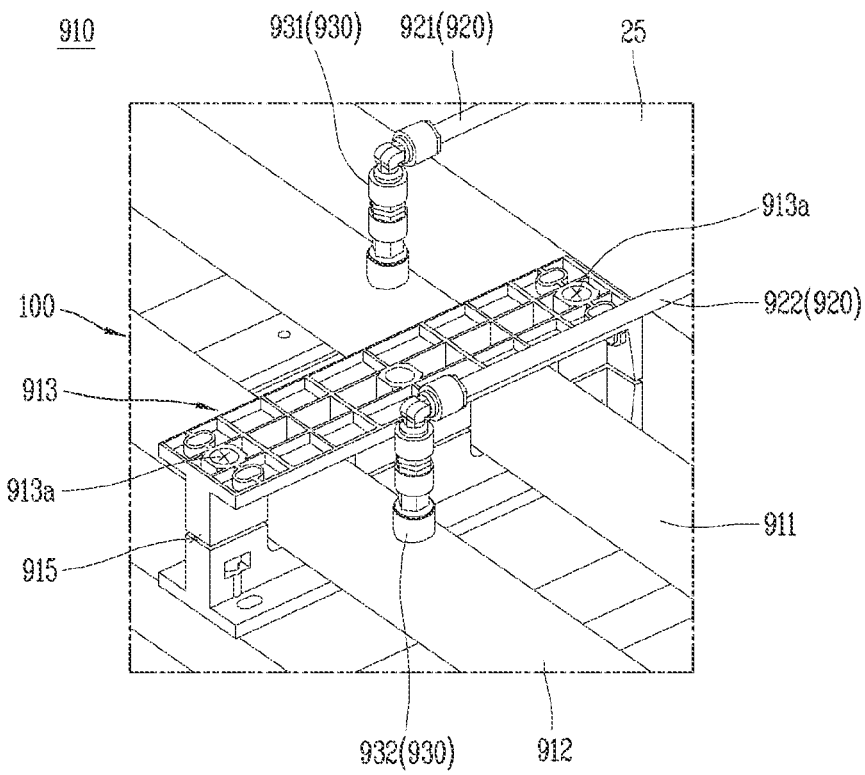
FIG. 24 is a partially enlarged perspective view illustrating the main pipe unit of the cooling passage part of FIG. 23, viewed from another angle.

In the illustrated implementation, the frame 20 includes a vertical frame 21, a horizontal frame 22, and a support portion 23. Further referring to FIG. 19, the frame 20 further includes an insulating member 24. Also, further referring to FIG. 22, the frame 20 further includes a fixing frame 25.

The vertical frame 21 defines the framework of the frame 20 in a vertical (top and bottom or up and down) direction.

The vertical frame 21 extends in the up and down direction. Coupling plates are provided on upper and lower end portions of the vertical frame 21. The coupling plate is formed in a rectangular shape. The coupling plate is coupled to the ground or coupled to a coupling plate of another frame 20 stacked vertically.

In the illustrated implementation, the vertical frames 21 are provided on front left and right sides and rear left and right sides, respectively. Accordingly, a total of four vertical frames 21 are provided. The number of vertical frames 21 may vary.

The vertical frame 21 is coupled to the horizontal frame 22. The vertical frame 21 may be maintained at a preset angle by the horizontal frame 22.

The horizontal frame 22 defines the framework of the frame 20 in a front and rear direction. The horizontal frame 22 extends in the front and rear direction. A front end portion of the horizontal frame 22 is coupled to the vertical frame 21 disposed at the front side. A rear end portion of the horizontal frame 22 is coupled to the vertical frame 21 disposed at the rear side.

This can minimize deformation of the vertical frame 21 in the front and rear direction and deformation of the horizontal frame 22 in the up and down direction.

In the illustrated implementation, the horizontal frames 22 are provided on the left and right sides, respectively. Also, the horizontal frames 22 are disposed on the left and right sides to be spaced apart from each other in the up and down direction. Accordingly, a total of four horizontal frames 22 are provided, but the number may vary.

The support portion 23 is coupled to the horizontal frames 22. The horizontal frames 22 support left and right end portions of the support portion 23.

The support portion 23 supports the sub-modules 10 from the lower side. The support portion 23 is coupled to the horizontal frames 22. Specifically, the left end portion of the support portion 23 is coupled to the horizontal frame 22 provided on the left side. The right end portion of the support portion 23 is coupled to the horizontal frame 22 provided on the right side.

The support portion 23 includes a plurality of beam members. Each beam member may be formed in the shape of an H-Beam. The plurality of beam members may be spaced apart from one another by predetermined distances and continuously disposed in the front and rear direction.

The sub-modules 10 are mounted on an upper side of the support portion 23. As will be described later, a rail unit 540 of the rail assembly 500 is fixedly coupled to the upper side of the support portion 23. In addition, a cart unit 510 of the sub-module 10 is slidably coupled to the rail unit 540.

Figure 19:
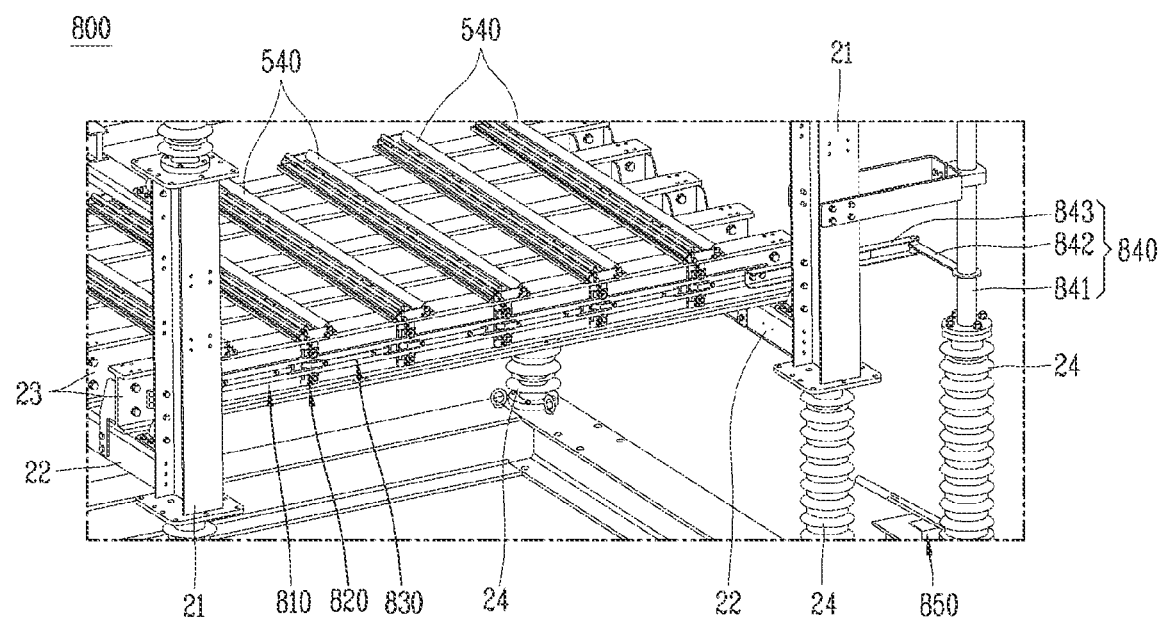
FIG. 19 is a rear perspective view illustrating a short-circuiting control part provided in the modular multilevel converter of FIG. 1.

Further referring to FIG. 19, among the plurality of beam members included in the support portion 23, a short-circuiting control part 800 may be provided on a beam member located at the rearmost side. A detailed description thereof will be described later.

The fixed frame 25 extends at a predetermined angle with the horizontal frame 22.

In one implementation, the fixed frame 25 may extend from the left horizontal frame 22 to the right horizontal frame 22. Also, in one implementation, the fixed frame 25 may extend vertically with respect to the horizontal frame 22.

3. Description of Configuration of Sub-Module 10 According to Implementation Referring to FIG. 1, the modular multilevel converter 1 according to the implementation includes the sub-module 10. The sub-module 10 is configured in a modular form, and may be added to or excluded from the modular multilevel converter 1.

That is, the number of sub-modules 10 included in the modular multilevel converter 1 may vary. Accordingly, the capacity of the modular multilevel converter 1 can vary.

Referring to FIGS. 2 to 9, the sub-module 10 according to the illustrated implementation includes a capacitor assembly 100 and a valve assembly 200. Further referring to FIGS. 19 and 22, the sub-module 10 further includes a grounding part 300, an explosion-proof frame part 400, a rail assembly 500, a separation prevention part 600, an installation and separation part 700, a short-circuiting control part 800, and a cooling passage part 900.

Hereinafter, each component of the sub-module 10 according to the implementation will be described in detail with reference to the accompanying drawings, but the grounding part 300, the explosion-proof frame part 400, the rail assembly 500, and the separation prevention part 600, the installation and separation part 700, the short-circuiting control part 800, and the cooling passage part 900 will be described as separate clauses.

(1) Description of Capacitor Assembly 100

The capacitor assembly 100 includes a capacitor element (not illustrated) therein. The capacitor assembly 100 is electrically connected to the valve assembly 200. The capacitor element (not illustrated) inside the capacitor assembly 100 may be charged or discharged by a switching operation of the valve assembly 200.

Accordingly, the capacitor element (not illustrated) can store power energy input to the sub-module 10. The power energy stored in the capacitor element (not illustrated) may be used as a power source for driving each component of the sub-module 10. In addition, the power energy may be supplied as reactive power to an external power system to which the sub-module 10 is electrically connected.

In the illustrated implementation, the capacitor assembly 100 is connected to a rear side of the valve assembly 200. This results from a frequent occurrence of a situation in which the valve assembly 200 needs to be maintained rather than the capacitor assembly 100. That is, as will be described later, this is for easily separating only the valve assembly 200 toward the front side.

The capacitor assembly 100 is supported by the rail assembly 500. Specifically, the capacitor assembly 100 is mounted on a capacitor cart unit 510a of the rail assembly 500. In one implementation, the capacitor assembly 100 may be fixedly coupled to the capacitor cart unit 510a.

As will be described later, the capacitor cart unit 510a may be slid to the front side or the rear side along the rail unit 540. Accordingly, the capacitor assembly 100 may also be slid to the front side or the rear side together with the capacitor cart unit 510a.

In the illustrated implementation, the capacitor assembly 100 is larger in size than the valve assembly 200. This is due to the size of the capacitor element (not illustrated) mounted inside the capacitor assembly 100. That is, the size of the capacitor assembly 100 may change depending on the size of the capacitor element (not illustrated).

The capacitor assembly 100 includes a capacitor housing 110 and a capacitor connector 120.

The capacitor housing 110 defines appearance of the capacitor assembly 100. A predetermined space may be defined inside the capacitor housing 110. The capacitor element (not illustrated) may be mounted in the space. The mounted capacitor element (not illustrated) is electrically connected to the valve assembly 200 by the capacitor connector 120.

The capacitor housing 110 may be formed of a material having rigidity. This is to prevent affection to the adjacent sub-module 10 and valve assembly 200 even when the capacitor element (not illustrated) accommodated therein explodes due to an unexpected cause.

A residual water collection unit 960 of the cooling passage part 900 to be described later is coupled to an upper side of the capacitor housing 110. In addition, a lower side of the capacitor housing 110 is coupled to the capacitor cart unit 510a.

The front side of the capacitor housing 110 is electrically connected to the valve assembly 200 by the capacitor connector 120.

The capacitor connector 120 electrically connects the capacitor assembly 100 and the valve assembly 200 to each other. The capacitor connector 120 is electrically connected to the capacitor element (not illustrated) and a valve connector 220 of the valve assembly 200.

When the capacitor assembly 100 or the valve assembly 200 is slid toward each other, the capacitor connector 120 may be slid into the valve connector 220. Accordingly, the electrically-connected state is achieved by the capacitor connector 120 and the valve connector 220.

The coupling method may facilitate the capacitor assembly 100 and the valve assembly 200 to be electrically connected to or disconnected from each other.

In the illustrated implementation, the capacitor connector 120 is disposed on one side, namely, the front side of the capacitor assembly 100 facing the valve assembly 200. The capacitor connector 120 is formed in the shape of a plate that protrudes from the front side of the capacitor housing 110 by a predetermined distance.

The shape of the capacitor connector 120 may be formed in any shape capable of being electrically coupled to the valve connector 220.

The capacitor connector 120 may be provided in plurality. In the illustrated implementation, the capacitor connectors 120 include a first capacitor connector 121 disposed on the left side and a second capacitor connector 122 disposed on the right side.

The first capacitor connector 121 is slidably coupled to the valve connector 220 located on the left side to be electrically connected thereto. In addition, the second capacitor connector 122 is slidably coupled to the valve connector 220 located on the right side to be electrically connected thereto.

(2) Description of Valve Assembly 200

The valve assembly 200 is a portion where the sub-module 10 is electrically connected to an external power source or load. In addition, the valve assembly 200 may be electrically connected to the capacitor assembly 100 so that power energy can be input or output.

The valve assembly 200 may include a plurality of switching modules therein. In one implementation, the switching module may be an insulated gate bipolar transistor (IGBT) 440.

Also, the valve assembly 200 may include a control board for controlling the switching modules therein. In one implementation, the control board may be configured as a printed circuit board (PCB) 280.

The sub-module 10 according to the implementation can prevent other IGBTs 440 and other components of the sub-module 10 from being damaged due to the explosion of any one IGBT 440. The IGBT 440 and a configuration for achieving the object will be described as a separate clause in the "explosion-proof frame part 400".

In the illustrated implementation, the valve assembly 200 is located at the front of the capacitor assembly 100. This is due to the fact that the maintenance of the valve assembly 200 is carried out more frequently than the maintenance of the capacitor assembly 100.

The valve assembly 200 may be easily coupled to or separated from the capacitor assembly 100 by the installation and separation part 700. A detailed description thereof will be described later.

The valve assembly 200 is supported by the rail assembly 500. Specifically, the valve assembly 200 is mounted on a valve cart unit 510b of the rail assembly 500. In one implementation, the valve assembly 200 may be fixedly coupled to the valve cart unit 510b.

As will be described later, the valve cart unit 510b may be slid to the front side or the rear side along the rail unit 540. Accordingly, the valve assembly 200 may also be slid to the front side or the rear side together with the valve cart unit 510b.

In the illustrated implementation, the valve assembly 200 includes valve covers 210, a valve connector 220, an input bus bar 230, a bypass switch 240, an output bus bar 250, an insulating housing 260, an insulating layer 270, and a printed circuit board 280.

The valve covers 210 define a portion of appearance of the valve assembly 200. Specifically, the valve covers 210 define left and right outer surfaces of the valve assembly 200.

The valve covers 210 are configured to cover the insulating housing 260. The printed circuit board 280 mounted inside the insulating housing 260 is not arbitrarily exposed to the outside by the valve covers 210.

The valve cover 210 may be fixedly coupled to the insulating housing 260 through a fastening member such as a screw member.

The valve cover 210 shields an electromagnetic noise component generated from the printed circuit board 280 or the IGBT 440. In one implementation, the valve cover 210 may be formed of an aluminum (Al) material.

A plurality of through holes are formed through the valve cover 210. The inner space of the insulating housing 260 and the outside can communicate with each other through the through holes. Air may be introduced through the through holes to cool the printed circuit board 280 or the IGBT 440.

The valve cover 210 is electrically connected to the cart unit 510 of the rail assembly 500. The connection may be achieved by a grounding wire 340. Accordingly, the valve cover 210 may be grounded so that unnecessary electric connection cannot occur.

A direction from the valve cover 210 toward the explosion-proof frame part 400 may be defined as an "inward direction". Also, a direction from the explosion-proof frame part 400 toward the valve cover 210 may be defined as an "outward direction".

The insulating housing 260 is located in the inward direction of the valve cover 210.

The valve connector 220 electrically connects the valve assembly 200 and the capacitor assembly 100 to each other. In the illustrated implementation, the valve connector 220 is disposed on one side, namely, the rear side of the valve assembly 200 facing the capacitor assembly 100.

The valve connector 220 extends in one direction, namely, in the front and rear direction in the illustrated implementation.

One side of the valve connector 220, namely, the front side in the illustrated implementation is electrically connected to the output bus bar 250. In the illustrated implementation, the one side of the valve connector 220 is screwed to the output bus bar 250.

Another side of the valve connector 220, namely, the rear side in the illustrated implementation is electrically connected to the capacitor connector 120.

The valve connector 220 may include a pair of plate members spaced apart from each other by a predetermined distance. That is, in the illustrated implementation, the valve connectors 220 are disposed in the outward direction and the inward direction, respectively, to face each other.

The capacitor connector 120 may be slid into or out of a space defined by the pair of plate members spaced apart from each other by the predetermined distance.

One end portion of each of the pair of plate members facing the capacitor assembly 100, namely, a rear end portion in the illustrated implementation is rounded outward. This can facilitate the sliding coupling and separation.

Each of the pair of plate members may include a plurality of bar members. In the illustrated implementation, the pair of plate members includes four bar members stacked in the up and down direction. The number may vary.

The valve connector 220 may be provided in plurality. In the illustrated implementation, two valve connectors 220 are disposed with being spaced apart from each other by a predetermined distance in the up and down direction. In addition, the two valve connectors 220 are disposed on each of the output bus bars 250 which are provided by two in number. Therefore, a total of four valve connectors 220 are disposed.

The number of valve connectors 220 may arbitrarily vary to allow the electric connection between the valve assembly 200 and the capacitor assembly 100.

The input bus bar 230 electrically connects the sub-module 10 to an external power source or load.

In the illustrated implementation, the input bus bar 230 protrudes toward the front side of the explosion-proof frame part 400 by a predetermined distance. The front side of the input bus bar 230 is electrically connected to an external power source or load. The front side of the input bus bar 230 is electrically connected to the bypass switch 240.

In addition, the rear side of the input bus bar 230 is electrically connected to an electrical connection bus bar 420.

The input bus bar 230 may be provided in plurality. In the illustrated implementation, the input bus bar 230 includes a first input bus bar 231 located at an upper side and a second input bus bar 232 located at a lower side.

The first input bus bar 231 is electrically connected to a first electric connection bus bar 421. Accordingly, the first input bus bar 231 can be electrically connected to the first IGBT 441.

The second input bus bar 232 is electrically connected to a second electric connection bus bar 422. Accordingly, the second input bus bar 232 can be electrically connected to the second IGBT 442.

Each of the first input bus bar 231 and the second input bus bar 232 is electrically connected to an external power source or load. Also, the first input bus bar 231 and the second input bus bar 232 are electrically connected to the bypass switch 240.

When a component of an arbitrary sub-module 10 has a problem, the bypass switch 240 excludes the sub-module 10 from the modular multilevel converter 1.

Specifically, the bypass switch 240 may electrically short-circuit the first input bus bar 231 and the second input bus bar 232 of the corresponding sub-module 10. Accordingly, a current flowing into one of the first input bus bar 231 and the second input bus bar 232 of the corresponding sub-module 10 flows out through the other.

Accordingly, the sub-module 10 can function as a wire so as to be electrically excluded from the modular multilevel converter 1.

The bypass switch 240 is located between the first input bus bar 231 and the second input bus bar 232 at the front side of the explosion-proof frame part 400. The bypass switch 240 is electrically connected to the first input bus bar 231 and the second input bus bar 232.

The output bus bar 250 electrically connects the IGBT 440 and the capacitor assembly 100 to each other.

In the illustrated implementation, the output bus bar 250 protrudes toward the capacity assembly 100, namely, the rear side by a predetermined distance. The valve connector 220 is electrically coupled to the rear side of the output bus bar 250. In one implementation, the valve connector 220 may be coupled to the output bus bar 250 in a screwing manner.

The front side of the output bus bar 250 may be electrically connected to the electric connection bus bar 420 that is electrically connected to the IGBT 440.

The output bus bar 250 may be provided in plurality. In the illustrated implementation, two output bus bars 250 are disposed with being spaced apart from each other by a predetermined distance. The predetermined distance may be the same as a distance between the first capacitor connector 121 and the second capacitor connector 122.

The output bus bar 250 may be coupled to the case unit 410 to cover an IGBT accommodating portion 413 together with the electric connection bus bar 420. The output bus bar 250 and the electric connection bus bar 420 are electrically connected to each other.

In the illustrated implementation, the output bus bar 250 is located at the rear side of the electric connection bus bar 420. Accordingly, the output bus bar 250 is configured to cover the rear side of the IGBT accommodating portion 413.

The output bus bar 250 includes a first part covering the IGBT accommodating portion 413, a second part bent from the first part at a predetermined angle to cover one side (the rear side in the illustrated implementation) of the case unit 410, and a third part extending from the second part to be coupled to the valve connector 220.

The insulating housing 260 accommodates the printed circuit board 280 therein. In addition, the insulating housing 260 electrically comes in contact with the electric connection bus bar 420, such that the printed circuit board 280 and the IGBT 440 are electrically connected to each other. Accordingly, the IGBT 440 can operate according to a control signal calculated by the printed circuit board 280.

The insulating housing 260 is provided in plurality. In the illustrated implementation, two insulating housings 260 are provided, and disposed respectively on left and right sides of the explosion-proof frame part 400.

One side of the insulating housing 260 in the outward direction, namely, a direction away from the explosion-proof frame part 400, in other words, a direction opposite to the explosion-proof frame part 400 may be shielded by the valve cover 210. In the illustrated implementation, the valve covers 210 are disposed on a left side of the insulating housing 260 located at the left side and a right side of the insulating housing 260 located at the right side.

The insulating housing 260 may shield electromagnetic noise generated from the printed circuit board 280 or the IGBT 440. The insulating housing 260 may be formed of am aluminum material.

Accordingly, the electromagnetic noise generated from the printed circuit board 280 or the IGBT 440 cannot be arbitrarily discharged to the outside by the valve covers 210 and the insulating housings 260.

A predetermined space may be defined inside the insulating housing 260. The insulating layer 270 and the printed circuit board 280 are located in the space.

The insulating housing 260 includes a first wall 261, a second wall 262, a third wall 263, and a fourth wall 264.

The first wall 261 defines a front wall of the insulating housing 260. The second wall 262 defines a rear wall of the insulating housing 260. The first wall 261 and the second wall 262 are disposed to face each other.

The third wall 263 defines an upper wall of the insulating housing 260. The fourth wall 264 defines a lower wall of the insulating housing 260. The third wall 263 and the fourth wall 264 are disposed to face each other.

Inner sides (inner surfaces) of the first to fourth walls 261, 262, 263, and 264 may be formed of a material capable of blocking electromagnetic noise. In one implementation, the first to fourth walls 261, 262, 263, and 264 may be formed of an aluminum material.

In addition, a bottom surface of the insulating housing 260 covered by the insulating layer 270, that is, one surface of the insulating housing 260 facing the valve cover 210 may also be formed of an aluminum material.

Accordingly, the inner space of the insulating housing 260 may be electrically shielded by the valve cover 210 and each surface of the insulating housing 260. This can prevent electromagnetic noise generated from the printed circuit board 280 or the IGBT 440 from being arbitrarily leaked to the outside.

The insulating layer 270 and the printed circuit board 280 are accommodated in a space surrounded by the first to fourth walls 261, 262, 263, and 264.

The insulating layer 270 blocks electromagnetic noise generated from the IGBT 440 from flowing into the inner space of the insulating housing 260. The insulating layer 270 may also block electromagnetic noise generated from the printed circuit board 280 from flowing toward the IGBT 440.

The insulating layer 270 covers the one surface of the insulating housing 260. That is, the insulating layer 270 is located between the one surface of the insulating housing 260 facing the valve cover 210 and the printed circuit board 280.

Accordingly, one side of the space defined inside the insulating housing 260 that faces the explosion-proof frame part 400 is surrounded by the insulating layer 270.

The shape of the insulating layer 270 may vary to correspond to the shape of the one surface of the insulating housing 260.

The insulating layer 270 may be formed of any material capable of blocking electromagnetic noise. In one implementation, the insulating layer 270 may be formed of a polyimide material.

The printed circuit board 280 is located on one side of the insulating layer 270 facing the valve cover part 210, that is, in the outward direction.

The printed circuit board 280 calculates a control signal for controlling the IGBT 440. In addition, the printed circuit board 280 may transmit the calculated control signal to the IGBT 440 to control the driving of the sub-module 10.

The printed circuit board 280 is electrically connected to the IGBT 440. In addition, the printed circuit board 280 is electrically connected to the electric connection bus bar 420. Accordingly, external power and control signals can be transmitted to the printed circuit board 280.

The printed circuit board 280 is accommodated in the inner space of the insulating housing 260. As described above, the insulating layer 270 is interposed between the printed circuit board 280 and the one surface of the insulating housing 260.

Accordingly, the printed circuit board 280 can be electrically connected to the electric connection bus bar 420 through the insulating layer 270 and the one surface of the insulating housing 260.

The printed circuit board 280 may be provided in plurality. In the illustrated implementation, five printed circuit boards 280 are provided but the number may vary.

4. Description of Grounding Part 300 According to Implementation

The sub-module 10 according to the implementation includes the grounding part 300. The grounding part 300 may be electrically connected to a capacitor element (not illustrated) provided in the capacitor assembly 100. Accordingly, power energy stored in the capacitor element (not illustrated) can be grounded and discharged.

Specifically, there may be a case in which the sub-module 10 needs to be moved for the purpose of maintenance or movement. At this time, if power energy remains in the capacitor element (not illustrated), there is a risk of explosion.

Accordingly, the sub-module 10 according to the implementation can easily discharge the power energy stored in the capacitor element (not illustrated) through the grounding part 300.

In the illustrated implementation, the grounding part 300 includes a grounding rod unit 310, a grounding connector 320, a grounding protrusion 330, and a grounding wire unit 340.

The grounding rod unit 310 defines a body of the grounding part 300. The grounding rod unit 310 extends in one direction, namely, the front and rear direction in the illustrated implementation.

The grounding rod unit 310 may be inserted into the grounding protrusion 330 which is electrically connected to the capacitor connector 120. Also, the grounding rod unit 310 may be electrically connected to the grounding protrusion 330.

Accordingly, the power energy stored in the capacitor element (not illustrated) can be grounded through the grounding rod unit 310 via the capacitor connector 120.

The grounding rod unit 310 may be detachably inserted into the grounding protrusion 330. When grounding of the capacitor element (not illustrated) is not required, the grounding rod unit 310 may move away from the capacitor assembly 100, that is, in a direction opposite to the capacitor assembly 100. Accordingly, the grounding rod unit 310 may be detached from the grounding protrusion 330.

The grounding rod unit 310 may be coupled through a grounding rod through hole 412 of the explosion-proof frame part 400. The grounding rod unit 310 may be guided toward the grounding protrusion 330 by the grounding rod through hole 412.

In the illustrated implementation, the grounding rod unit 310 has a cylindrical shape with a hollow portion therein. The grounding rod unit 310 may have any shape capable of being electrically coupled to the grounding protrusion 330. In this case, the shape of the grounding rod unit 310 is preferably determined to correspond to the shape of the grounding rod through hole 412.

The grounding rod unit 310 may be provided in plurality. In the illustrated implementation, the grounding rod units 310 include a first grounding rod unit 310a and a second grounding rod unit 310b.

The first grounding rod unit 310a is electrically coupled to a first grounding protrusion 331 in an inserting manner. Also, the second grounding rod unit 310b is electrically coupled to a second grounding protrusion 332 in an inserting manner.

The grounding rod unit 310 includes a body portion 311, a coupling portion 312, a grounding conductor 313, a grounding wire 314, a sealing portion 315, and a resistor portion 316.

The body portion 311 defines a body of the grounding rod unit 310. The body portion 311 extends in a longitudinal direction, namely, the front and rear direction in the illustrated implementation. The body portion 311 is formed in a cylindrical shape which has a circular cross-section and an inner hollow portion. Various components for grounding are mounted in the hollow portion.

The coupling portion is a portion where the grounding rod unit 310 is coupled to the grounding protrusion 330. The coupling portion 312 extends by a predetermined distance from one side facing the grounding protrusion 330, namely, from a rear side end portion to the front side in the illustrated implementation.

The coupling portion 312 is located in the hollow portion formed in the body portion 311. An outer surface of the coupling portion 312 may come in contact with an inner surface of the body portion 311 surrounding the hollow portion.

A hollow portion is formed inside the coupling portion 312. A diameter of the hollow portion may be shorter than or equal to a diameter of the grounding protrusion 330.

The coupling portion 312 may be formed of a material that is elastically deformable. Accordingly, when the grounding protrusion 330 is inserted into the hollow portion of the coupling portion 312, the coupling portion 312 can be deformed in shape and store restoring force. The coupling portion 312 can stably hold the grounding protrusion 330 by the restoring force.

In one implementation, the coupling portion 312 may be formed of a rubber material.

Accordingly, the grounding protrusion 330 can be fitted to the coupling portion 312, such that a coupled state between the grounding rod unit 310 and the grounding protrusion 330 can be stably maintained.

The grounding conductor 313 is electrically connected to the grounding protrusion 330. Power energy stored in the capacitor element (not illustrated) may be transmitted to the resistor portion 316 through the grounding conductor 313.

The grounding conductor 313 is formed to surround the coupling portion 312 from the outside. That is, one side of the grounding conductor 313 facing the grounding protrusion 330, namely, a rear end portion in the illustrated implementation defines a rear end portion of the body portion 311.

The hollow portion is formed inside the grounding conductor 313. The coupling portion 312 is accommodated in a part of the hollow portion, namely, in the rear side in the illustrated implementation. A portion which comes in contact with an end portion of the grounding protrusion 330 is formed on the remaining part of the hollow portion, namely, the front side in the illustrated implementation. The shape of the portion may be determined to correspond to the shape of the grounding protrusion 330.

The grounding conductor 313 extends in a direction away from the coupling portion 312, that is, in a direction opposite to the coupling portion 312. Another side of the grounding conductor 313, namely, the front end portion in the illustrated implementation is electrically connected to a rear end portion of the grounding wire 314. In one implementation, the front side of the grounding conductor 313 and the rear side of the grounding wire 314 may be fastened by a screw member.

The grounding wire 314 electrically connects the grounding conductor 313 and the resistor portion 316. The grounding wire 314 is electrically connected to the grounding conductor 313 and the resistor portion 316.

The grounding wire 314 extends in the longitudinal direction, namely, in the front and rear direction in the illustrated implementation. The rear end portion of the grounding wire 314 is electrically connected to the grounding conductor 313. The front end portion of the grounding wire 314 is electrically connected to the resistor portion 316.

The sealing portion 315 is disposed on one side of the body portion 311 to which the grounding wire 314 is exposed to the outside, namely, on the front end portion in the illustrated implementation. The sealing portion 315 holds the grounding wire 314. In addition, the sealing portion 315 seals an inner space of the body portion 311 to prevent foreign substances such as dust from being introduced into the inner space.

The sealing portion 315 surrounds the grounding wire 314. This can suppress the grounding wire 314 from moving in the longitudinal direction or in the radial direction.

The resistor portion 316 plays a role of discharging power energy stored in the capacitor element (not illustrated) by receiving the power energy stored in the capacitor element (not illustrated). The resistor portion 316 is electrically connected to the grounding wire 314.

The resistor portion 316 may be formed in any shape capable of receiving power energy and consuming the same.

The grounding connector 320 electrically connects the capacitor connector 120 and the grounding protrusion 330.

The grounding connector 320 is electrically connected to the capacitor connector 120. Accordingly, the grounding connector 320 and the capacitor element (not illustrated) can be electrically connected.

The grounding connector 320 is electrically connected to the grounding protrusion 330. Accordingly, the capacitor element (not illustrated) and the grounding protrusion 330 can be electrically connected to each other.

A plate member may be provided on one side, i.e., the front side of the grounding connector 320 facing the valve assembly 200 to form a predetermined angle with respect to the front and rear direction. The grounding protrusion 330 may protrude from the plate member toward the front side, i.e., in a direction toward the valve assembly 200. In one implementation, the predetermined angle may be a right angle.

In the illustrated implementation, the grounding connector 320 is located above the capacitor connector 120. The grounding connector 320 extends upward from the capacitor connector 120 by a predetermined distance. In one implementation, the grounding connector 320 may be coupled to the capacitor connector 120 in a screwing manner.

A residual water collection unit 960 of the cooling passage part 900 may be provided on an upper side of the grounding connector 320. The grounding connector 320 may support the residual water collection unit 960.

The grounding connector 320 may be provided in plurality. In the illustrated implementation, the grounding connectors 320 include a first grounding connector 321 and a second grounding connector 322. The first grounding connector 321 is electrically connected to the first capacitor connector 121. The second grounding connector 322 is electrically connected to the second capacitor connector 122.

The grounding rod unit 310 is fitted to the grounding protrusion 330. The grounding protrusion 330 protrudes toward the valve assembly 200, i.e., toward the front side in the illustrated implementation by a predetermined distance.

A protrusion length of the grounding protrusion 330 is preferably determined to correspond to a length of the hollow portion formed in the grounding conductor 313.

One side of the grounding protrusion 330 facing the grounding connector 320, i.e., the rear side in the illustrated implementation is electrically connected to the grounding connector 320. In one implementation, the grounding protrusion 330 may protrude from the plate member of the grounding connector 320.

Accordingly, when the grounding rod unit 310 is fitted to the grounding protrusion 330, the capacitor element (not illustrated), the capacitor connector 120, the grounding connector 320, the grounding protrusion 330, and the grounding rod unit 310 are electrically connected.

Figure 7:
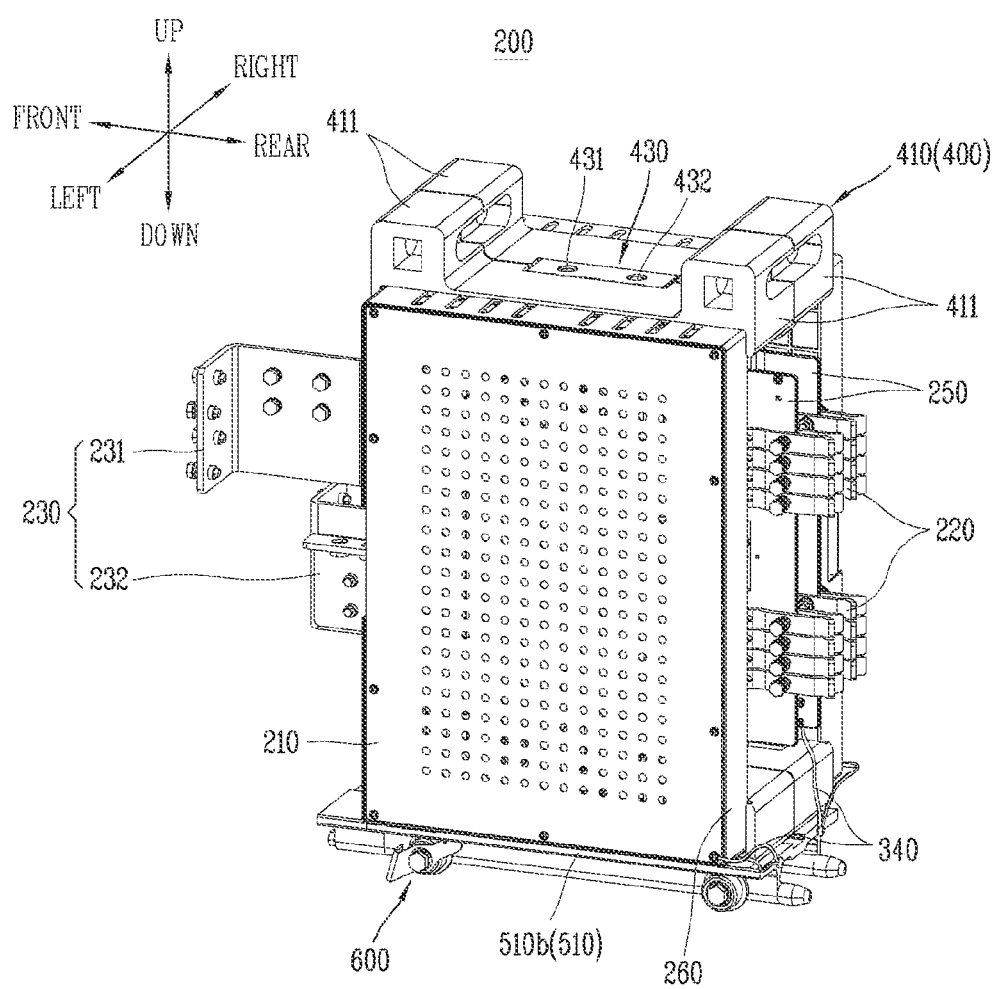
FIG. 7 is a perspective view illustrating the valve assembly provided in the sub-module of FIG. 2.
Figure 8:
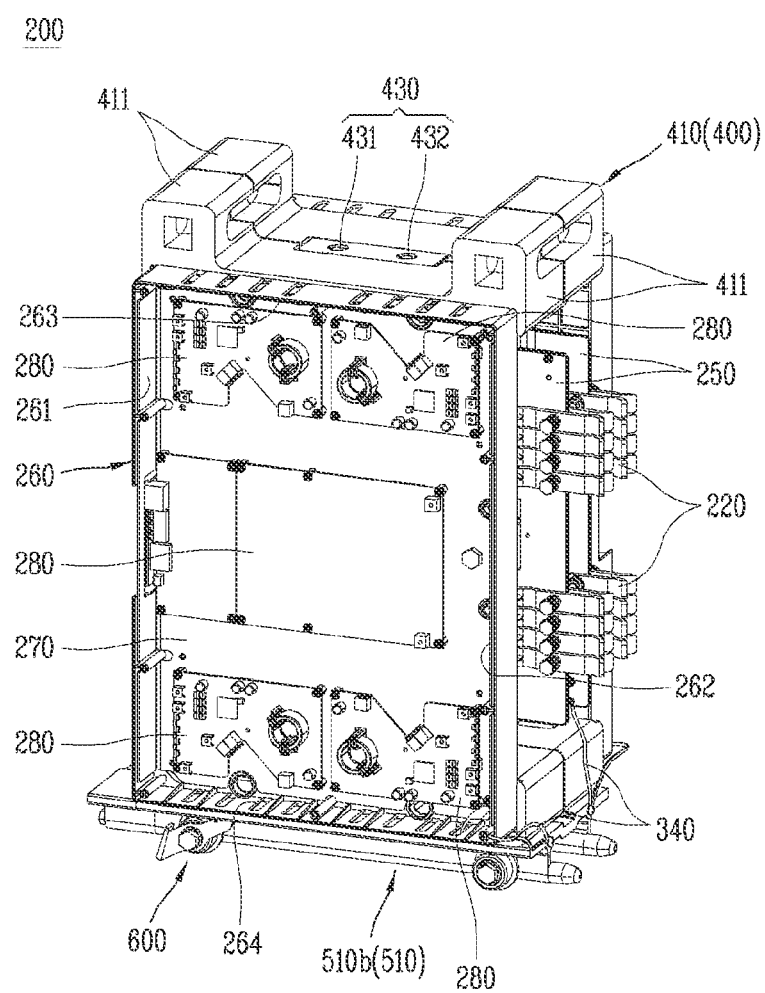
FIG. 8 is a partially transparent perspective view illustrating electrical equipment and insulation members provided in the valve assembly of FIG. 7.
Figure 9:
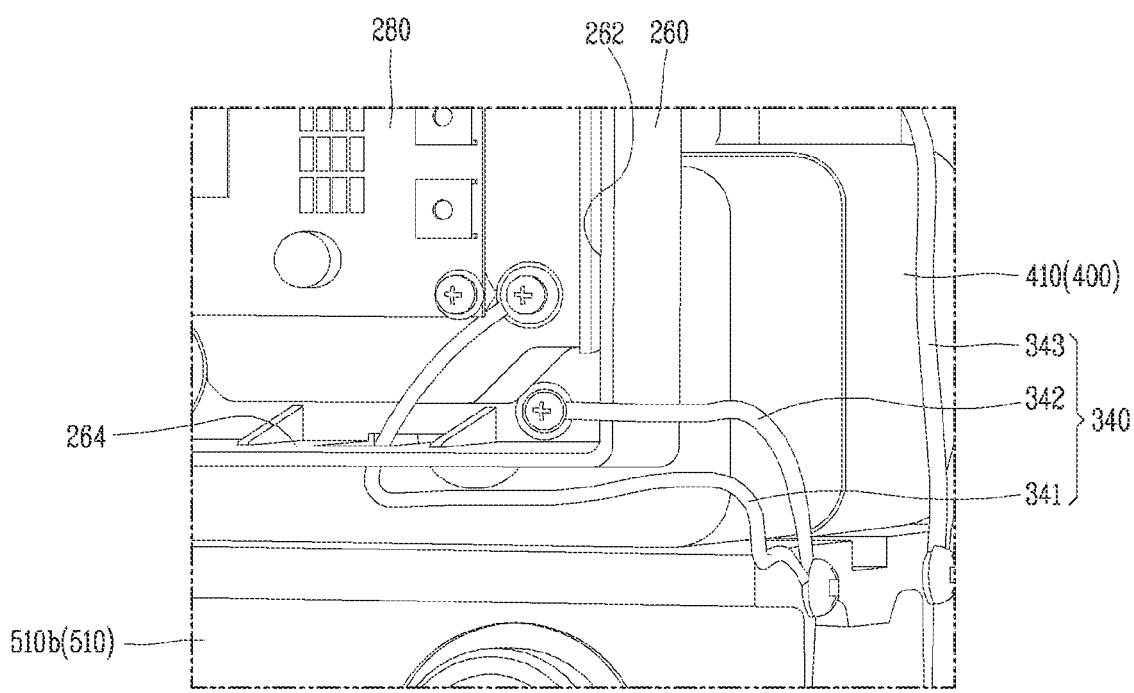
FIG. 9 is a partially enlarged perspective view illustrating a wire for electrically connecting a member for insulation of FIG. 8 to the rail assembly.

The grounding wire unit 340 grounds each electrical device accommodated inside the valve assembly 200 (well-illustrated in FIGS. 7 and 8). The grounding wire unit 340 electrically connects each electrical device to the valve cart unit 510b of the rail assembly 500.

The grounding wire unit 340 includes a PCB grounding wire 341, a housing grounding wire 342, and a bus bar grounding wire 343.

The PCB ground wire 341 electrically connects the printed circuit board 280 to the valve cart unit 510b. The housing grounding wire 342 electrically connects the insulating housing 260 to the valve cart unit 510b. The bus bar grounding wire 343 electrically connects the output bus bar 250 to the valve cart unit 510b.

Accordingly, each electrical device accommodated in the valve assembly 200 can stably operate.

Hereinafter, a process in which the capacitor element (not illustrated) is discharged by the grounding part 300 will be described with reference to FIG. 4 again.

The following description will be given under assumption that a direction in which the grounding rod unit 310 faces the capacitor assembly 100 is a rear side and a direction in which the grounding rod unit 310 is away from the capacitor assembly 100, that is, a direction opposite to the capacitor assembly 100 is the front side.

First, the grounding rod unit 310 moves to the front side, and passes through the grounding rod through holes 412 of the explosion-proof frame part 400. In this case, the grounding rod through holes 412 are respectively formed at the front side and the rear side, and may be disposed to have the same central axis.

When the grounding rod unit 310 that has passed through the grounding rod through holes 412 of the front and sides continues to move forward, the grounding protrusion 330 is inserted into the grounding rod unit 310, starting from the coupling portion 312. At this time, the grounding protrusion 330 may be disposed to have the same central axis as the grounding rod through holes 412.

Accordingly, the shape of the grounding rod unit 310 can be stably coupled to the grounding protrusion 330 while maintaining a linear shape.

When the grounding protrusion 330 is inserted, the coupling portion 312 is deformed in shape so as to apply the stored restoring force to the grounding protrusion 330. This can stably maintain the coupled state between the grounding protrusion 330 and the grounding rod unit 310.

As the insertion of the grounding protrusion 330 proceeds, the front end portion of the grounding protrusion 330 comes into contact with the grounding conductor 313. Accordingly, the capacitor element (not illustrated) and the resistor portion 316 can be electrically connected to each other, such that power energy stored in the capacitor element (not illustrated) can be discharged.

5. Description of Explosion-Proof Frame Part 400 According to Implementation The sub-module 10 according to the implementation includes the explosion-proof frame part 400. The explosion-proof frame part 400 may accommodate a switching element such as the IGBT 440 therein.

In addition, the explosion-proof frame part 400 according to the implementation can prevent damage to adjacent IGBTs 440 when the accommodated IGBT 440 explodes. Furthermore, the explosion-proof frame part 400 according to the implementation facilitates a discharge of gas or the like that is generated due to the explosion.

Referring to FIGS. 2 to 4 and 7 to 9, the explosion-proof frame part 400 may be disposed in the valve assembly 200. This is due to the fact that the IGBT 440 functioning as a switching element is disposed in the valve assembly 200.

Accordingly, it will be understood that the explosion-proof frame part 400 is included in the valve assembly 200.

Figure 10:
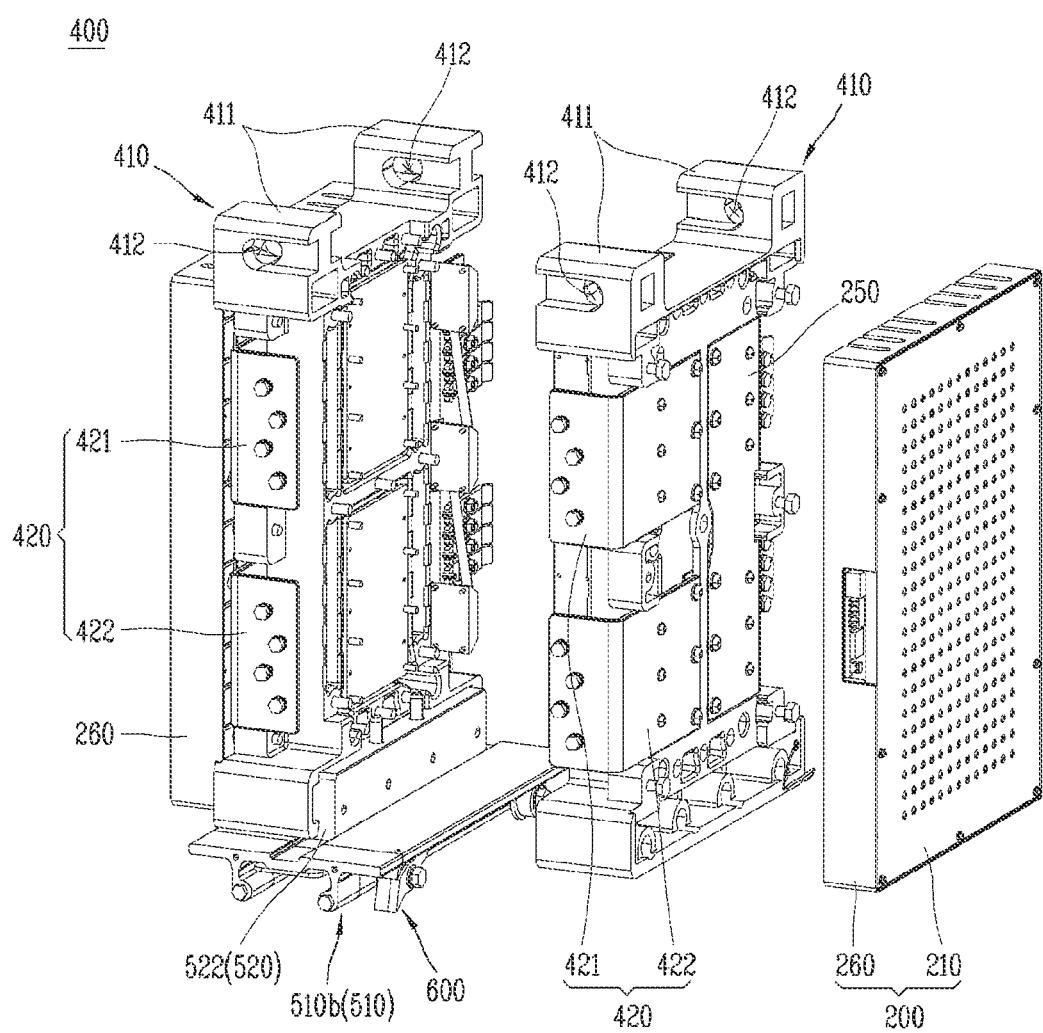
FIG. 10 is a partially exploded perspective view illustrating a coupling relationship of an explosion-proof frame portion provided in the valve assembly of FIG. 7.

Hereinafter, the explosion-proof frame part 400 according to the implementation will be described in detail, with reference to FIGS. 10 to 12.

In the illustrated implementation, the explosion-proof frame part 400 includes a case unit 410, an electric connection bus bar 420, a cooling plate 430, and an IGBT 440.

The case unit 410 defines appearance of the explosion-proof frame part 400. The electric connection bus bar 420 and the cooling plate 430 are coupled to the case unit 410.

A predetermined space is defined inside the case unit 410. The IGBT 440 may be accommodated in the space.

The insulating housing 260 may be coupled to one side of the case unit 410 in the outward direction, i.e., in a direction away from the cooling plate 430, in other words, in a direction opposite to the cooling plate 430.

The case unit 410 may be provided in plurality. In the illustrated implementation, two case units 410 are provided. The case units 410 may be formed to be symmetrical to each other. Hereinafter, one case unit 410 will be described, but it will be understood that the other case unit 410 also has the same structure.

The case units 410 are coupled to define a predetermined space therebetween. The cooling plate 430 and the IGBT 440 are located in the predetermined space.

The output bus bar 250 and the electric connection bus bar 420 are coupled in the outward direction of the case unit 410, i.e., in a direction toward the valve cover 210. The output bus bar 250 and the electric connection bus bar 420 are located between the case unit 410 and the insulating housing 260.

The cooling plate 430 is coupled in the inward direction of the case unit 410, i.e., in a direction that the case units 410 face each other. That is, the cooling plate 430 is located between the case units 410.

The IGBT 440 is located in the inward direction of the case unit 410, i.e., in a direction toward the cooling plate 430. That is, the IGBT 440 is located between the case unit 410 and the cooling plate 430.

Fastening members (not illustrated) may be provided for coupling the case unit 410 with the electric connection bus bar 420, the cooling plate 430, and the IGBT 440.

In addition, the case unit 410, the insulating housing 260, and the valve cover 210 may also be coupled by fastening members (not illustrated).

In one implementation, the fastening member (not illustrated) may be implemented as a screw member.

The case unit 410 may be formed of an insulating material. Also, the case unit 410 may be formed of a material with heat resistance, pressure resistance, and wear resistance. In one implementation, the case unit 410 may be formed of a synthetic resin material.

In the illustrated implementation, the case unit 410 extends in the up and down direction. This is because, as will be described later, the IGBT 440 is provided in plurality and disposed in the up and down direction.

The case unit 410 includes a protrusion 411, a grounding rod through hole 412, an IGBT accommodating portion 413, an inner wall 414, an outer wall 415, an internal communication groove 416, an external communication groove 417, a buffer space 418, and an edge portion 419.

The protrusion 411 protrudes from the upper side of the case unit 410. The protrusion 411 may be provided in plurality. The plurality of protrusions 411 may be spaced apart from each other by a predetermined distance.

In the illustrated implementation, the protrusions 411 protrude upward from the front and rear of the upper side of the case unit 410. Each of the protrusions 411 may be located on the same line in the front and rear direction.

The protrusion 411 has the grounding rod through hole 412 formed therethrough.

The grounding rod unit 310 is coupled through the grounding rod through hole 310. The grounding rod through hole 412 is formed through the protrusion 411. In the illustrated implementation, the grounding rod through hole 412 is formed through the protrusion 411 in the front and rear direction.

The shape of the grounding rod through hole 412 may correspond to the shape of the grounding rod unit 310. In the illustrated implementation, since the grounding rod unit 310 has a cylindrical shape, the grounding rod through hole 412 may be formed to have a circular cross-section.

As described above, the protrusions 411 may be formed on the front side and the rear side, respectively. The grounding rod through holes 412 may be formed through the plurality of protrusions 411, respectively.

The grounding rod through holes 412 formed through the respective protrusions 411 may have the same central axis. Also, the grounding rod through holes 412 may be formed to have the same central axis as the grounding protrusions 330.

The IGBT accommodating portion 413 accommodates the IGBT 440. The IGBT accommodating portion 413 may be defined by a predetermined space defined inside the case unit 410. The IGBT accommodating portion 413 is recessed by a predetermined distance into one side of the case unit 410 facing the cooling plate 430.

The IGBT accommodating portion 413 may be covered by the output bus bar 250 and the electric connection bus bar 420. Specifically, an open one side of the IGBT accommodating portion 413 facing the insulating housing 260 may be covered by the output bus bar 250 and the electric connection bus bar 420.

The IGBT accommodating portion 413 may be provided in plurality. In the illustrated implementation, the IGBT accommodating portions 413 include a first IGBT accommodating portion 413a formed in one side facing the protrusion 411, and a second IGBT accommodating portion 413b formed in another side getting away from the protrusion 411 (i.e., opposite to the first IGBT accommodating portion 413a and the protrusion 411).

This results from the fact that two IGBTs 440 are provided, including the first IGBT 441 and the second IGBT 442. That is, the first IGBT 441 is accommodated in the first IGBT accommodating portion 413a and the second IGBT 442 is accommodated in the second IGBT accommodating portion 413b.

As described above, the two case units 410 are coupled to each other. It will be understood that the two IGBT accommodating portions 413 are formed in one case unit 410, and a total of four IGBTs 440 are accommodated in the explosion-proof frame part 400.

The shape of each IGBT accommodating portion 413a and 413b may be determined to correspond to the shape of each IGBT 441 and 442 accommodated therein. Also, the first IGBT accommodating portion 413a and the second IGBT accommodating portion 413b may have shapes corresponding to each other.

A partition wall 413c is disposed between the first IGBT accommodating portion 413a and the second IGBT accommodating portion 413b. When the case unit 410 and the cooling plate 430 are coupled to each other, one surface of the partition wall 413c facing the cooling plate 430 comes into contact with the cooling plate 430.

As a result, the partition wall 413c physically partitions the first IGBT accommodating portion 413a and the second IGBT accommodating portion 413b from each other at one side facing the cooling plate 430. Accordingly, even if any one of the first IGBT 441 and the second IGBT 442 explodes, the other one is not affected.

One side of the IGBT accommodating portion 413 apart from the cooling plate 430 (i.e., opposite to the cooling plate 430), that is, one side of the IGBT accommodating portion 413 facing the electric connection bus bar 420 is open. The IGBT 440 is exposed to the outside of the IGBT accommodating portion 413 through the one side. The exposed portion of the IGBT 440 electrically comes in contact with the electric connection bus bar 420.

Meanwhile, the IGBT accommodating portion 413 may be defined as a space surrounded by the partition wall 413c, the inner walls 414, and the edge portion 419.

That is, the first IGBT accommodating portion 413a may be defined as a space surrounded by first inner walls 414a forming front and rear side walls, the partition wall 413c forming a lower wall, and the edge portion 419 forming an upper wall.

Similarly, the second IGBT accommodating portion 413b may be defined as a space surrounded by second inner walls 414b forming front and rear side walls, the partition wall 413c forming the upper wall, and the edge portion 419 forming the lower wall.

The inner walls 414 partially surround the IGBT accommodating portion 413. In the illustrated implementation, the inner walls 414 surround the front side and the rear side of the IGBT accommodating portion 413. The inner walls 414 may be continuous with the partition wall 413c.

The inner walls 414 may be surrounded by the outer walls 415. The inner walls 414 are spaced apart from the outer walls 415 by predetermined distances. Spaces defined between the inner walls 414 and the outer walls 415 due to the spacing are defined as buffer spaces 418.

When the case unit 410 and the cooling plate 430 are coupled to each other, one surface of the inner wall 414 facing the cooling plate 430 comes into contact with the cooling plate 430.

The internal communication groove 416 is formed in the inner wall 414. Gas generated due to the explosion of the IGBT 440 may be introduced into the buffer space 418 through the internal communication groove 416.

The inner walls 414 include a first inner wall 414a and a second inner wall 414b.

The first inner wall 414a partially surrounds the first IGBT accommodating portion 413a. The first inner wall 414a is located at one side facing the protrusion 411, i.e., at an upper side in the illustrated implementation.

The second inner wall 414b partially surrounds the second IGBT accommodating portion 413b. The second inner wall 414b is located at another side apart from the protrusion 411 (i.e., opposite to the protrusion 411), namely, at a lower side in the illustrated implementation.

The outer walls 415 partially surround the inner walls 414. In the illustrated implementation, the outer walls 415 surround the front side and the rear side of the inner walls 414. The outer walls 415 may be continuous with the edge portion 419.

The outer walls 415 are spaced apart from the inner walls 414 by predetermined distances. Spaces defined between the outer walls 415 and the inner walls 414 due to the spacing are defined as the buffer spaces 418.

When the case unit 410 and the cooling plate 430 are coupled to each other, one surface of the outer wall 415 facing the cooling plate 430 comes into contact with the cooling plate 430.

The external communication groove 417 is formed in the outer wall 415. Gas generated by the explosion of the IGBT 440 can pass through the buffer space 418 so as to be discharged to the outside of the explosion-proof frame part 400 through the external communication groove 417.

The outer walls 415 include a first outer wall 415a and a second outer wall 415b.

The first outer wall 415a partially surrounds the first inner wall 414a and a first buffer space 418a. The first outer wall 415a is located at one side facing the protrusion 411, i.e., at an upper side in the illustrated implementation.

The second outer wall 415b partially surrounds the second inner wall 414b and a second buffer space 418b. The second outer wall 415b is located at another side apart from the protrusion 411 (i.e., opposite to the protrusion 411), namely, at a lower side in the illustrated implementation.

The internal communication groove 416 communicates with the IGBT accommodating portion 413 and the buffer space 418. Gas generated due to the explosion of the IGBT 440 may flow from the IGBT accommodating portion 413 to the buffer space 418 through the internal communication groove 416.

The internal communication groove 416 is formed in the inner wall 414. Specifically, the internal communication groove 416 is recessed by a predetermined distance into one surface of the inner wall 414 facing the cooling plate 430.

As described above, when the explosion-proof frame part 400 is coupled, the one surface of the inner wall 414 facing the cooling plate 430 comes in contact with the cooling plate 430. Accordingly, the IGBT accommodating portion 413 can communicate with the buffer space 418 only through the internal communication groove 416.

In the illustrated implementation, the internal communication groove 416 is formed as a groove having a rectangular cross-section extending in the up and down direction, but its shape may vary.

The internal communication groove 416 may be provided in plurality. The plurality of internal communication grooves 416 are spaced apart from one another by a predetermined distance. In the illustrated implementation, three internal communication grooves 416 are formed for each inner wall 414, and disposed to be spaced apart from one another by a predetermined distance.

In one implementation, the predetermined distance may be equal to an extension length of the external communication groove 417. Also, the number of internal communication grooves 416 may vary.

The internal communication grooves 416 are arranged to alternate with the external communication grooves 417. That is, virtual surfaces extending from the internal communication groove 416 and the external communication groove 417 do not overlap each other. Accordingly, an arc generated by the explosion of the IGBT 440 or debris generated during the explosion is not discharged to the outside.

In addition, with the arrangement, the generated gas does not pass through the internal communication groove 416 and the external communication groove 417 at once.

The internal communication grooves 416 include a first internal communication groove 416a and a second internal communication groove 416b.

The first internal communication groove 416a is formed in the first inner wall 414a. In the illustrated implementation, the first inner wall 414a is formed to surround the first IGBT accommodating portion 413a from the front side and the rear side. Accordingly, the first internal communication groove 416a is also formed on each of the front side and the rear side of the first IGBT accommodating portion 413a.

The second internal communication groove 416b is formed in the second inner wall 414b. In the illustrated implementation, the second inner wall 414b is formed to surround the second IGBT accommodating portion 413b from the front side and the rear side. Accordingly, the second internal communication groove 416b is also formed on each of the front side and the rear side of the second IGBT accommodating portion 413b.

The external communication groove 417 communicates with the buffer space 418 and an outer space. Gas generated due to the explosion of the IGBT 440 may flow from the buffer space 418 to the outer space through the external communication groove 417.

The external communication groove 417 is formed in the outer wall 415. Specifically, the external communication groove 417 is recessed by a predetermined distance into one surface of the external wall 415 facing the cooling plate 430.

As described above, when the explosion-proof frame part 400 is coupled, the one surface of the outer wall 415 facing the cooling plate 430 comes in contact with the cooling plate 430. Accordingly, the buffer space 418 can communicate with the outer space only through the external communication groove 417.

In the illustrated implementation, the external communication groove 417 is formed as a groove having a rectangular cross-section extending in the up and down direction, but its shape may vary.

The external communication groove 417 may be provided in plurality. The plurality of external communication grooves 417 are spaced apart from one another by a predetermined distance. In the illustrated implementation, four external communication grooves 417 are formed for each outer wall 415, and disposed to be spaced apart from one another by a predetermined distance.

In one implementation, the predetermined distance may be equal to an extension length of the internal communication groove 416. Also, the number of external communication grooves 417 may vary.

The external communication grooves 417 are arranged to alternate with the internal communication grooves 416. That is, virtual surfaces extending from the external communication groove 417 and the internal communication groove 416 do not overlap each other. Accordingly, an arc generated by the explosion of the IGBT 440 or debris generated during the explosion is not discharged to the outside.

In addition, with the arrangement, the generated gas does not pass through the internal communication groove 416 and the external communication groove 417 at once.

The external communication grooves 417 include a first external communication groove 417a and a second external communication groove 417b.

The first external communication groove 417a is formed in the first outer wall 415a. In the illustrated implementation, the first outer wall 414a is formed to surround the first inner wall 414a and the first buffer space 418a from the front side and the rear side. Accordingly, the first external communication groove 417a is also formed on each of the front side and the rear side of the first IGBT accommodating portion 418a.

The second external communication groove 417b is formed in the second outer wall 415b. In the illustrated implementation, the second outer wall 414b is formed to surround the second inner wall 414a and the second buffer space 418b from the front side and the rear side. Accordingly, the second external communication groove 417b is also formed on each of the front side and the rear side of the first buffer space 418b.

The buffer space 418 is a space for accommodating an arc or debris generated as the IGBT 440 explodes. Accordingly, the arc or debris is not discharged to the outer space through the external communication groove 417.

In addition, the buffer space 418 is a space in which gas introduced from the IGBT accommodating portion 413 stays before being discharged to the outside. Accordingly, the gas can be discharged after temperature and pressure are reduced.

The buffer space 418 is defined as the inner wall 414 and the outer wall 415 are spaced apart from each other by a predetermined distance. The buffer space 418 is located between the inner wall 414 and the outer wall 415. The buffer space 418 is recessed by a predetermined distance into one side of the case unit 410 facing the cooling plate 430.

In the illustrated implementation, the inner wall 414 and the outer wall 415 are formed on the front side and the rear side of the IGBT accommodating portion 413, respectively. Accordingly, the buffer space 418 is also formed on each of the front side and the rear side of the IGBT accommodating portion 413.

The front side and rear side of the buffer space 418 are surrounded by the inner wall 414 and the outer wall 415. In addition, upper and lower sides of the buffer space 418 are surrounded by fastening member coupling portions, respectively.

As described above, when the explosion-proof frame part 400 is coupled, one surface of each of the inner wall 414 and the outer wall 415 facing the cooling plate 430 comes in contact with the cooling plate 430. In addition, one surface of each of the fastening member coupling portions facing the cooling plate 430 also comes in contact with the cooling plate 430.

Accordingly, the buffer space 418 is blocked from communicating with the outside, except for the internal communication groove 416 and the external communication groove 417.

That is, the buffer space 418 is surrounded by the case unit 410, the partition wall 413c, the inner wall 414, the outer wall 415, and the cooling plate 430.

The buffer space 418 communicates with the IGBT accommodating portion 413. The communication is achieved by the internal communication groove 416. The buffer space 418 communicates with the outer space. The communication is achieved by the external communication groove 417.

Accordingly, gas generated in the IGBT accommodating portion 413 can be discharged to the outer space after temperature and pressure are reduced in the buffer space 418.

The buffer spaces 418 include a first buffer space 418a and a second buffer space 418b.

The first buffer space 418a is defined between the first inner wall 414a and the first outer wall 415a. The first buffer space 418a is formed in each of the front side and the rear side of the first inner wall 414a.

The second buffer space 418b is defined between the second inner wall 414b and the second outer wall 415b. The second buffer space 418b is formed in each of the front side and the rear side of the second inner wall 414b.

The edge portion 419 partially surrounds the IGBT accommodating portion 413.

Specifically, the edge portion 419 formed on one side, i.e., an upper side facing the protrusion 411 covers the upper side of the first IGBT accommodating portion 413a. In addition, another side apart from the protrusion 411 (i.e., another side opposite to the protrusion 411), that is, the edge portion 419 formed on the lower side covers the lower side of the second IGBT accommodating portion 413b.

The edge portion 419 protrudes from one side of the case unit 410 facing the cooling plate 430.

When the case unit 410 and the cooling plate 430 are coupled to each other, one surface of the edge portion 419 facing the cooling plate 430 comes into contact with the cooling plate 430. Accordingly, the IGBT accommodating portion 413 can be sealed except for the internal communication groove 416.

A plurality of grooves may be recessed by a predetermined distance into the edge portion 419. An entire weight of the case unit 410 can be reduced by the grooves. Also, rigidity of the case unit 410 can be reinforced by the grooves.

A plurality of fastening holes are formed through the edge portion 419. Coupling members (not illustrated) may be coupled to the fastening holes. Accordingly, each case unit 410 and the cooling plate 430 can be fastened to each other.

The electric connection bus bar 420 transmits a current, which has been transmitted to the valve assembly 200, to the capacitor assembly 100. In addition, the electric connection bus bar 420 electrically connects the printed circuit board 280 and the IGBT 440.

The electric connection bus bar 420 is electrically connected to the input bus bar 230. Power energy transferred to the input bus bar 230 may be transferred to the electric connection bus bar 420.

The electric connection bus bar 420 is electrically connected to the output bus bar 250. The power energy transferred to the electric connection bus bar 420 is transferred to the output bus bar 250.

The electric connection bus bar 420 is electrically connected to the printed circuit board 280 and the IGBT 440. A control signal calculated by the printed circuit board 280 or the IGBT 440 may be transmitted to other components.

The electric connection bus bar 420 may be coupled to the case unit 410 to cover the IGBT accommodating portion 413 together with the electric connection bus bar 250. The electric connection bus bar 420 is electrically connected to the output bus bar 250.

In the illustrated implementation, the electric connection bus bar 420 is located at the front of the output bus bar 250. Accordingly, the electric connection bus bar 420 is configured to cover the front side of the IGBT accommodating portion 413.

The electric connection bus bars 420 include a first electric connection bus bar 421 and a second electric connection bus bar 422.

The first electric connection bus bar 421 is located above the second electric connection bus bar 422, and is electrically connected to the first input bus bar 231 and the output bus bar 250. The second electric connection bus bar 422 is located below the first electric connection bus bar 421, and is electrically connected to the second input bus bar 232 and the output bus bar 250.

In the illustrated implementation, the electric connection bus bar 250 is located between the case unit 410 and the insulating housing 260.

The electric connection bus bar 420 extends in one direction, namely, in the front and rear direction in the illustrated implementation. Both end portions of the electric connection bus bar 420 in the one direction, that is, the front and rear end portions are bent toward the case unit 410 at a predetermined angle. In one implementation, the predetermined angle may be a right angle.

Accordingly, when the electric connection bus bar 420 is coupled to the case unit 410, the electric connection bus bar 420 surrounds the front side, the left or right side, and the rear side of the case unit 410.

The electric connection bus bar 420 may be formed of a material on which a current can flow. In addition, the electric connection bus bar 420 may be formed of a material having high rigidity. In one implementation, the electric connection bus bar 420 may be formed of a material including iron.

Therefore, even when the IGBT 440 accommodated in the IGBT accommodating portion 413 explodes, damage or shape deformation of the case unit 410 can be minimized by the electric connection bus bar 420 surrounding the case unit 410.

In one implementation, the case unit 410, the electric connection bus bar 420, the cooling plate 430, and the insulating housing 260 may be screwed together.

The cooling plate 430 is configured to cool heat generated as the IGBT 440 operates. That is, the cooling plate 430 cools the IGBT 440 by exchanging to heat with the IGBT 440.

In the illustrated implementation, the cooling plate 430 is formed in a shape of a rectangular plate extending in the up and down direction. The cooling plate 430 may be formed in any shape that can exchange heat with the IGBT 440.

The cooling plate 430 is located between the two case units 410. In addition, the cooling plate 430 is located between the IGBTs 440 accommodated in the respective case units 410.

In other words, when viewed from the front, the case unit 410, the IGBT 440, the cooling plate 430, the IGBT 440, and the case unit 410 are sequentially disposed in the left or right direction or an opposite direction thereof.

The cooling plate 430 comes in contact with the IGBTs 440 respectively located on the left and right sides. In one implementation, the cooling plate 430 and each IGBT 440 may be in surface-contact with each other.

The cooling plate 430 communicates with the outside. Specifically, the cooling plate 430 communicates with a cooling passage part 900 to be described later.

A predetermined space may also be defined inside the cooling plate 430. A cooling fluid supplied from the outside may receive heat from the IGBTs 440 while circulating in the inner space of the cooling plate 430. In addition, the cooling fluid which has received the heat can be discharged to the outside again.

The cooling plate 430 includes an inlet 431 and an outlet 432.

The inlet 431 communicates with a valve inlet pipe 951 of the cooling passage part 900. A cooling fluid of low temperature may be introduced into the inner space of the cooling plate 430 through the inlet 431.

The outlet 432 communicates with a valve outlet pipe 952 of the cooling passage part 900. The cooling fluid heat-exchanged with the IGBT 440 may be discharged from the inner space of the cooling plate 430 through the outlet 432.

In the illustrated implementation, the inlet 431 and the outlet 432 are formed through the upper side of the cooling plate 430. The inlet 431 is also located at the rear side of the outlet 432. The positions may vary.

The IGBT 440 controls a current that flows into or out of the sub-module 10. In one implementation, the IGBT 440 may function as a switching element.

The IGBT 440 is accommodated in the IGBT accommodating portion 413. The IGBT 440 accommodated in the IGBT accommodating portion 413 is sealed by the partition wall 413c, the inner wall 414, the edge portion 419, and the cooling plate 430.

The IGBT 440 may be in surface-contact with the cooling plate 430. Specifically, the respective surfaces of the cooling plate 430 and the IGBT 440 facing each other may be in contact with each other. Accordingly, heat generated in the IGBT 440 can be transferred to the cooling plate 430 to cool the IGBT 440.

The IGBT 440 is electrically connected to the electric connection bus bar 420. Power energy for operating the IGBT 440 may be transmitted through the electric connection bus bar 420.

The IGBT 440 is electrically connected to the printed circuit board 280. A control signal calculated by the printed circuit board 280 may be transmitted to the capacitor element (not illustrated) through the IGBT 440.

In addition, the IGBT 440 may be switched on or off to allow or prevent an electric connection between the printed circuit board 280 and a device or equipment such as a capacitor element (not illustrated).

The IGBT 440 may be provided in plurality. In the illustrated implementation, the IGBTs 440 include a first IGBT 440 disposed at the upper side in the direction toward the protrusion 411 and a second IGBT 440 disposed at the lower side in the direction away from the protrusion 411 (i.e., the direction opposite to the first IGBT 440 and the protrusion 411).

As described above, the two case units 410 may be provided. Accordingly, in the illustrated implementation, two IGBTs 440 are provided in each of the left and right case units 410, so a total of four IGBTs 440 are provided.

As described above, the buffer space 418 is defined in the case unit 410. An arc, gas, debris and the like that are generated when the IGBT 440 explodes are introduced into the buffer space 418 through the internal communication groove 416.

Accordingly, the arc and gas of high temperature and high pressure can be discharged to the outer space after the temperature and pressure are lowered.

The external communication groove 417 through which the buffer space 418 communicates with the outer space is disposed to alternate with the internal communication groove 416.

Accordingly, a path from the IGBT accommodating portion 413 to the outer space via the internal communication groove 416, the buffer space 418, and the external communication groove 417 becomes longer. Accordingly, the arc and gas of the high temperature and high pressure are not discharged to the outer space immediately after the explosion.

In addition, debris that has passed through the internal communication groove 416 is blocked by the outer wall 415 surrounding the buffer space 418. Accordingly, an amount of debris discharged to the outer space of the explosion-proof frame part 400 immediately after the explosion can be minimized.

6. Description of Rail Assembly 500 According to Implementation

The sub-module 10 according to the implementation includes the rail assembly 500. The rail assembly 500 slidably supports the valve assembly 200 and the capacitor assembly 100.

In addition, the rail assembly 500 according to the implementation is configured to prevent the valve assembly 200 and the capacitor assembly 100 from being arbitrarily separated.

As illustrated in FIG. 19, the rail unit 540 of the rail assembly 500 is coupled to the support portion 23. Accordingly, the rail unit 540 may be considered as a part of the frame 20.

Hereinafter, the rail assembly 500 according to the implementation will be described in detail, with reference to FIGS. 13 to 16.

In the illustrated implementation, the rail assembly 500 includes a cart unit 510, a bracket unit 520, a fastening unit 530, and a rail unit 540.

The cart unit 510 slidably supports the capacitor assembly 100 and the valve assembly 200. The cart unit 510 supports the capacitor assembly 100 and the valve assembly 200 from the lower side.

The capacitor assembly 100 and the valve assembly 200 may be slid forward or rearward together with the cart unit 510 while seated on the cart unit 510.

The capacitor assembly 100 and the valve assembly 200 may be coupled to the cart unit 510 by the bracket unit 520 and a separate fastening member (not illustrated). In one implementation, the capacitor assembly 100 and the valve assembly 200 may be screwed to the bracket unit 520.

The cart unit 510 may be provided in plurality. A cart unit 510, on which the capacitor assembly 100 is seated, among the plurality of cart units 510 may be referred to as a capacitor cart unit 510a. Also, a cart unit 510, on which the valve assembly 200 is seated, may be referred to as a valve cart unit 510b.

The capacitor cart unit 510a and the valve cart unit 510b are similar in overall structures and functions. Accordingly, in the following description, the capacitor cart unit 510a and the valve cart unit 510b will be collectively referred to as the cart unit 510.

The cart unit 510 is slidably coupled to the rail unit 540. The cart unit 510 may be slid to the front side or the rear side along the rail unit 540.

The cart unit 510 extends in a direction in which the capacitor assembly 100 and the valve assembly 200 are connected, that is, in the front and rear direction in the illustrated implementation.

An extension length of the capacitor cart unit 510a may be determined according to a length of the capacitor assembly 100 in the front and rear direction. Likewise, an extension length of the valve cart unit 510b may be determined according to a length of the valve assembly 200 in the front and rear direction. Accordingly, the extension lengths of the capacitor cart unit 510a and the valve cart unit 510b may be different from each other.

The cart unit 510 includes a cart body 511, an extension portion 512, a round portion 513, and a wheel portion 514.

The cart body 511 defines the body of the cart unit 510. The cart unit 510 extends by a predetermined length in the front and rear direction. In addition, the cart unit 510 extends to have a predetermined width in the left and right direction.

In the illustrated implementation, the cart body 511 is formed in a shape of a rectangular plate extending in the front and rear direction. The cart body 511 may have any shape capable of supporting the capacitor assembly 100 or the valve assembly 200.

Figure 13:
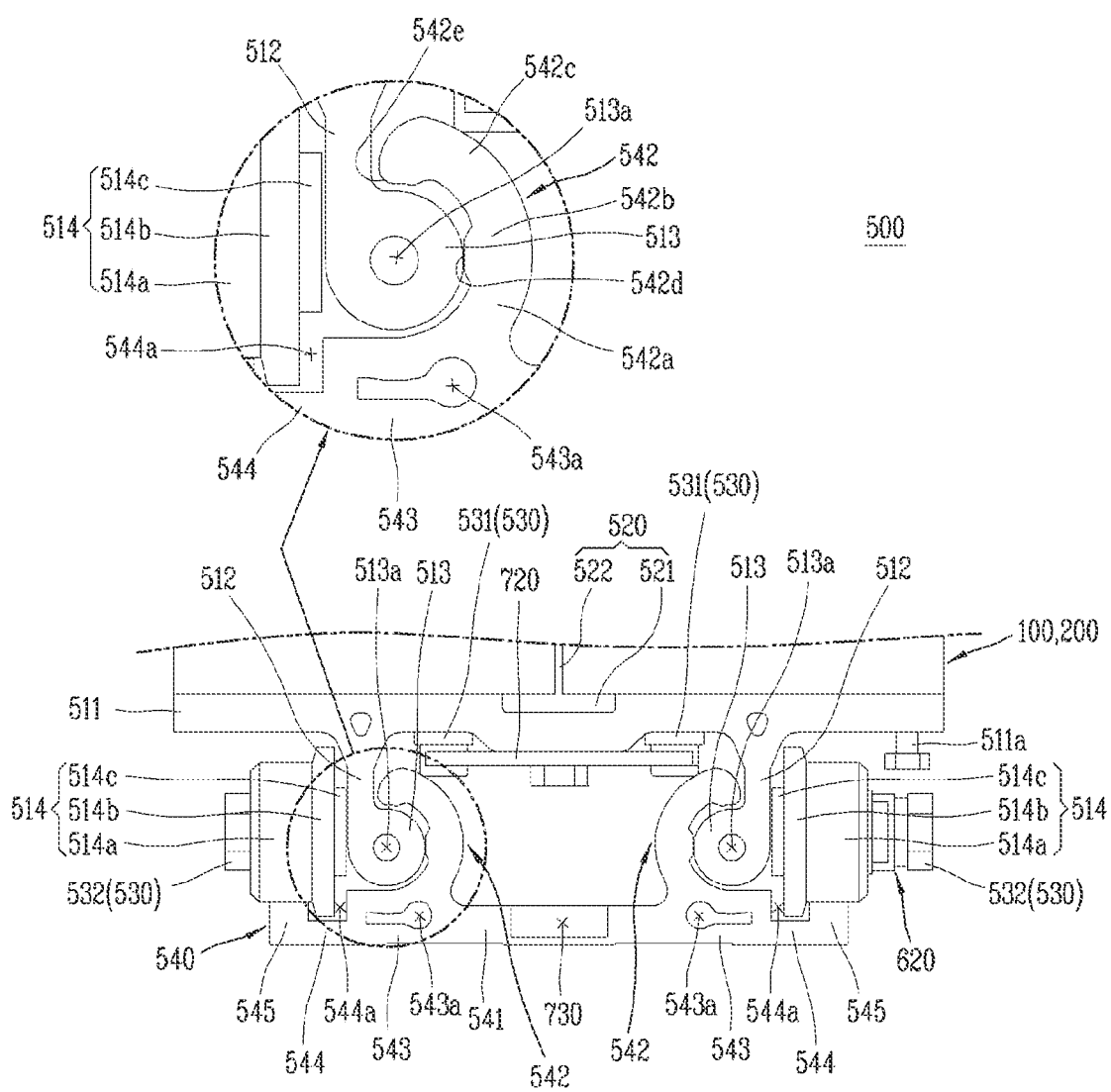
FIG. 13 is a front view illustrating the rail assembly provided in the sub-module of FIG. 2.
Figure 14:
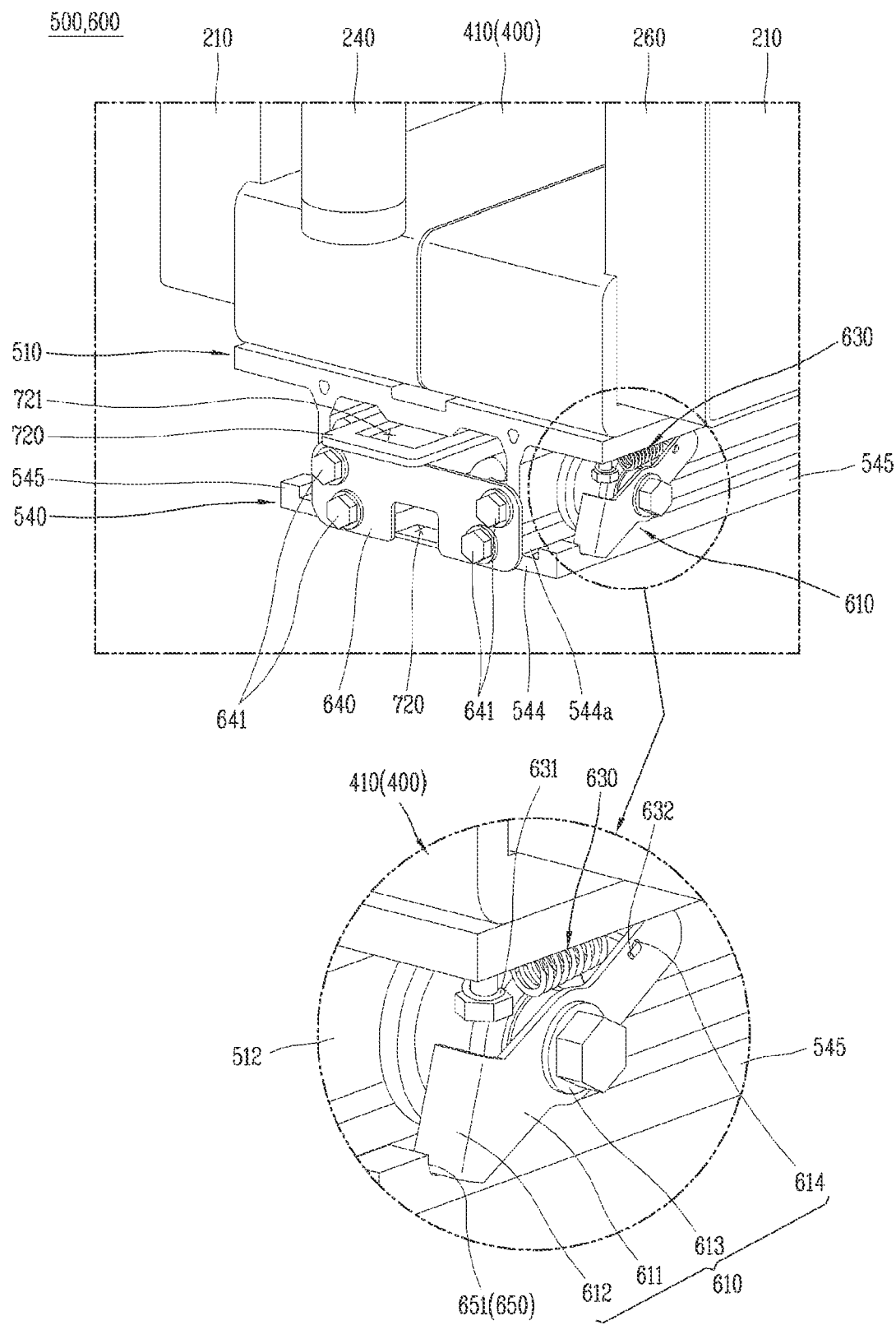
FIG. 14 is a perspective view illustrating the rail assembly of FIG. 13 and a separation prevention part.
Figure 15:
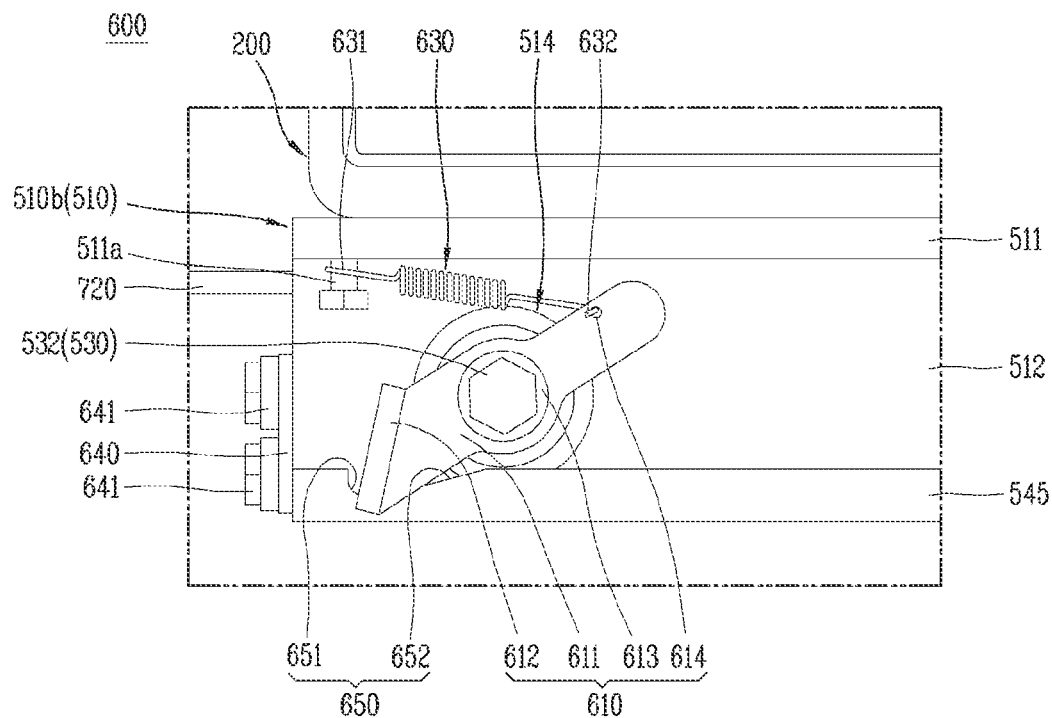
FIG. 15 is a lateral view illustrating a state in which the separation prevention part of FIG. 14 is inserted into a stop groove.
Figure 16:
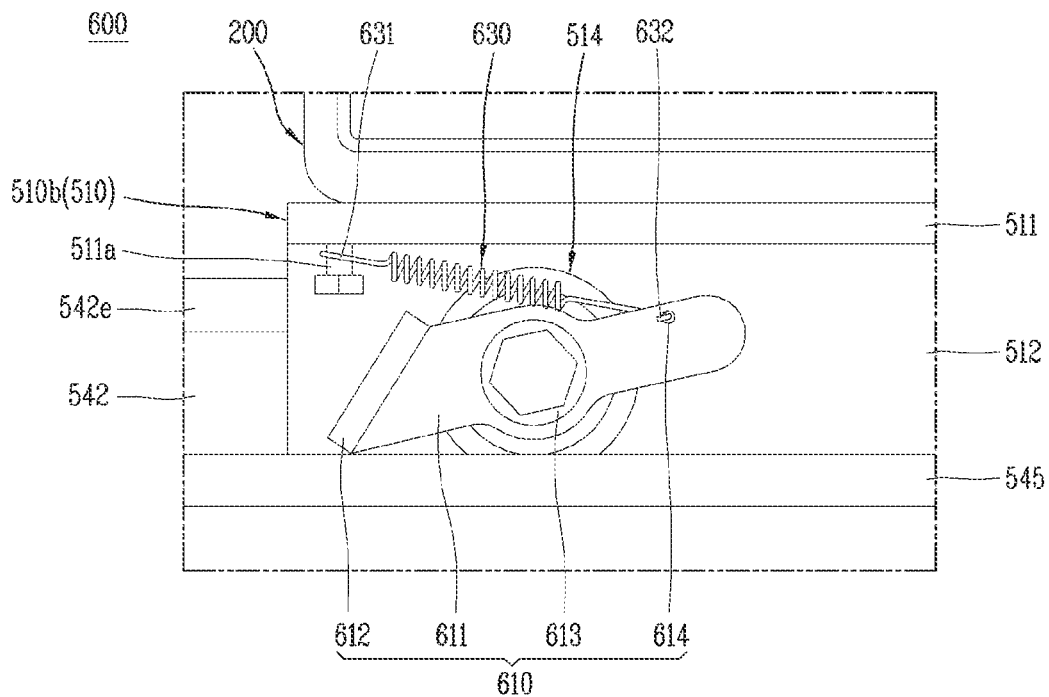
FIG. 16 is a lateral view illustrating a state in which the separation prevention part of FIG. 14 is mounted on a support portion.

Referring to FIG. 13, an elastic member coupling portion 511a is disposed on a right side of the cart body 511. The elastic member coupling portion 511a protrudes by a predetermined distance from a lower surface of the cart body 511.

A cart connection portion 631 of an elastic member 630 of the separation prevention part 600 is coupled to the elastic member coupling portion 511a. In one implementation, the elastic member coupling portion 511a may be configured as a screw member.

The extension portion 512 is disposed on one side of the cart body 511 facing the rail unit 540, i.e., the lower side in the illustrated implementation.

The extension portion 512 is configured to maintain a distance between the rail unit 540 and the cart body 511. In addition, the round portion 513 coupled to the rail unit 540 protrudes from the extension portion 512.

The extension portion 512 protrudes by a predetermined distance from the one side of the cart body 511 facing the rail unit 540. The extension portion 512 extends in the longitudinal direction of the cart body 511, i.e., in the front and rear direction in the illustrated implementation. The extension portion 512 may extend by the same length as the cart body 511.

The extension portion 512 may be provided in plurality. In the illustrated implementation, the extension portions 512 are disposed on the left and right sides, respectively. The extension portions 512 are spaced apart from each other by a predetermined distance. The predetermined distance may be longer than a distance between end portions of a rail curved portion 542 of the rail unit 540.

The round portion 513 protrudes from the extension portion 512. The wheel portion 514 is rotatably coupled to the extension portion 512.

The round portion 513 is a portion at which the cart unit 510 is coupled to the rail unit 540. Specifically, the round portion 513 is inserted into a space surrounded by the rail curved portion 542 of the rail unit 540. The round portion 513 prevents an arbitrary separation between the cart unit 510 and the rail unit 540.

The round portion 513 protrudes by a predetermined distance from one end portion of the extension portion 512 facing the rail unit 540, i.e., from a lower end portion in the illustrated implementation. The round portion 513 protrudes inward, i.e., toward the rail curved portion 542 in the illustrated implementation, by a predetermined distance. In other words, the round portion 513 protrudes by a predetermined distance in a direction away from the wheel portion 514 (i.e., a direction opposite to the wheel portion 514).

The round portion 513 has a circular cross-section in general. That is, except for a portion where the round portion 513 is connected to the extension portion 512, an outer surface of the round portion 513 is rounded toward the rail curved portion 542.

The round portion 513 may be provided in plurality. In the illustrated implementation, the round portions 513 are disposed on the left and right sides, respectively. Each round portion 513 protrudes from the extension portion 512 to be rounded toward the rail curved portion 542.

One side of the round portion 513 facing the rail curved portion 542 in the horizontal direction may come in contact with a third rail curved portion 542c of the rail curved portion 524. A distance from one side of one of the round portions 513 to one side of the other may be longer than a length between ends of the respective rail curved portions 542.

The round portion 513 extends in the longitudinal direction of the cart body 511, i.e., in the front and rear direction in the illustrated implementation. The round portion 513 may extend by the same length as the cart body 511 and the extension portion 512.

A cart hollow portion 513a is defined inside the round portion 513. The cart hollow portion 513a is formed through the round portion 513 in a longitudinal direction in which the round portion 513 extends. A blocking fastening member 641 of the separation prevention part 600 to be described later is inserted into the cart hollow portion 513a.

The wheel portion 514 is rotated as the cart unit 510 moves, and accordingly the cart unit 510 slides along the rail unit 540.

The wheel portion 514 is rotatably coupled to the extension portion 512. Irrespective of the rotation of the wheel portion 514, the extension portion 512 may remain stationary. A bearing member (not illustrated) may be provided for the coupling.

The wheel portion 514 may be provided in plurality. In the illustrated implementation, two wheel portions 514 are located at left and right sides to be spaced apart from each other by a predetermined distance.

In addition, the plurality of wheel portions 514 may be provided on each of left and right sides of a lower end of the cart unit 510.

Referring back to FIGS. 2 and 4, three wheel portions 514 are disposed on each of left and right sides of the capacitor cart unit 510a, with being spaced apart by predetermined distances in the front and rear direction. In addition, two wheel portions 514 are disposed on each of left and right sides of the valve cart unit 510b, with being spaced apart by a predetermined distance in the front and rear direction.

The number of wheel portions 514 disposed on each of the capacitor cart unit 510a and the valve cart unit 510b may vary.

In the illustrated implementation, the wheel portion 514 has a shape in which a plurality of cylinders having different diameters are continuously coupled. In addition, a hollow portion is formed through the inside of the wheel portion 514. A wheel fastening member 532 may be inserted through the hollow portion.

The wheel portion 514 includes a wheel body 514a, a disk portion 514b, and a cart coupling portion 514c.

The wheel body 514a defines the body of the wheel portion 514. An outer circumferential surface of the wheel body 514a is seated on a support portion 545 of the rail unit 540. The rotation of the wheel portion 514 is achieved by relative rotation between the wheel body 514a and the support portion 545.

In the illustrated implementation, the wheel body 514a has a cylindrical shape which has a circular cross-section and a predetermined height. A height of the wheel body 514a, that is, a length of the wheel body 514a in the left and right direction, is preferably longer than a width of the support portion 545, that is, a length of the support portion 545 in the left and right direction.

That is, when the wheel body 514a is seated on the support portion 545, an outer side of the wheel body 514a, that is, a portion thereof in a direction away from the extension portion 152 (i.e., a direction opposite to the extension portion 512) may be exposed to the outside of the rail unit 540.

Accordingly, the wheel portion 514 can be stably mounted on the rail unit 540.

The wheel fastening member 532 is coupled through the outer side of the wheel body 514a, namely, one side in the direction away from the extension portion 512 (i.e., the direction opposite to the extension portion 512). Accordingly, the wheel portion 514 can be coupled to the extension portion 512.

In the illustrated implementation, a rotation bearing member 620 is disposed on the one side of the wheel body 514a located on the right side. The rotation bearing member 620 allows rotation of a stopper member 610, which will be described later, regardless of the rotation of the wheel portion 514. A detailed description thereof will be described later.

The disk portion 514b is disposed on an inner side of the wheel body 514a, that is, one side facing the extension portion 512. The disk portion 514b protrudes from the wheel body 514a toward the extension portion 512 by a predetermined length.

The disk portion 514b is formed in a disk shape having a circular cross-section and a predetermined height. The disk portion 514b has a larger diameter than the wheel body 514a. The disk portion 514b may be accommodated in a guide space 544a located lower than an upper end of the support portion 545.

The disk portion 514b is formed to have a predetermined thickness in a widthwise direction of a step portion 544, that is, between the rail extension portion 543 and the support portion 545. A thickness of the disk portion 514b may be smaller than the width of the step portion 544, that is, a distance between the surfaces of the rail extension portion 543 and the support portion 545 that face each other.

This can suppress the wheel portion 514 from moving in the left and right direction, i.e., in the direction away from the extension portion 512 (the direction opposite to the extension portion 512) by the contact between the disk portion 514b and the support portion 545. Accordingly, the wheel portion 514 cannot be separated from the rail unit 540 in the direction away from the extension portion 512 (i.e., the direction opposite to the extension portion 512).

An outer circumferential surface of the disk portion 514b may be spaced apart from an upper end portion of the step portion 544 by a predetermined distance.

A cart coupling portion 514c is formed on an inner side of the disk portion 514b, that is, one side facing the extension portion 512. The cart coupling portion 514c protrudes from the disk portion 514b toward the extension portion 512 by a predetermined length.

The cart coupling portion 514c is formed in a disk shape having a circular cross-section and a predetermined height. The cart coupling portion 514c has a smaller diameter than the wheel body 514a. One surface of the cart coupling portion 514c facing the extension portion 512 may be in contact with the extension portion 512.

The bracket unit 520 couples the capacitor assembly 100 and the valve assembly 200 to the cart unit 510. The bracket unit 520 is coupled to an upper side of the cart body 511. Specifically, a bracket coupling portion that extends in the longitudinal direction of the cart body 511 is recessed into an upper side of the cart body 511 at a center in the left and right direction.

The bracket unit 520 is coupled to the cart body 511 through the bracket coupling portion. The coupling may be screw coupling or the like.

The bracket unit 520 includes a horizontal portion 521 and a vertical portion 522. The horizontal portion 521 forms a predetermined angle with the cart body 511 and extends in the longitudinal direction of the cart body 511. In one implementation, the horizontal portion 521 may be disposed parallel to the cart body 511.

The vertical portion 522 forms a predetermined angle with the horizontal portion 521 and protrudes from the horizontal portion 521. In one implementation, the predetermined angle may be a right angle.

Figure 11:
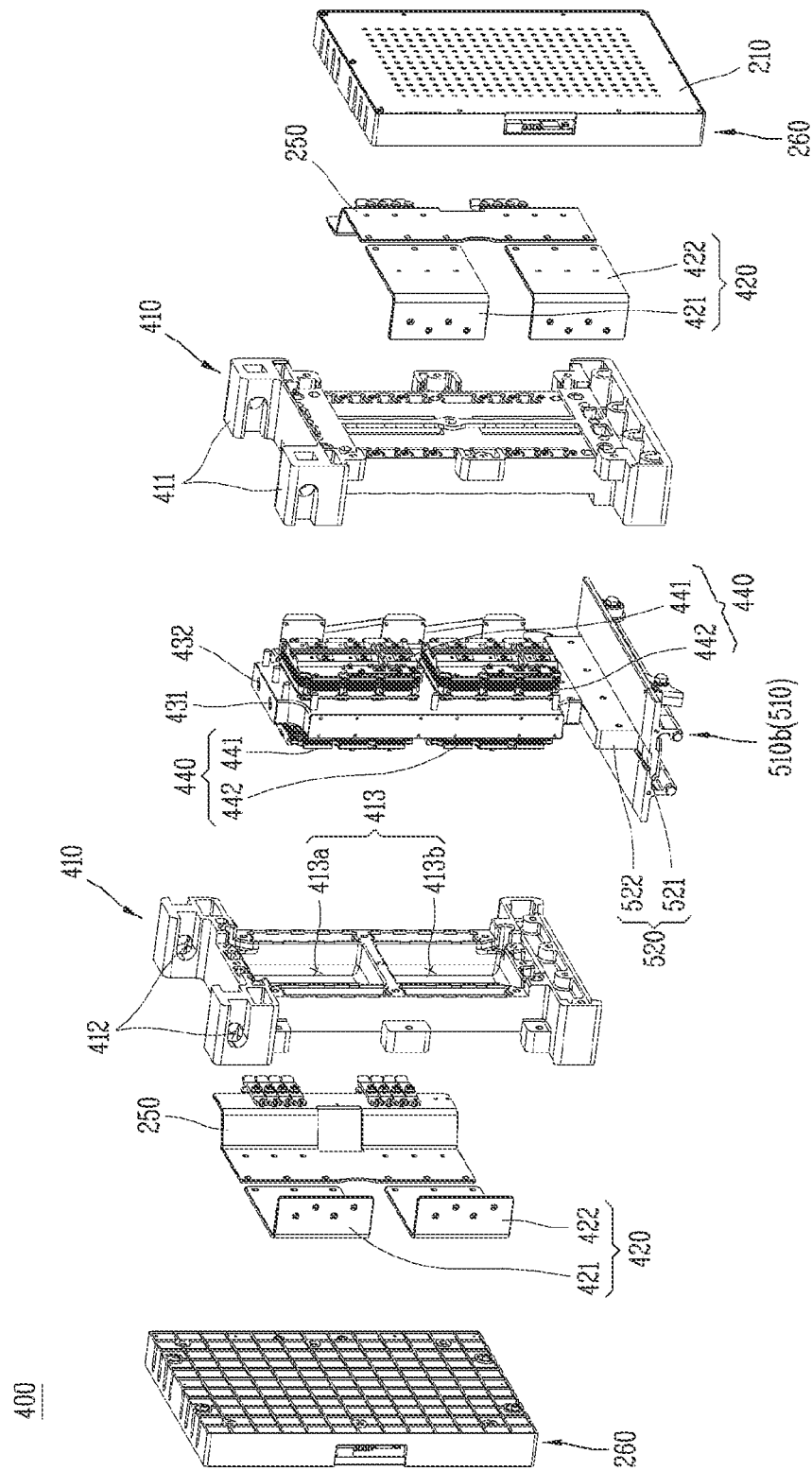
FIG. 11 is an exploded perspective view illustrating the coupling relationship of the explosion-proof frame part provided in the valve assembly of FIG. 7, viewed from another angle.
Figure 12:
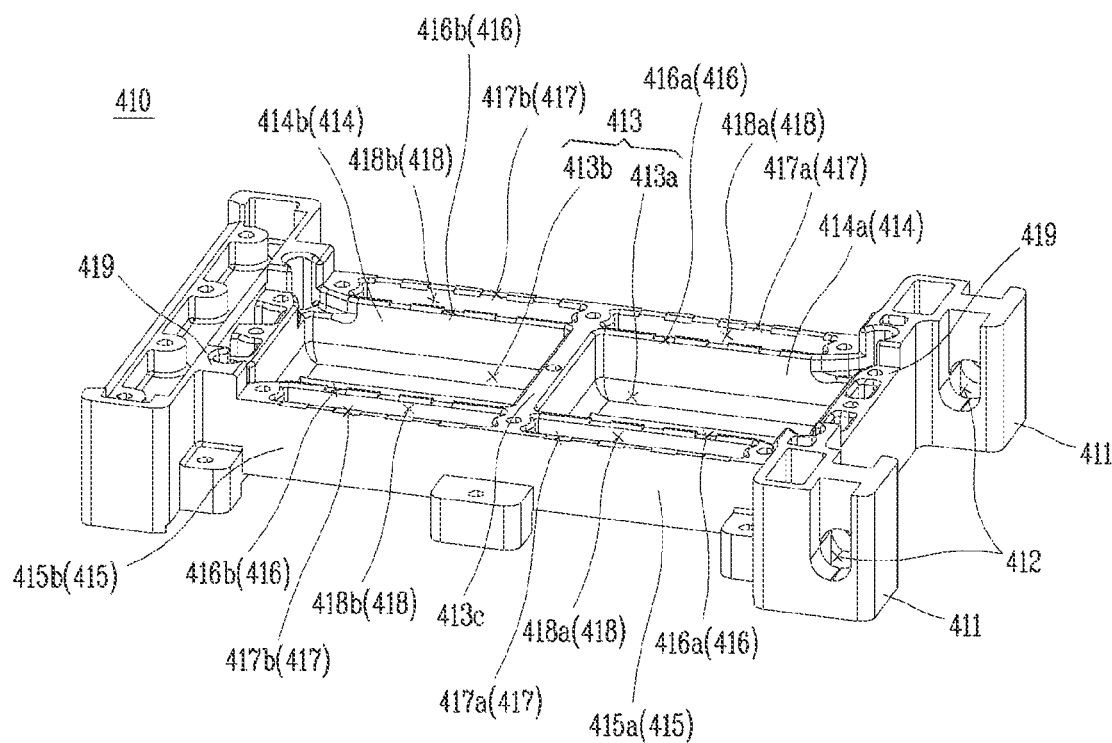
FIG. 12 is a perspective view illustrating a case unit provided in FIGS. 10 and 11.

A plurality of through holes are formed through the vertical portion 522 (see FIG. 11). Fastening members (not illustrated) for fastening the case unit 410 are inserted into the through holes. Accordingly, the valve assembly 200 can be coupled to the valve cart unit 510b.

Although not illustrated, a fastening member (not illustrated) for fastening the capacitor housing 110 of the capacitor assembly 100 to the vertical portion 522 may be provided. Accordingly, the capacitor assembly 100 can be coupled to the capacitor cart unit 510a.

The fastening unit 530 fastens each component of the cart unit 510 to the cart body 511. In one implementation, the fastening unit 530 may be implemented as a screw member.

The fastening unit 530 includes a lever fastening member 531 and a wheel fastening member 532.

The lever fastening member 531 fastens a lever coupling member 720 of an installation and separation part 700 to the cart body 511. In the illustrated implementation, the lever fastening member 531 fastens the lever coupling member 720 located on the front side of the cart body 511.

The lever fastening member 531 may be provided in plurality. The lever fastening members 531 may be disposed to be spaced apart from each other by a predetermined distance in the widthwise direction of the lever coupling member 720, that is, in the left and right direction.

The wheel fastening member 532 rotatably fastens the wheel portion 514 to the extension portion 512. In the illustrated implementation, the wheel fastening member 532 is fastened through the wheel portion 514 in the outward direction of the wheel portion 514, i.e., from a direction away from the extension portion 512 (i.e., the direction opposite to the extension portion 512) to a direction toward the extension portion 512. An inner end portion of the wheel fastening member 532, i.e., one end portion facing the extension portion 512 may be rotatably coupled to the extension portion 512.

The wheel fastening member 532 may be provided in plurality. This results from the fact that the wheel portion 514 is provided in plurality.

The rail unit 540 guides the front and rear direction of the cart unit 510. The cart unit 510 is slidably coupled to the rail unit 540.

The rail unit 540 extends in one direction, namely, in the front and rear direction in the illustrated implementation. This may correspond to the extension direction of the cart unit 510.

The rail unit 540 is preferably formed of a material having sufficient rigidity to support the high-weight capacitor assembly 100 and valve assembly 200.

The rail unit 540 may be provided in plurality. Referring back to FIG. 1, six rail units 540 are disposed on the support portion 23. The plurality of rail units 540 are disposed to be spaced apart from one another by predetermined distances in the left and right direction. The number of the rail units 540 may vary.

Blocking plates 640 of the separation prevention part 600 may be coupled to both end portions of the rail unit 540 in the longitudinal direction. The separation prevention part 600 may restrict forward and rearward movements of the cart unit 510 coupled to the rail unit 540. This can prevent a situation in which the cart unit 510 is arbitrarily separated from the rail unit 540.

In the illustrated implementation, the rail unit 540 includes a rail body 541, a rail curved portion 542, a rail extension portion 543, a step portion 544, and a support portion 545.

The rail body 541 defines the body of the rail unit 540. The rail body 541 is disposed to face the cart body 511.

The rail body 541 may be disposed to form a predetermined angle with the cart body 511. In one implementation, the rail body 541 may be disposed parallel to the cart body 511.

The rail body 541 may extend in one direction, namely, in the front and rear direction in the illustrated implementation. An extension length of the rail body 541 is preferably longer than the sum of extension lengths of the capacitor cart unit 510a and the valve cart unit 510b.

A lever insertion groove 730 is recessed into one side of the rail body 541, i.e., the front side in the illustrated implementation.

The rail curved portion 542 protrudes toward the cart body 511 from an outside of the rail body 541, i.e., each of left and right end portions in the illustrated implementation.

The rail curved portion 542 is a portion to which the round portion 513 is slidably coupled. The rail curved portion 542 is formed such that the round portion 513 partially covers one side thereof facing the cart body 511, that is, the upper side. Accordingly, the round portion 513 coupled to the rail curved portion 542 is not separated in the upward direction.

That is, due to the shapes of the rail curved portion 542 and the round portion 513, the cart unit 510 must be slid from the front side or the rear side to be coupled to the rail unit 540. Similarly, due to the shapes of the rail curved portion 542 and the round portion 513, the cart unit 510 and the rail unit 540 are not arbitrarily separated from each other.

The rail curved portion 542 may extend in one direction, namely, in the front and rear direction in the illustrated implementation. The extension length of the rail curved portion 542 may be the same as the extension length of the rail body 541.

The rail curved portion 542 may be provided in plurality. The plurality of rail curved portions 542 may be disposed to be spaced apart from each other by a predetermined distance. Each rail curved portion 542 is located adjacent to each round portion 513.

Each rail curved portion 542 is located at an inner side of each round portion 513, i.e., in a direction facing a central portion of the rail body 541, in which the lever insertion groove 730 is recessed, in the illustrated implementation.

The rail curved portions 542 are formed to be convex toward each other. In other words, the rail curved portion 542 is rounded in a direction away from the round portion 513 (i.e., a direction opposite to the round portion 513). In one implementation, the rail curved portions 542 may have a shape like an alphabet "C" such that cross-sections thereof are convex toward each other.

It will be understood that the shape of the rail curved portion 542 corresponds to the shape of the round portion 513.

Accordingly, the rail curved portion 542 is formed to surround a lower side, an inner side (i.e., sides at which the round portions 513 face each other), and an upper side of the round portion 513.

The rail curved portion 542 includes a first rail curved portion 542a, a second rail curved portion 542b, a third rail curved portion 542c, a side limiting portion 542d, and a top limiting portion 542e.

The first rail curved portion 542a protrudes from one end portion of the rail body 541 toward the cart body 511. Specifically, the first rail curved portion 542a protrudes from an end portion of the rail body 541 which is connected to the rail extension portion 543.

The first rail curved portion 542a is formed to be convex toward another first rail curved portion 542a. In other words, the first rail curved portion 542a is rounded in a direction away from the round portion 513 (i.e., a direction opposite to the round portion 513).

The second rail curved portion 524b protrudes from one end portion of the first rail curved portion 542a facing the cart body 511, namely, an upper end portion in the illustrated implementation.

The second rail curved portion 542b is formed to be convex toward another second rail curved portion 542b. In other words, the second rail curved portion 542b is rounded in a direction away from the round portion 513 (i.e., a direction opposite to the round portion 513). A degree to which the second rail curved portion 542b is curved may be determined according to a degree to which the first rail curved portion 542a is curved. In one implementation, the second rail curved portion 542b may be curved with the same curvature as the first rail curved portion 542a.

The third rail curved portion 542c protrudes from one end portion of the second rail curved portion 542b facing the cart body 511, namely, an upper end portion in the illustrated implementation.

The third rail curved portion 542c is formed to be convex toward the cart body 511. In other words, the third rail curved portion 542c is rounded in a direction away from the round portion 513 (i.e., a direction opposite to the round portion 513).

In one implementation, the third rail curved portion 542c may be formed to be convex toward the central portion of the cart body 511 in the left and right direction. In the implementation, the third rail curved portion 542c is convex in an inward direction of an upper side (i.e., a direction in which different rail curved portions 542 face each other).

The third rail curved portion 542c may be formed to partially cover the upper side of the round portion 513. In one implementation, the third rail curved portion 542c may extend toward the extension portion 512. That is, an end portion of the third rail curved portion 542c is located between the round portion 513 and the cart body 511.

The side limiting portion 542d protrudes in an outward direction of the second rail curved portion 542b, that is, in a direction toward the round portion 513.

The side limiting portion 542d is rounded in the outward direction, in a direction toward the round portion 513 in the illustrated implementation. That is, the side limiting portion 542d is formed to be convex in the opposite direction to the first or second rail curved portions 542a or 542b.

The side limiting portion 542d includes a first part extending toward the round portion 513, a second part continuously formed with the first part, brought into contact with or separated from the round portion 513, and extending at a predetermined angle with a surface of the round part 513, and a third part continuously formed with the second part and extending away from the round portion 513 (i.e., to be opposite to the round portion 513).

In one implementation, the second part of the side limiting portion 542d may extend parallel to one surface of the round portion 513 facing the rail curved portion 542.

In another implementation, the second part of the side limiting portion 542d, that is, one surface of the side limiting portion 542d facing the round portion 513, may be concave in the direction away from the round portion 513 (i.e., the direction opposite to the round portion 513). In addition, the round portion 513 may be formed to be convex toward the second part of the side limiting portion 542d.

That is, the second part of the side limiting portion 542d may be rounded in the same direction as the round portion 513.

The second part of the side limiting portion 542d may be in contact with the one surface of the round portion 513 facing the rail curved portion 542. This can limit a distance by which the wheel portion 514 moves toward the rail curved portion 542.

The top limiting portion 542e protrudes in the outward direction of the third rail curved portion 542c, that is, in the direction toward the round portion 513. The top limiting portion 542e is rounded in the outward direction.

That is, the top limiting portion 542e is convex in a different direction from the third rail curved portion 542c.

In one implementation, one surface of the top limiting portion 542e facing the round portion 513 may be concave in the direction away from the round portion 513 (i.e., the direction opposite to the round portion 513). In addition, the round portion 513 may be formed to be convex toward the one surface of the top limiting portion 542e.

That is, the one surface of the top limiting portion 542e may be rounded in the same direction as the round portion 513.

The top limiting portion 542e may be brought into contact with or separated from one surface of the extension portion 512 or the round portion 513 that faces the rail curved portion 542. This can limit a distance by which the wheel portion 514 moves upward on the rail unit 540.

The rail extension portion 543 extends from both end portions of each rail body 541 in the horizontal direction, i.e., from the left or right end portion in the illustrated implementation. The rail extension portion 543 extends at a predetermined angle with the rail body 541. In one implementation, the rail extension portion 543 may extend parallel to the rail body 541.

The rail extension portion 543 may extend so that an end portion thereof in the outward direction, i.e., the direction away from the rail body 541 (i.e., the direction opposite to the rail body 541) is located right below the extension portion 512. That is, the end portion of the rail extension portion 543 in the outward direction may be located more outward than the end portion of the third rail curved portion 542c.

The rail extension portion 543 has a predetermined thickness. It is preferable that an upper surface of the rail extension portion 543, that is, one surface facing the round portion 513 do not come into contact with the round portion 513. This is to prevent the rail extension portion 543 from being damaged due to the movement of the cart unit 510.

A fastening hole 543a is formed through the inside of the rail extension portion 543. The fastening hole 543a is formed through the rail extension portion 541 in one direction in which the rail unit 540 extends, namely, in the front and rear direction in the illustrated implementation.

A blocking fastening member 641 of the separation prevention part 600 is fastened to the fastening hole 543a. In one implementation, the blocking fastening member 641 may be screwed to the fastening hole 543a.

The step portion 544 extends from an outer end portion of the rail extension portion 543, namely, one end portion in the direction away from the rail body 541 (i.e., the direction opposite to the rail body 541). The step portion 544 extends at a predetermined angle with the rail extension portion 543. In one implementation, the step portion 544 may extend parallel to the rail extension portion 543.

The step portion 544 may extend to be located directly below the disk portion 514b of the wheel portion 514. One surface of the step portion 544 facing the disk portion 514b, namely, an upper surface in the illustrated implementation, is spaced apart from an outer circumferential surface of the disk portion 514b by a predetermined distance.

That is, when the wheel portion 514 is rotated, the upper surface of the step portion 544 does not come into contact with the disk portion 514b. Accordingly, even when the wheel portion 514 is rotated, the step portion 544 is not damaged.

An outer end portion of the step portion 544, that is, an end portion in the direction away from the rail extension portion 543 (that is, in the direction opposite to the rail extension portion 543), extends to be located below the wheel body 514a. That is, the end portion of the step portion 544 is located more outward than the disk portion 514b, i.e., farther away from the rail extension portion 543 (i.e., more opposite to the rail extension portion 543).

The step portion 544 has a lower height than the rail extension portion 543. That is, the shortest distance between the upper surface of the step portion 544 and the cart body 511 is longer than the shortest distance between the upper surface of the rail extension portion 543 and the cart body 511.

In other words, the shortest distance between the upper surface of the step portion 544 and the capacitor assembly 100 or the valve assembly 200 is longer than the shortest distance between the upper surface of the rail extension portion 543 and the capacitor assembly 100 or the valve assembly 200.

Also, the step portion 544 has a lower height than the support portion 545. That is, the shortest distance between the upper surface of the step portion 544 and the cart body 511 is longer than the shortest distance between the upper surface of the support portion 545 and the cart body 511.

In other words, the shortest distance between the upper surface of the step portion 544 and the capacitor assembly 100 or the valve assembly 200 is longer than the shortest distance between the upper surface of the support portion 545 and the capacitor assembly 100 or the valve assembly 200.

Accordingly, a space is defined in the upper side of the step portion 544 by the surfaces of the rail extension portion 543 and the support portion 545 facing each other. The space is defined as a guide space 544a.

The guide space 544a is a space into which the disk portion 514b of the wheel portion 514 is inserted. The guide space 544a limits a movement distance of the disk portion 514b in the left and right direction so that the wheel portion 514 can be rotated while seated on the support portion 545.

At this time, a length of the guide space 544a in the widthwise direction (i.e., a length in the left and right direction in the illustrated implementation) is greater than the thickness of the disk portion 514b. In other words, a length by which the step portion 544 extends between the rail extension portion 543 and the support portion 545 is longer than the width of the disk portion 514b.

Accordingly, the disk portion 514b can be moved toward the rail extension portion 543 or the support portion 545 while being inserted into the guide space 544a.

At this time, as described above, the guide space 544a is defined by being surrounded by the upper surface of the step portion 544 and the surfaces of the rail extension portion 543 and the support portion 545 which face each other.

That is, a space in an inward direction of the guide space 544a, that is, a space in a direction toward the rail curved portion 542 is defined by the surface of the rail extension portion 543 in the outward direction, that is, in the direction toward the step portion 544.

In addition, a space in an outward direction of the guide space 544a, that is, a space in a direction toward the support portion 545 is defined by the surface of the support portion 545 in the inward direction, that is, in the direction toward the step portion 544.

Accordingly, an inward movement distance of the disk portion 514b inserted in the guide space 544a is limited by the surface of the rail extension portion 543 in the outward direction. In addition, an outward movement distance of the disk portion 514b is limited by the surface of the support portion 545 in the inward direction.

This can prevent the wheel portion 514 from being separated in the inward or outward direction of the rail unit 540, that is, in the left and right direction in the illustrated implementation.

The support portion 545 supports the wheel body 514a of the wheel portion 514. The wheel body 514a is seated on the support portion 545. The upper surface of the support portion 545 may be in contact with an outer circumferential surface of the wheel body 514a.

The support portion 545 extends from an end portion of the step portion 544 in the outward direction, namely, an end portion in the direction away from the rail extension portion 543 (i.e., the direction opposite to the rail extension portion 543). The support portion 545 may extend so that the end portion in the outward direction is located directly below the wheel body 514a.

The upper surface of the support portion 545, that is, the surface in contact with the wheel body 514a may be formed as a flat surface.

Accordingly, the support portion 545 can stably support the load of the cart unit 510 and the capacitor assembly 100 and the valve assembly 200 seated thereon. In addition, when the wheel portion 514 rolls on the upper surface of the support portion 545 and moves, such rolling can be stable.

The support portion 545 has a higher height than the step portion 544. That is, the shortest distance between the upper surface of the support portion 545 and the cart body 511 is shorter than the shortest distance between the upper surface of the step portion 544 and the cart body 511.

In other words, the shortest distance between the upper surface of the step portion 544 and the capacitor assembly 100 or the valve assembly 200 is longer than the shortest distance between the upper surface of the support portion 545 and the capacitor assembly 100 or the valve assembly 200.

A difference between the height of the support portion 545 and the height of the step portion 544 may be determined according to a difference between a diameter of the wheel body 514a and a diameter of the disk portion 514b. That is, the difference between the height of the support portion 545 and the height of the step portion 544 may be greater than the difference between the diameter of the wheel body 514a and the diameter of the disk portion 514b.

Accordingly, even when the wheel body 514a is seated on the support portion 545, the disk portion 514b does not come into contact with the step portion 544.

The support portion 545 has a lower height than the rail extension portion 543. That is, the shortest distance between the upper surface of the support portion 545 and the cart body 511 is longer than the shortest distance between the upper surface of the rail extension portion 543 and the cart body 511.

In other words, the shortest distance between the upper surface of the support portion 545 and the capacitor assembly 100 or the valve assembly 200 is longer than the shortest distance between the upper surface of the rail extension portion 543 and the capacitor assembly 100 or the valve assembly 200.

As described above, the cart unit 510 has the round portion 513. When the cart unit 510 is slidably coupled to the rail unit 540, the round portion 513 is disposed such that its lower side, inner side (in a direction that the round portions 513 face each other), and upper side are surrounded by the rail curved portion 542 of the rail unit 540.

Accordingly, the cart unit 510 is not separated from the rail unit 540 in the upward direction.

In addition, the rail unit 540 has the guide space 544a that is defined by being surrounded by the rail extension portion 543, the step portion 544, and the support portion 545. The disk portion 514b of the wheel portion 514 is inserted into the guide space 544a.

Accordingly, a movement distance of the wheel portion 514 in a direction away from the rail curved portion 542 (i.e., a direction opposite to the rail curved portion 542) or toward the rail curved portion 542 is limited. Accordingly, the cart unit 510 is not separated from the rail unit 540 in the left or right direction.

7. Description of Separation Prevention Part 600 According to Implementation

The sub-module 10 according to the implementation includes the separation prevention part 600. The separation prevention part 600 prevents the cart unit 510 slidably coupled to the rail unit 540 from being arbitrarily separated.

Hereinafter, the separation prevention part 600 according to the implementation will be described in detail, with reference to FIGS. 13 to 16.

In the illustrated implementation, the separation prevention part 600 includes a stopper member 610, a rotation bearing member 620, an elastic member 630, a blocking plate 640, and a stop groove 650.

The stopper member 610 limits a distance by which the cart unit 510 is moved to the front side. By the stopper member 610, the cart unit 510 is not arbitrarily separated from the rail unit 540 through the front side of the rail unit 540.

The stopper member 610 may be provided on any one or more of the left and right wheel portions 514 of the cart unit 510. In the illustrated implementation, the stopper member 610 is provided on the left wheel portion 514 of the cart unit 510. Alternatively, the stopper member 610 may be provided on the right wheel portion 514 of the cart unit 510.

Furthermore, the stopper member 610 may be provided in plurality respectively on the left and right wheel portions 514.

The stopper member 610 is rotatably coupled to the wheel portion 514.

The stopper member 610 may not rotate regardless of the rotation of the wheel portion 514. Similarly, the stopper member 610 may be rotated regardless of a stop state of the wheel portion 514.

The stopper member 610 is inserted into the stop groove 650 formed in the rail unit 540. One side of the inserted stopper member 610, namely, the front side in the illustrated implementation, is in contact with a first surface 651 of the stopper groove 650. Accordingly, the stopper member 610 and the cart unit 510 to which the stopper member 610 is connected is no longer moved to the front side.

The stopper member 610 may move on an upper side of the support portion 545. Specifically, one side of the stopper member 610 facing the front side may be moved together with the cart unit 510 in a contact state with the upper surface of the support portion 545.

The stopper member 610 is connected to the elastic member 630. The elastic member 630 applies an elastic force so that the one side of the stopper member 610 can be maintained in contact with the support portion 545. The stopper member 610 may be formed of a material having high rigidity. In one implementation, the stopper member 610 may be formed of iron (Fe).

The stopper member 610 includes a stopper body 611, a locking plate 612, a wheel coupling portion 613, and an elastic member coupling hole 614.

The stopper body 611 extends in one direction. In one implementation, the stopper body 611 may extend in the same direction as the support portion 545.

The locking plate 612 is formed on one side of the stopper body 611, namely, a front end portion in the illustrated implementation. The wheel coupling portion 613 is formed through a center portion of the stopper body 611. In addition, the elastic member coupling hole 614 is formed through another side of the stopper body 611, namely, the rear side in the illustrated implementation.

The stopper body 611 is disposed such that the front end portion faces downward and the rear end portion faces upward. This is due to a direction in which the elastic member 630 coupled to the elastic member coupling hole 614 pulls the rear end portion of the stopper body 611, namely, a counterclockwise direction in the implementation illustrated in FIG. 15.

Accordingly, the front end portion of the stopper body 611 can be maintained in contact with the upper surface of the support portion 545.

The locking plate 612 is provided on the front end portion of the stopper body 611.

The locking plate 612 is a portion on which the stopper member 610 is in contact with each surface of the stop groove 650. When the locking plate 612 comes into contact with a first surface 651 or a second surface 652 of the stop groove 650, the cart unit 510 is no longer moved to the front side.

The locking plate 612 extends from the front end portion of the stopper body 611. The locking plate 612 may extend at a predetermined angle with the stopper body 611. In one implementation, the locking plate 612 may extend vertically with respect to the stopper body 611.

In the illustrated implementation, the locking plate 612 protrudes in the inward direction, namely, in a direction toward the round portion 513 from the front end portion of the stopper body 611 by a predetermined distance. In one implementation, the locking plate 612 may extend so that one end portion facing the inward direction is located above the step portion 544.

When the stopper body 611 is inserted into the stop groove 650, the locking plate 612 comes into contact with the first surface 651 or the second surface 652. Accordingly, the cart unit 510 to which the stopper member 610 is rotatably coupled is no longer moved to the front side.

The wheel fastening member 532 is fastened to the wheel coupling portion 613. The stopper member 610 is rotatably coupled to the cart unit 510 by the wheel fastening member 532.

The wheel coupling portion 613 may be formed through the stopper body 611. The center of the wheel coupling portion 613 may be disposed coaxially with the center of the wheel portion 514.

The elastic member coupling hole 614 is located on a rear side of the stopper body 611, namely, on one side in a direction away from the stop groove 650 (i.e., a direction opposite to the stop groove 650) in the illustrated implementation. The elastic member coupling hole 614 may be biased toward the upper side of the stopper body 611.

One end portion of the elastic member 630 is coupled to the elastic member coupling hole 614. The one end portion of the elastic member 630 may be rotated in the inserted state in the elastic member coupling hole 614.

The rotation bearing member 620 couples the stopper member 610 to the wheel portion 514 to be maintained in the stop state or to be rotatable, regardless of the rotation of the wheel portion 514. The rotation bearing member 620 is located between the stopper member 610 and the wheel portion 514.

The elastic member 630 applies the elastic force to the stopper member 610. The elastic member 630 applies the elastic force to the rear end portion of the stopper member 610 in a direction toward the cart body 511. In the illustrated implementation, the elastic member 630 applies a counterclockwise elastic force to the stopper member 610.

Accordingly, the rear end portion of the stopper member 610 can be maintained in a direction toward the cart body 511, namely, in an upwardly pulled state in the illustrated implementation.

The elastic member 630 may be configured in any form capable of storing a restoring force by deformation. In one implementation, the elastic member 630 may be configured as a coil spring.

The elastic member 630 includes a cart connection portion 631 and a stopper connection portion 632. In one implementation, the cart connection portion 631 and the stopper connection portion 632 may be formed in a hook shape.

The cart connection portion 631 is located on a front end portion of the elastic member 630. The cart connection portion 631 is connected to the elastic member coupling portion 511a.

The stopper connection portion 632 is located on a rear end portion of the elastic member 630. The stopper connection portion 632 is rotatably coupled to the elastic member coupling hole 614.

Accordingly, the elastic member 630 can be stretched or contracted between the elastic member coupling portion 511a and the elastic member coupling hole 614.

By the elastic member 630, the stopper member 610 can be maintained in a state in which the front end portion is inclined downward and the rear end portion is inclined upward.

Also, when the stopper member 610 enters the stop groove 650, the elastic member 630 applies the counterclockwise restoring force to the stopper member 610. Accordingly, when the stopper member 610 is spaced apart from the stop groove 650, the front end portion of the stopper member 610 can return to a state in contact with the upper surface of the support portion 545.

The blocking plate 640 closes the front side of the rail unit 540. Also, the blocking plate 640 may close the rear side of the rail unit 540 (see FIGS. 20A and 20B). The blocking plate 640 may be provided to prevent the cart unit 510 from being arbitrarily separated from the rail unit 540 when the sub-module 10 needs to be moved.

The blocking plate 640 may be coupled to the rail unit 540 to cover the rail body 541, the rail extension portion 543, and a part of the step portion 544. In addition, the blocking plate 640 may be coupled to the cart unit 510 to cover a part of the round portion 513.

The blocking plate 640 may be coupled to the cart unit 510 and the rail unit 540 by a blocking fastening member 641. In one implementation, the blocking fastening member 641 may be implemented as a screw member.

The blocking fastening member 641 may be provided in plurality. In the illustrated implementation, four blocking fastening members 641 are provided. The blocking fastening member 641 may be fastened to the cart hollow portion 513a and the fastening hole 543a.

The front end portion of the stopper member 610 is inserted into the stop groove 650. Specifically, the locking plate 612 and the front end portion of the stopper body 611 to which the locking plate 612 is connected are inserted into the stop groove 650.

The stop groove 650 is formed in the support portion 545. Specifically, the stop groove 650 is formed in the front side of the support portion 545.

The stop groove 650 is preferably formed at a position where the cart unit 510 cannot be arbitrarily separated from the rail unit 540 when the front end portion of the stopper member 610 is inserted.

In one implementation, the stop groove 650 may be formed at a position at which the front end portion of the cart unit 510 and the front end portion of the rail unit 540 are located on the same vertical line when the locking plate 612 and the first surface 651 of the stop groove 650 are in contact with each other.

The stop groove 650 may be provided in plurality. The plurality of stop grooves 650 are disposed to be spaced apart from each other by a predetermined distance in the front and rear direction, that is, along the direction in which the rail unit 540 extends.

The stop groove 650, which is located at the front side, of the plurality of stop grooves 650 may limit a movement distance of the valve cart unit 510b. Also, the stop groove 650, which is located at the rear side, of the plurality of stop grooves 650 may limit a movement distance of the capacitor cart unit 510a.

The stop groove 650 is recessed by a predetermined length in the upper surface of the support portion 545. A recessed degree of the stop groove 650 may differ depending on the longitudinal direction of the support portion 545.

In the illustrated implementation, the stop groove 650 is formed such that a rear side slope is gentler than a front side slope. Accordingly, the stopper member 610 moved together with the cart unit 510 can enter the stop groove 650 along the rear side slope. In addition, the entered stopper member 610 can no longer be moved to the front side by the front side.

The stop groove 650 includes a first surface 651 and a second surface 652.

The first surface 651 is a portion which comes in contact with the locking plate 612 of the stopper member 610 inserted into the stop groove 650. The first surface 651 may be defined as a front side surface of the stop groove 650 which is recessed in the upper surface of the support portion 545.

In other words, the first surface 651 is located adjacent to one side in the extending direction of the rail unit 540, namely, to the front end portion in the illustrated implementation. The first surface 651 is formed to surround the one side of the stop groove 650, namely, the front side in the illustrated implementation.

The first surface 651 extends at a predetermined angle with the upper surface of the support portion 545. The predetermined angle may be greater than an angle between the second surface 652 and the upper surface of the support portion 545. In one implementation, the predetermined angle may be a right angle.

A rear end portion of the first surface 651 is continuously formed with a front end portion of the second surface 652.

The second surface 652 is a portion through which the locking plate 612 of the stopper member 610 moves toward the first surface 651. The locking plate 612 may be moved toward the first surface 651 while its lower end portion is in contact with the second surface 652.

The second surface 652 may be defined as a rear side surface of the stop groove 650 which is recessed in the upper surface of the support portion 545. The first surface 651 and the second surface 652 are continuous with the second surface 652.

In other words, the second surface 652 extends toward one side in the extending direction of the rail unit 540, namely, in the direction away from the front end portion (i.e., the direction opposite to the front end portion) in the illustrated implementation. That is, the second surface 652 is disposed to be farther from the one end portion (i.e., the front end portion) of the rail unit 540 than the first surface 651. That is, the second surface 652 is located at the rear side of the first surface 651.

The second surface 652 extends at a predetermined angle with the upper surface of the support portion 545. The predetermined angle may be smaller than an angle between the first surface 651 and the upper surface of the support portion 545. In one implementation, the predetermined angle may be an acute angle.

The rear end portion of the second surface 652 extends to the upper surface of the support portion 545.

Accordingly, the locking plate 612 can be moved to the front side or the rear side along the second surface 652. On the other hand, when the locking plate 612 is in contact with the first surface 651, the locking plate 612 is no longer moved to the front side.

This can limit a forward movement distance of the stopper member 610 and the cart unit 510 to which the stopper member 610 is rotatably connected.

As described above, the front end portion of the stopper member 610 is moved to the front side or the rear side together with the cart unit 510 in the state in contact with the upper surface of the support portion 545. When the front end portion of the stopper member 610 reaches the stop groove 650, the front end portion of the stopper member 610 is rotated downward along the second surface 652.

When the front end portion of the stopper member 610 is in contact with the first surface 651, the stopper member 610 is no longer moved to the front side due to the shape of the first surface 651. Accordingly, the cart unit 510 connected to the stopper member 610 cannot be moved to the front side as well. This can limit the forward movement distance of the cart unit 510.

In this case, a case in which the sub-module 10 needs to be drawn out of the frame 20 for the purpose of maintenance or the like may be considered. The capacitor assembly 100 and the valve assembly 200 constituting the sub-module 10 are mounted on the cart unit 510. Therefore, a process in which the cart unit 510 is separated from the rail unit 540 should be preceded.

As described above, when the front end portion of the stopper member 610 comes into contact with the first surface 651 of the stop groove 650, the stopper member 610 is no longer moved to the front side.

Accordingly, the stopper member 610 is rotated by being pressed and drawn out of the stop groove 650.

Specifically, an end portion, which is not in contact with the first surface 651, of the end portions of the stopper member 610, namely, the rear end portion in the illustrated implementation, is pressed. Accordingly, the end portion of the stopper member 610 in contact with the first surface 651, that is, the front end portion is rotated in a direction away from the first surface 651 (i.e., a direction opposite to the first surface 651), namely, in a clockwise direction in the illustrated implementation, so as to be drawn out of the stop groove 650.

Next, the cart unit 510 is slid toward one end portion of the rail unit 540, namely, the front end portion in the illustrated implementation, by an external force.

At this time, the end portion of the rail unit 540 is in a closed state by the blocking plate 640. Accordingly, when the fastened blocking fastening member 641 is released, the blocking plate 640 is separated from the rail unit 540.

Then, the installation and separation part 700 to be described later is utilized so that the cart unit 510 can be separated from the rail unit 540.

This can prevent the cart unit 510 from being arbitrarily separated from the rail unit 540. Accordingly, a safety accident which may be caused due to an arbitrary separation of the cart unit 510 can be prevented.

Conversely, when the stopper member 610 is moved to the rear side, the front end portion of the stopper member 610 is moved to the rear side while in contact with the second surface 652. As described above, the second surface 652 may form the acute angle with the upper surface of the support portion 545. Also, the rear end portion of the second surface 652 is continuous with the upper surface of the support portion 545.

Accordingly, when the stopper member 610 is moved to the rear side, it can be moved easily unlike when it is moved to the front side.

In addition, the blocking plates 640 may be disposed on the front end portion and the rear end portion of the rail unit 540. The blocking plates 640 are fastened to the cart unit 510 and the rail unit 540, respectively. Accordingly, the front side and the rear side of the cart unit 510 are blocked by the blocking plates 640.

Therefore, the blocking plates 640 can prevent the cart unit 510 from being arbitrarily separated from the rail unit 540. This can be utilized in a situation in which the sub-module 10 is moved or the movement of the cart unit 510 should be restricted.

8. Description of Installation and Separation Part 700 According to Implementation The sub-module 10 according to the implementation includes the installation and separation part 700. The installation and separation part 700 may facilitate the cart unit 510, on which the capacitor assembly 100 or the valve assembly 200 is seated, to be coupled to or removed from the rail unit 540.

Hereinafter, the installation and separation part 700 according to the implementation will be described in detail, with reference to FIGS. 17 and 18.

In the illustrated implementation, the installation and separation part 700 includes a lever member 710, a lever coupling member 720, and a lever insertion groove 730.

The lever member 710 is inserted into the lever coupling member 720 and the lever insertion groove 730. A user can easily couple the cart unit 510 to the rail unit 540 using the lever member 710. The user can also easily remove the cart unit 510 from the rail unit 540 using the lever member 710.

The lever member 710 may function as a lever. That is, the lever member 710 may pull the lever coupling member 720 toward the front side or push it toward the rear side with the lever insertion groove 730 as an axis.

The lever member 710 may be provided together with the sub-module 10. To this end, a member (not illustrated) for mounting the lever member 710 may be provided on the frame 20.

The lever member 710 may be provided separately from the sub-module 10. When the sub-module 10 needs to be separated from the frame 20, the user can separate the sub-module 10 by using the lever member 710.

The lever member 710 may include an extension portion 711 and a knob 712.

The extension portion 711 is a portion coupled to the lever coupling member 720 and the lever insertion groove 730. The extension portion 711 extends from one end portion of the knob 712.

The extension portion 711 may be formed of a material having high rigidity. In one implementation, the extension portion 711 may be formed of a material such as iron.

The extension portion 711 includes a first extension portion 711a and a second extension portion 711b.

The first extension portion 711a is a portion directly coupled to the lever coupling member 720 and the lever insertion groove 730. One end portion of the first extension portion 711a is connected to the second extension portion 711b.

The second extension portion 711b is located between the first extension portion 711a and the knob 712. The second extension portion 711b is respectively connected to the first extension portion 711a and the knob 712.

The second extension portion 711b extends at a predetermined angle with the first extension portion 711a. In one implementation, the predetermined angle may be a right angle.

The second extension portion 711b extends at a predetermined angle with the knob 712. In one implementation, the second extension portion 711b may extend parallel to the knob 712. In addition, a central axis in an extending direction of the second extension portion 711b may be the same as a central axis in an extending direction of the knob 712.

The knob 712 is a portion where the user grips the lever member 710. The knob 712 extends from one side of the second extension portion 711b in a direction away from the first extension portion 711a (i.e., in a direction opposite to the first extension portion 711a). The knob 712 is continuous with the second extension portion 711b.

The knob 712 extends by a predetermined distance in a direction away from the second extension portion 711b (i.e., in a direction opposite to the second extension portion 711b). In one implementation, an extension length of the knob 712 and an extension length of the second extension portion 711b may be the same.

A grip member may be provided on an outer circumferential surface of the knob 712 to facilitate the user. The grip member increases a frictional force between the knob 712 and the user's palm gripping the knob 712. In one implementation, the grip member may be formed of a rubber material.

The lever member 710 is coupled to the lever coupling member 720. The user can pull or push the lever member 710 to move the lever coupling member 720 and the cart unit 510, to which the lever coupling member 720 is coupled, to the front side or the rear side.

The lever coupling member 510 is coupled to the cart unit 720. Specifically, the lever coupling member 720 is located on a front lower side of the cart body 511. The lever coupling member 720 may be fastened to the cart body 511 by the lever fastening member 531 (see FIG. 13).

The lever coupling member 720 protrudes by a predetermined distance in a direction away from the cart unit 510 (i.e., a direction opposite to the cart unit 510), namely, toward the front side in the illustrated implementation. By the protrusion, the user can easily identify the lever coupling member 720.

The lever coupling member 720 may be made of a material having high rigidity. In one implementation, the lever coupling member 720 may be formed of a material such as iron. This can minimize the deformation of the lever coupling member 720 even when pressure is applied by the lever member 710 made of the material with the rigidity.

The lever coupling member 720 includes a lever insertion hole 721.

The lever insertion hole 721 is formed through the inside of the lever coupling member 720. The first extension portion 711a of the lever member 710 is inserted through the lever insertion hole 721. The first extension portion 711a may be inserted through the lever insertion hole 721 and extend up to the lever insertion groove 730.

In the illustrated implementation, the lever insertion hole 721 has a rectangular cross-section. This is because an area in which the first extension portion 711a is in contact with the lever coupling member 720 is flat. The shape of the lever insertion hole 721 may change to correspond to the shape of the first extension portion 711a.

A length of the lever insertion hole 721 in the front and rear direction is preferably longer than a thickness of the first extension portion 711a. Accordingly, the first extension portion 711a can be inserted into the first lever insertion groove 731 or the second lever insertion groove 732 through the lever insertion hole 721.

A center of the lever insertion hole 721 may be located on the same plane or on the same line as centers of the first lever insertion groove 731 and the second lever insertion groove 732.

The lever insertion groove 730 is a space into which the end portion of the first extension portion 711a inserted through the lever insertion hole 721 is inserted. When the user pulls or pushes the knob 712 in the state in which the end portion of the first extension portion 711a is inserted into the lever insertion groove 730, the cart unit 510 may be moved to the front side or the rear side.

The lever insertion groove 730 is formed in the rail body 541. Specifically, the lever insertion groove 730 is recessed by a predetermined distance into the front side of the upper surface of the rail body 541.

The lever insertion groove 730 may be provided in plurality. In the illustrated implementation, two lever insertion grooves 730 are disposed. Of the two lever insertion grooves 730, one lever insertion groove 730 located in the front side may be defined as a first lever insertion groove 731, and the other lever insertion groove 730 located in the rear side may be defined as a second lever insertion groove 732, respectively.

The first lever insertion groove 731 is located in the front side of the rail body 541. Specifically, the first lever insertion groove 731 is located in the front end portion of the rail body 541. That is, the first lever insertion groove 731 is recessed by a predetermined distance into upper and front surfaces of the rail body 541.

An end portion of the first extension portion 711a is inserted into the first lever insertion groove 731. The inserted end portion of the first extension portion 711a is brought into contact with a rear side of the first lever insertion groove 731, namely, a surface in a direction away from the open side of the rail body 541 (i.e., a direction opposite to the open side).

In addition, the inserted end portion of the first extension portion 711a is also brought into contact with the lower surface of the first lever insertion groove 731. The lever member 710 may function as a lever by using those surfaces as "fulcrums".

The lever member 710 can be rotated in a counterclockwise direction, namely, a direction in which the knob 712 is moved away from the cart unit 510 (i.e., the direction opposite to the cart unit 510), after being inserted into the first lever insertion groove 731. Accordingly, the first extension portion 711a is brought into contact with the front end portion of the cart unit 510 or an end portion of the lever coupling portion 720 located at the rear side of the lever insertion hole 721.

The end portion of the cart unit 510 or the end portion of the lever coupling member 720 may serve as a "point of action". That is, the end portion is a point on which a force applied to the lever member 710 is exerted. It will be understood that the knob 712 functions as a "point of force".

The second lever insertion groove 732 is formed in the rear side of the first lever insertion groove 731.

The second lever insertion groove 732 is located in the front side of the rail body 541. Specifically, the second lever insertion groove 732 is spaced rearwardly apart by a predetermined distance from the first lever insertion groove 731, which is formed in the front end portion of the rail body 541. The second lever insertion groove 732 is recessed by a predetermined distance into the upper surface of the rail body 541.

The end portion of the first extension portion 711a is inserted into the second lever insertion groove 732. The inserted end portion of the first extension portion 711a is brought into contact with the rear side of the second lever insertion groove 732, namely, a surface in a direction away from the first lever insertion groove 731 (i.e., a direction opposite to the first lever insertion groove 731).

In addition, the inserted end portion of the first extension portion 711a is also brought into contact with the lower surface of the second lever insertion groove 732. The lever member 710 may function as a lever by using those surfaces as "fulcrums".

The lever member 710 may press the cart unit 510 in a state coupled respectively to the lever coupling member 720 and the lever insertion groove 730. That is, the lever member 710 can press the cart unit 510 in one direction, namely, toward the front side, of directions that the rail unit 540 extends, or another direction, namely, toward the rear side, of the directions that the rail unit 540 extends.

Specifically, the lever member 710 may be rotated in a clockwise direction, that is, in a direction in which the knob 712 approaches the cart unit 510 after being inserted into the second lever insertion groove 732. Accordingly, the second extension portion 711b is brought into contact with the front end portion of the cart unit 510 or an end portion of the lever coupling portion 720 disposed at the rear side of the lever insertion hole 721.

The end portion of the cart unit 510 or the end portion of the lever coupling member 720 may serve as a "point of action". That is, the end portion is a point on which a force applied to the lever member 710 is exerted. It will be understood that the knob 712 functions as a "point of force".

As described above, the extension portion 711 of the lever member 710 may be coupled through the lever insertion hole 721 of the lever coupling member 720. In addition, the end portion of the first extension portion 711a may be inserted into the first lever insertion groove 731 or the second lever insertion groove 732.

Figure 17:
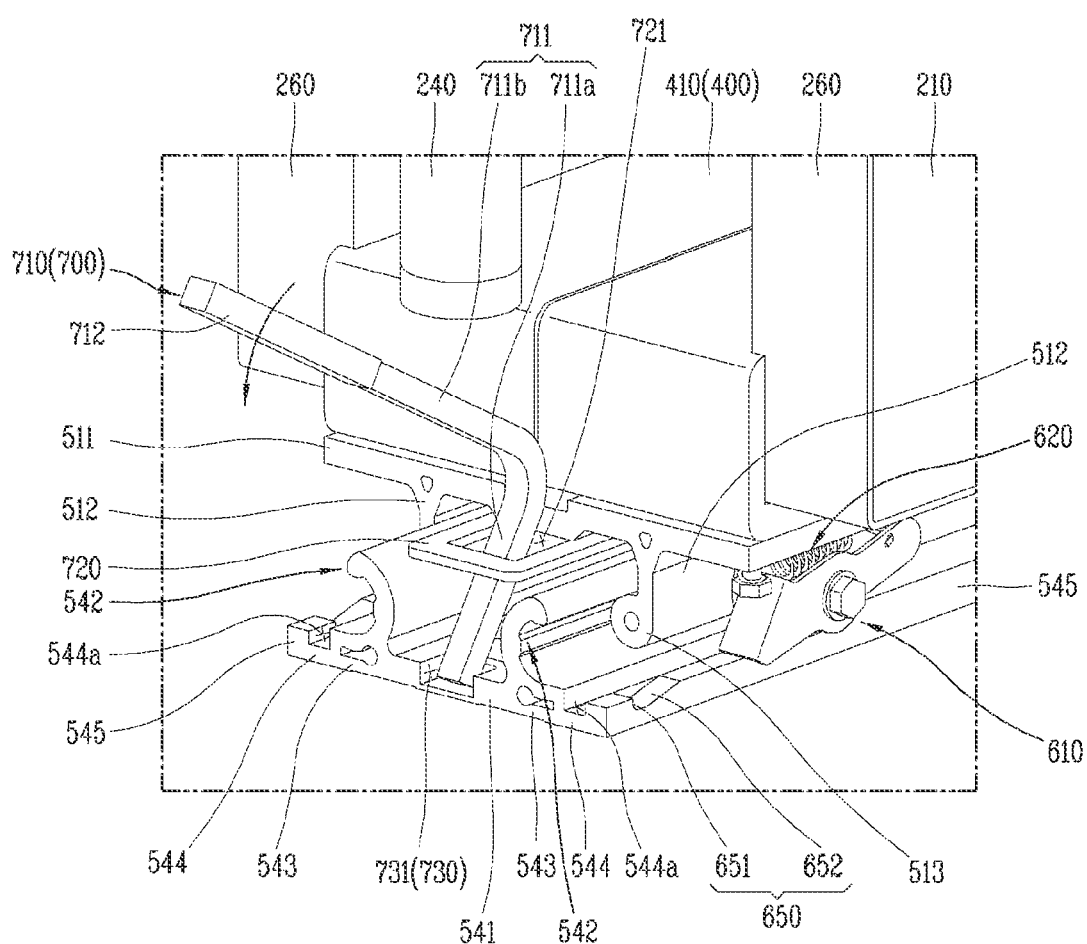
FIG. 17 is a perspective view illustrating a process in which a cart unit is drawn out using an installation and separation part provided in the sub-module of FIG. 2.

FIG. 17 illustrates a state in which the lever member 710 is inserted into the first lever insertion groove 731 in order to draw the cart unit 510 and the capacity assembly 100 or the valve assembly 200 seated on the cart unit 510 out of the rail unit 540.

When the user rotates the knob 712 in the direction away from the cart unit 510 (i.e., in the direction opposite to the cart unit 510), that is, counterclockwise, the front surface of the first extension portion 711a presses an end portion of the lever coupling member 720 located at the front side of the lever insertion hole 721.

Accordingly, the cart unit 510 to which the lever coupling member 720 is connected can be moved to the front side, so as to be slid off the rail unit 540. It will be understood that the stopper member 610 must be drawn out of the stop groove 650 before the process is performed.

Figure 18:
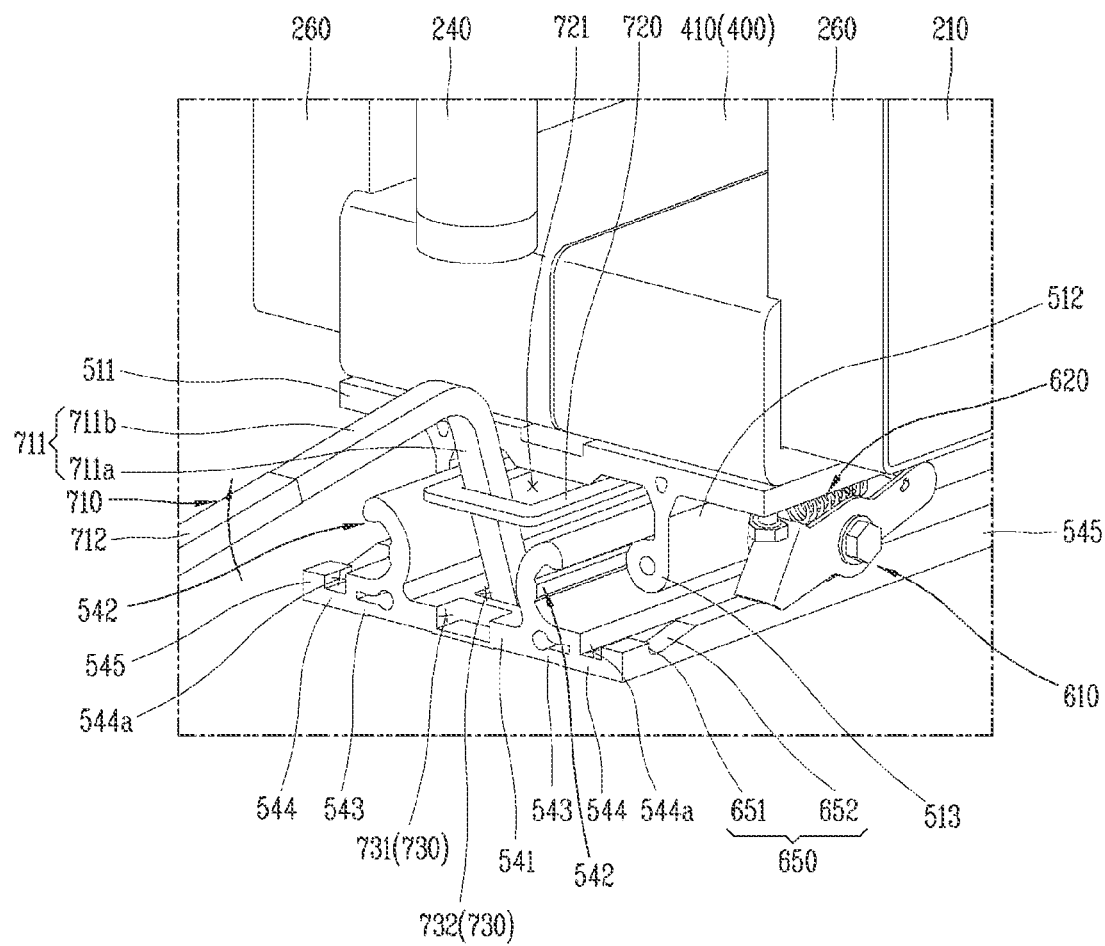
FIG. 18 is a perspective view illustrating a process in which the cart unit is coupled using the installation and separation part provided in the sub-module of FIG. 2.

FIG. 18 illustrates a state in which the lever member 710 is inserted into the second lever insertion groove 732 in order to couple the cart unit 510 and the capacity assembly 100 or the valve assembly 200 seated on the cart unit 510 to the rail unit 540.

When the user rotates the knob 712 toward the cart unit 510, namely, clockwise, the rear surface of the first extension portion 711a presses an end portion located at the rear side of the lever insertion groove 721.

Accordingly, the cart unit 510 to which the lever coupling member 720 is connected can be moved to the front side, so as to be slid on the rail unit 540.

Therefore, the coupling and separation process between the high-weight cart unit 510 and rail unit 540 can be easily performed.

9. Description of Short-Circuiting Control Part 800 According to Implementation

The sub-module 10 according to the implementation includes the short-circuiting control part 800. The short-circuiting control part 800 is configured to simultaneously short-circuit or ground each of the capacitor elements (not illustrated) accommodated in the plurality of capacitor assemblies 100 by a simple operation.

Hereinafter, the short-circuiting control part 800 according to the implementation will be described in detail, with reference to FIGS. 19 to 21. In the illustrated implementation, the short-circuiting control part 800 is installed on the frame 20. Accordingly, it can also be said that the short-circuiting control part 800 is included in the frame 20.

However, since the function of the short-circuiting control part 800 is to short-circuit the plurality of sub-modules 10, the following description will be described on the assumption that the short-circuiting control part 800 is included in the sub-module 10.

In the illustrated implementation, the short-circuiting control part 800 includes a movable member 810, a short-circuiting block 820, a variable connector 830, a link member 840, and an indicator member 850.

The movable member 810 simultaneously moves a plurality of variable connectors 830.

The movable member 810 is slidably coupled to the frame 20. Specifically, the movable member 810 is slidably coupled to a rear surface of the support portion 23 located at the rearmost side.

The movable member 810 is connected to the variable connector 830. When the movable member 810 is slid, the variable connector 830 can also be slid along with the movable member 810.

The movable member 810 is connected to the link member 840. The movable member 810 may be slid to the left or right, in response to the movement of the link member 840.

The movable member 810 extends in one direction. In the illustrated implementation, the movable member 810 extends in the left and right direction like the extending direction of the support portion 23. An extension length of the movable member 810 may be shorter than an extension length of the support portion 23.

The movable member 810 includes an extension body 811 and an end portion insertion groove 812.

The extension body 811 defines a body of the movable member 810. The extension body 811 extends in the longitudinal direction of the movable member 810.

The extension body 811 may be inserted between grooves formed in the short-circuiting blocks 820. That is, in the illustrated implementation, the extension body 811 is inserted into the grooves formed in central portions of the short-circuiting blocks 820 which are spaced apart from each other by a predetermined distance in the longitudinal direction.

Accordingly, the extension body 811 is located between movable member support portions 822 of the short-circuiting block 820. Further, the extension body 811 covers part of the short-circuiting block 820 located between the movable member support portions 822.

The extension body 811 can be moved in the left or right direction while being inserted into the groove. The movement is achieved by the movable member support portions 822 disposed on upper and lower sides of the short-circuiting block 820.

The end portion insertion groove 812 is formed in the extension body 811. Fastening members are disposed in the extension body 811 adjacent to end portions of the end portion insertion groove 812. The fastening members fasten the variable connector 830 to the extension body 811.

Both end portions of the variable connector 830 in the longitudinal direction are inserted into the end portion insertion grooves 812. The both end portions of the variable connector 830 inserted into the end portion insertion grooves 812 may be brought into contact with the parts of the short-circuiting blocks 820 through the end portion insertion grooves 812.

According to the sliding movement of the movable member 810, the short-circuiting block movable member 810 can be in contact with or separated from the short-circuiting block 820.

The end portion insertion groove 812 is formed through the extension body 811. The end portion insertion groove 812 extends by a predetermined distance in a direction that the extension body 811 extends.

The predetermined length of the end portion insertion groove 812 may be longer than a length of the short-circuiting block 820 in a widthwise direction, namely, a length thereof in the left and right direction. Accordingly, the end portions of the variable connector 830 inserted through the end portion insertion grooves 812 can be brought into contact with or spaced apart from the short-circuiting blocks 820.

The end portion insertion groove 812 may be provided in plurality. The plurality of end portion insertion grooves 812 are disposed to be spaced apart from one another by a predetermined distance. The predetermined distance may be shorter than a distance by which the short-circuiting blocks 820 are spaced apart from one another.

The variable connector 830 is partially inserted through the end portion insertion groove 812. Specifically, a first connector end portion 831 and a second connector end portion 832 of the variable connector 830 are respectively inserted through the end portion insertion groove 812.

In other words, the first connector end portion 831 and the second connector end portion 832 may be inserted through the end portion insertion groove 812 to be in contact with or be spaced apart from the short-circuiting block 820.

The short-circuiting block 820 is electrically in contact with or spaced apart from the variable connector 830.

When only one end portion of the variable connector 830 is in contact with the short-circuiting block 820, a voltage of each sub-module 10 can be maintained differently. When both end portions of the variable connector 830 are all in contact with the short-circuiting blocks 820, each sub-module 10 is short-circuited to each other, so that the voltage of each sub-module 10 can change to be the same.

The short-circuiting block 820 may be formed of a conductive material. In one implementation, the short-circuiting block 820 may be formed of a material such as aluminum (Al) or iron (Fe).

The short-circuiting block 820 extends in one direction. In the illustrated implementation, the short-circuiting block 820 extends in the up and down direction. That is, the short-circuiting block 820 and the movable member 810 extend to form a predetermined angle with each other.

The movable member support portions 822 are provided on the upper and lower sides of the short-circuiting block 820. A space into which the extension body 811 is inserted is defined between the movable member support portions 822.

A contact portion 823 is formed in the space by protruding in a direction away from the support portion 23 (i.e., in a direction opposite to the support portion 23).

The short-circuiting block 820 is provided in plurality. The plurality of short-circuiting blocks are disposed to be spaced apart from each other by a predetermined distance. The predetermined distance may be longer than a distance by which the end portion insertion grooves 812 are spaced apart from each other.

The short-circuiting block 820 extends in one direction, namely, in the up and down direction in the illustrated implementation. The short-circuiting block 820 has a rectangular cross-section. That is, the short-circuiting block 820 may be formed in a square pillar shape.

In the illustrated implementation, the cross-section of the short-circuiting block 820 has a trapezoidal shape in which one edge coupled to the frame 20 is the lower base and another edge facing the one edge, that is, another edge opposite to the frame 20 is the upper base.

In other words, a length in a direction (i.e., the left and right direction) in which the movable member 810 of one surface coupled to the frame, among surfaces of the short-circuiting block 820, extends is longer than a length in a direction (i.e., the left and right direction) in which the movable member 810 of another surface facing the one surface of the short-circuiting block extends.

Surfaces of the short-circuiting blocks 820, which are located adjacent to each other, face each other in an inclined state. In one implementation, the respective surfaces facing each other may extend at an acute angle with respect to one surface (i.e., the front surface) of the short-circuiting block 820 which is coupled to short-circuiting block the frame 20.

That is, the surfaces of the adjacent short-circuiting blocks 820 facing each other are inclined in a direction away from the frame 20. In other words, the surfaces of the adjacent short-circuiting blocks 820 facing each other are inclined to be apart from each other in a direction toward the movable member 810.

That is, in the illustrated implementation, a distance between the surfaces facing each other along a direction toward the rear side may increase as the surfaces are getting far away from the frame 20.

Due to the shape of the short-circuiting block 820, the first connector end portion 831 and the second connector end portion 832 of the variable connector 830 can come into contact with the surfaces (i.e., the inclined surfaces) of the short-circuiting blocks 820 and can easily come into contact with the short-circuiting blocks 820.

In addition, the first connector end portion 831 and the second connector end portion 832 of the variable connector 830 can easily enter the another surface (i.e., a surface facing the frame 20 with being spaced apart from the frame 20) of the short-circuiting block 20 along the surface (i.e., the inclined surface) of the short-circuiting block 820.

Accordingly, the short-circuiting block 820 and the variable connector 830 can be in elastic contact without a separate elastic member. That is, the variable connector 830 comes into contact with the short-circuiting block 820 while applying an elastic force to the short-circuiting block 820 in a direction toward the frame 20. A detailed description thereof will be described later.

The short-circuiting block 820 includes a short-circuiting wire 821, a movable member support portion 822, and a contact portion 823.

The short-circuiting wire 821 electrically connects the blocking plate 640 and the variable connector 830. One end portion of the short-circuiting wire 821 is electrically connected to the blocking plate 640. Another end portion of the short-circuiting wire 821 is electrically connected to the variable connector 830.

Accordingly, the rail unit 540 and the capacitor assembly 100 that electrically come in contact with the blocking plate 640 can be electrically connected to the variable connector 830.

That is, the variable connector 830 may be electrically connected to external electronic equipment.

Although this specification has been described on the assumption that the external electronic equipment is the capacitor assembly 100 accommodating the capacitor element (not illustrated) therein, it will be understood that the short-circuiting control part 800 according to the implementation can be applied to any electronic equipment requiring for a short-circuit.

The short-circuiting wire 821 may be provided in plurality. The plurality of short-circuiting wires 821 are electrically connected to the plurality of blocking plates 640 and the plurality of variable connectors 830, respectively.

The movable member support portion 822 supports the movable member 810 to be slidable while the movable member 810 is inserted into the short-circuiting block 820.

The movable member support portion 822 may be rotatably coupled to the short-circuiting block 820. When the movable member 810 is slid in the left or right direction, the movable member support portion 822 may also be rotated. The movable member coupling portion 822 may be provided in plurality.

In the illustrated implementation, two movable member support portions 822 are provided, respectively, on an upper side and a lower side of the short-circuiting block 820.

The movable member support portion 822 includes a first part 822a in contact with the short-circuiting block 820, and a second part 822b continuous with the first part 822a and located in a direction away from the short-circuiting block 820 (i.e., a direction opposite to the short-circuiting block 820).

A diameter of the first part 822a may be smaller than a diameter of the second part 822b. In addition, the first part 822a protrudes by a predetermined length from one surface of the short-circuiting block 820 in a direction away from the support part 23 (i.e., a direction opposite to the support portion 23). The length may be greater than or equal to the thickness of the movable member 810.

Accordingly, a predetermined space is defined between the one surface of the short-circuiting block 820 and the second part 822b. Upper and lower end portions of the movable member 810 may be inserted into the predetermined spaces defined in the upper and lower sides, respectively.

The contact portion 823 is a portion with which the respective end portions 831 and 832 of the variable connector 830 are in contact. The contact portion 823 is located between the plurality of movable member support portions 822.

The contact portion 823 protrudes by a predetermined length in a direction away from the support portion 23 (i.e., in a direction opposite to the support portion 23). Accordingly, the respective end portions 831 and 832 of the variable connector 830 can easily come into contact with the contact portion 823.

Each end portion of the contact portion 823 in a widthwise direction, that is, in the left and right direction in the illustrated implementation, may be inclined in a direction toward the support portion 23. That is, the respective end portions of the contact portion 823 may be configured such that a protrusion length increases in a direction toward each other.

Accordingly, the respective end portions 831 and 832 of the variable connector 830 can easily enter the inside of the contact portion 823. Also, the respective end portions 831 and 832 of the variable connector 830 can be easily separated to the outside of the contact portion 823.

The variable connector 830 electrically connects or disconnects the different short-circuiting blocks 820. The variable connector 830 is in contact with or spaced apart from any one or more of the plurality of short-circuiting blocks 820 adjacent to each other.

The variable connector 830 may be made of a conductive material. In one implementation, the variable connector 830 may be formed of a copper (Cu) material.

The variable connector 830 may be configured as a member having elasticity. In one implementation, the variable connector 830 may be configured as a leaf spring.

Accordingly, the first connector end portion 831 and the second connector end portion 832 may be elastically deformed when being in contact with the contact portion 823. Accordingly, a contact state between the first connector end portion 831 and the second connector end portion 832 and the contact portion 823 can be stably maintained.

In addition, when the first connector end portion 831 and the second connector end portion 832 are spaced apart from the contact portion 823, such end portions can be elastically deformed to return to their original shape by a stored restoring force.

Specifically, the first connector end portion 831 and the second connector end portion 832 store an elastic force through a predetermined shape deformation when moving along the inclined surface of the short-circuiting block 820.

At this time, the short-circuiting block 820 is formed in a trapezoidal shape. Therefore, as each connector end portion 831, 832 is moved toward a surface facing the frame 20 (i.e., a surface between the both inclined surfaces), the elastic force stored in each connector end portion 831, 832 is increased.

When each connector end 831, 832 is moved along the surface (i.e., the inclined surface) of the short-circuiting block 820 and enters the another surface of the short-circuiting block 820, the shortest distance between each connector end portion 831, 832 and the short-circuiting block 820 is further reduced. Accordingly, the maximum elastic force can be stored in each of the connector end portions 831 and 832.

Accordingly, the variable connector 830 can be deformed in shape to be brought into contact with the short-circuiting block 820 in the state in which the elastic force is stored, and can be moved in one direction (i.e., the left and right direction) in which the movable member 810 extends.

Accordingly, even if a separate elastic member is not provided, contact reliability between the variable connector 830 and the short-circuiting block 820 can be improved.

The variable connector is coupled to the movable member 810. The variable connector 830 can be slid in the left and right direction together with the movable member 810.

The variable connector 830 can be located at one of a first position at which it is electrically brought into contact with at least one of the short-circuiting blocks 820 adjacent to each other, and a second position at which it is spaced apart from all of the short-circuiting blocks 820 adjacent to each other.

In other words, the variable connector 830 may be brought into contact with the two short-circuiting blocks 820 adjacent to each other, may brought into contact with only one of the short-circuiting blocks 820, or may not be brought into contact with the two short-circuiting blocks 820.

The variable connector 830 is electrically connected to the short-circuiting wire 821. Accordingly, the variable connector 830 is electrically connected to the blocking plate 640.

The variable connector 830 extends by a predetermined length in the direction in which the movable member 810 extends, that is, in the left and right direction in the illustrated implementation. An extension length of the variable connector 830 is preferably determined according to a distance by which the short-circuiting blocks 820 are spaced apart from each other.

Specifically, the extension length of the variable connector 830 is preferably greater than or equal to a distance between the end portions at which the contact portions 823 of the adjacent short-circuiting blocks 820 face each other.

Figure 20A:
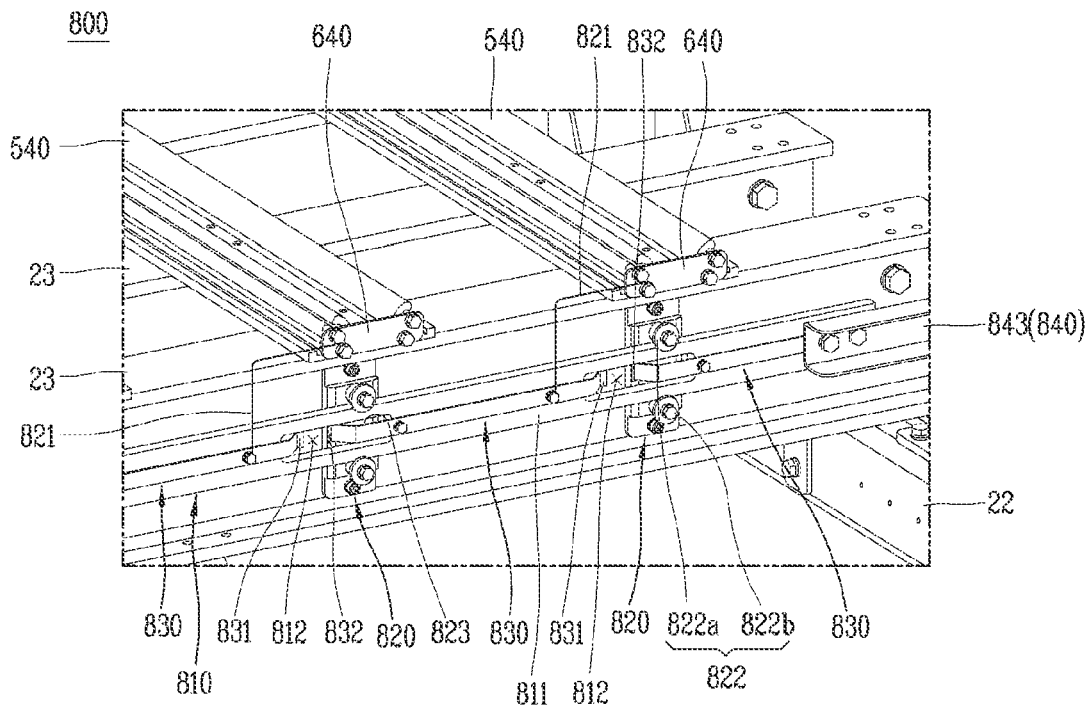
FIG. 20A is a perspective view illustrating a state before each sub-module is short-circuited with each other by the short-circuiting control part of FIG. 19.
Figure 20B:
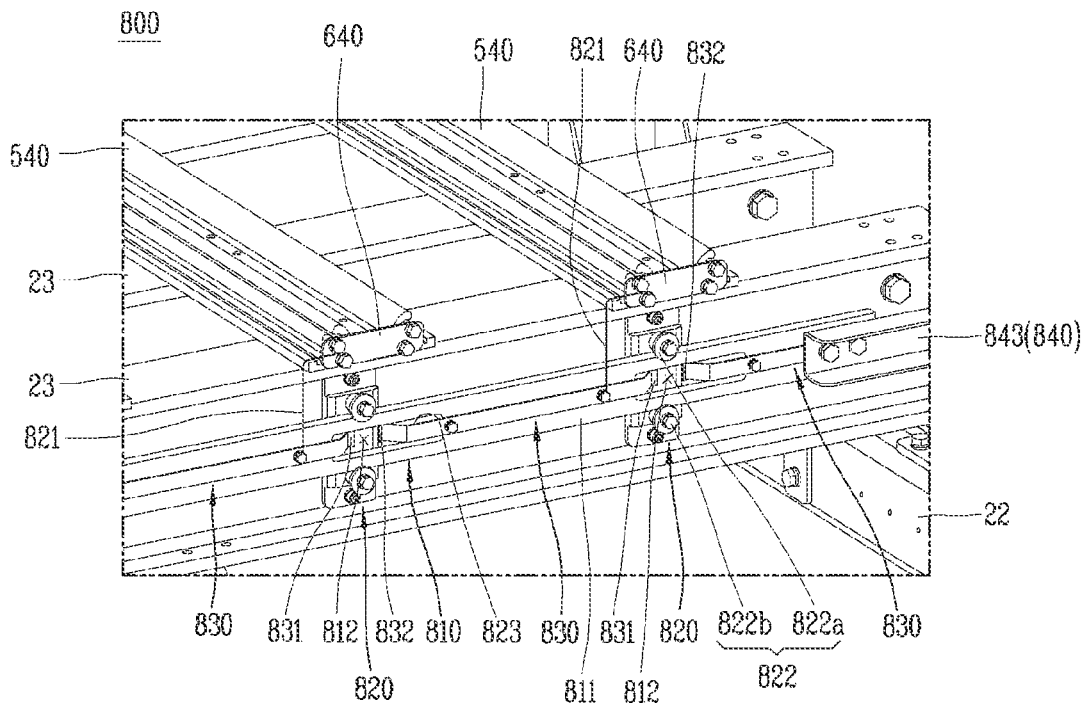
FIG. 20B is a perspective view illustrating a state in which each sub-module has been short-circuited with each other by the short-circuiting control part of FIG. 19.

That is, in the implementation illustrated in FIG. 20B, the extension length of the variable connector 830 is preferably greater than or equal to a distance between one end portion of the short-circuiting block 820 with which the first connector end portion 831 of the variable connector 830 is in contact and one end portion of the short-circuiting block 820 with which the second connector end portion 832 is in contact.

Accordingly, when the movable member 810 is slid, the first connector end portion 831 and the second connector end portion 832 of the variable connector 830 can be electrically connected to the different short-circuiting blocks 820, respectively. Accordingly, different sub-modules 10 can be short-circuited at the same time.

The variable connector 830 includes the first connector end portion 831 and the second connector end portion 832.

The first connector end portion 831 is defined as one end portion of the variable connector 830 in the longitudinal direction. In the illustrated implementation, the first connector end portion 831 is located on the left side of the variable connector 830. The first connector end portion 831 is bent toward the contact portion 823.

The second connector end portion 832 is defined as another end portion of the variable connector 830 in the longitudinal direction. In the illustrated implementation, the second connector end portion 832 is located on the right side of the variable connector 830. The second connector end portion 832 is located on an opposite side to the first connector end portion 831. The second connector end portion 832 is bent toward the contact portion 823.

The first connector end portion 831 and the second connector end portion 832 are continuous with a portion which is located therebetween and extends in the one direction (i.e., the left and right direction).

The first connector end portion 831 and the second connector end portion 832 may extend toward the frame 20 to be inclined with respect to the portion. In one implementation, the first connector end portion 831 and the second connector end portion 832 may extend at an obtuse angle with the portion.

Accordingly, in the illustrated implementation, when viewed from the top, the cross-section of the variable connector 830 has a shape of a part of a trapezoid that the first connector end portion 831 and the second connector end portion 832 are oblique sides and the portion of the variable connector 830 is the lower base.

The first connector end portion 831 and the second connector end portion 832 may be spaced apart from the frame 20. In addition, the first connector end portion 831 and the second connector end portion 832 may extend to be in contact with the short-circuiting blocks 820.

In other words, the first connector end portion 831 and the second connector end portion 832 are not in contact with the frame 20, but may extend to be in contact with the short-circuiting blocks 820.

Accordingly, when the variable connector 830 is moved in the one direction (i.e., the left and right direction), each connector end portion 831 and 832 can be brought into contact with the inclined surface of the short-circuiting block 820, elastically deformed, and moved in the one direction.

Accordingly, when the variable connector 830 is brought into contact with the short-circuiting block 820, the variable connector 830 is deformed in shape and moved while storing the elastic force. That is, the variable connector 830 and the short-circuiting block 820 are elastically brought into contact with each other/In addition, one side of each of the first connector end portion 831 and the second connector end portion 832 that faces the frame 20, namely, the front side in the illustrated implementation may be rounded.

Accordingly, when the movable member 810 is moved in the one direction (i.e., the left and right direction), the first connector end portion 831 and the second connector end portion 832 can easily enter the inclined surfaces of the short-circuiting blocks 820.

This can secure contact pressure greater than or equal to a certain level between the variable connector 830 and the short-circuiting block 820. Accordingly, contact reliability between the variable connector 830 and the short-circuiting block 820 can be guaranteed.

The first connector end portion 831 and the second connector end portion 832 may be respectively inserted through the end portion insertion grooves 812.

The first connector end portion 831 is inserted through any one end portion insertion groove 812, to be electrically brought into contact with the contact portion 823 of any one short-circuiting block 820.

The second connector end portion 832 is inserted through another end portion insertion groove 812, to be electrically brought into contact with the contact portion 823 of another short-circuiting block 820.

It will be understood that the one end portion insertion groove 812 and the another end portion insertion groove 812 through which the first connector end portion 831 and the second connector end portion 832 are respectively inserted are disposed adjacent to each other.

Similarly, it will be understood that the one short-circuiting block 820 and the another short-circuiting block 820 with which the first connector end portion 831 and the second connector end portion 832 are electrically brought into contact are also disposed adjacent to each other.

That is, the variable connector 830 can be slid between the short-circuiting blocks 820 adjacent to each other, and can be electrically brought into contact with at least one of the adjacent short-circuiting blocks 820 at the same time.

In the implementation illustrated in FIG. 20A, the variable connector 830 is electrically brought into contact with only one of the short-circuiting blocks 820 adjacent to each other. That is, the second connector end portion 832 is brought into contact with any one short-circuiting block 820, and the first connector end portion 831 is not brought into contact with another short-circuiting block 820.

In this state, the plurality of sub-modules 10 are not short-circuited with each other. Accordingly, the capacitor elements (not illustrated) provided in the plurality of sub-modules 10 may maintain different voltages.

In the implementation illustrated in FIG. 20B, the variable connector 830 is electrically brought into contact with each of the short-circuiting blocks 820 adjacent to each other. That is, the second connector end portion 832 is maintained in the contact state with the one short-circuiting block 820, and the first connector end portion 831 is electrically brought into contact with the another short-circuiting block 820.

Although not illustrated, the variable connector 830 may be spaced apart from all of the short-circuiting blocks 820 adjacent to each other, as described above.

Accordingly, the short-circuiting blocks 820 are electrically connected to each other through the variable connector 830. Similarly, the capacitor elements (not illustrated) of each sub-module 10 that is electrically connected to each short-circuiting block 820 is also electrically connected.

In this state, the plurality of sub-modules 10 are short-circuited with each other. Accordingly, the capacitor elements (not illustrated) provided in the plurality of sub-modules 10 may be changed to the same voltage. In one implementation, the state may be a grounded state.

The link member 840 is connected to the movable member 810 to convert a rotational motion of the short-circuiting control lever 854 into a linear motion of the movable member 810. The link member 840 is connected to each of the movable member 810 and the short-circuiting control lever 854.

The link member 840 may have any shape capable of converting the rotational motion into the linear motion or the linear motion to the rotational motion. In one implementation, the link member 840 may be configured as a two-bar link or a three-bar link.

The link member 840 includes a rotation shaft portion 841, a first link 842, and a second link 843.

The rotation shaft portion 841 transmits the rotational motion of the short-circuiting control lever 854 to the first link 842. The rotation shaft portion 841 is connected to the short-circuiting control lever 854 and the first link 842. The rotation shaft portion 841 can rotate together with the short-circuiting control lever 854 and the first link 842.

In the illustrated implementation, the rotation shaft portion 841 is disposed to be spaced apart from the vertical frame 21 by a predetermined distance. In one implementation, the rotation shaft portion 841 may extend in the up and down direction, that is, perpendicular to the ground.

The rotation shaft portion 841 may be maintained perpendicular to the ground while being spaced apart from the vertical frame 21 by a predetermined distance by a supporting member.

An insulating member 24 may be provided on a lower side of the rotation shaft portion 841. The insulating member 24 may surround the outside of the rotation shaft portion 841 adjacent to the indicator member 850. Accordingly, a safety accident due to high pressure that may occur when the user manipulates the indicator member 850 can be prevented.

The first link 842 transmits the rotational motion of the rotation shaft portion 841 to the second link 843.

The first link 842 extends in one direction. One side of the first link 842 in the extending direction is connected to the rotation shaft portion 841. In one implementation, the first link 842 may be coupled through the rotation shaft portion 841. The first link 842 may be rotated together with the rotation shaft portion 841.

Another side of the first link 842 is rotatably coupled to the second link 843. When the first link 842 is rotated, the second link 843 may be linearly moved.

The second link 843 converts the rotational motion of the first link 842 into the linear motion and transmits it to the movable member 810.

The second link 843 extends in one direction. In the illustrated implementation, the second link 843 extends in the left and right direction.

One side of the second link 843 in the extending direction is rotatably coupled to the first link 842. When the first link 842 rotates, the second link 843 moves linearly in a direction toward the movable member 810 or away from the movable member 810 (i.e., in a direction opposite to the movable member 810).

Another side of the second link 843 in the extending direction is coupled to the movable member 810. When the second link 843 moves linearly, the movable member 810 also linearly moves in a direction away from the second link 843 (i.e., in a direction opposite to the second link 843) or in a direction toward the second link 843.

The indicator member 850 is manipulated by the user. The user can manipulate the short-circuiting control lever 854 to short-circuit the plurality of sub-modules 10 to the same voltage or release the short-circuited state.

The indicator member 850 is located adjacent to the insulating member 24 disposed on the lower side of the rotation shaft portion 841. Accordingly, an electrical injury to a user who approaches the indicator member 850 can be prevented.

The indicator member 850 includes an indicator housing 851, a first display 852, a second display 853, a short-circuiting control lever 854, and a pin member 855.

The indicator housing 851 defines the body of the indicator member 850. In the illustrated implementation, the indicator housing 851 has a recessed central portion in the widthwise direction. That is, when viewed from the top, the indicator housing 851 may have a shape like an alphabet "C".

The indicator housing 851 may be spaced apart from the sub-module 10. Accordingly, the user can manipulate the short-circuiting control lever 854 even without approaching the sub-module 10. Accordingly, a safety accident due to the contact with the sub-module 10 can be prevented.

The first display 852, the second display 853, the short-circuiting control lever 854, and the pin member 855 are disposed on an upper surface of the indicator housing 851.

The first display 852 and the second display 853 output whether the plurality of sub-modules 10 are in a short-circuited state. The user can visually recognize whether the sub-modules 10 are in the short-circuited state through the first display 852 and the second display 853.

The first display 852 and the second display 853 are spaced apart from each other by a predetermined distance. The predetermined distance may be determined according to a rotation radius and a rotation angle of the short-circuiting control lever 854.

Specifically, the first display 852 may be located to be covered by the short-circuiting control lever 854 when the short-circuiting control lever 854 is rotated toward the first display 852. In one implementation, the first display 852 may be completely covered by the short-circuiting control lever 854 when the short-circuiting control lever 854 is fully rotated.

Similarly, the second display 853 may be located to be covered by the short-circuiting control lever 854 when the short-circuiting control lever 854 is rotated toward the second display 853. In one implementation, the second display 853 may be completely covered by the short-circuiting control lever 854 when the short-circuiting control lever 854 is fully rotated.

The first display 852 may be covered in any one of a state where the plurality of sub-modules 10 are short-circuited and a state where the plurality of sub-modules 10 are not short-circuited. In addition, the second display 853 may be covered in another one of the state where the plurality of sub-modules 10 are short-circuited and the state where the plurality of sub-modules 10 are not short-circuited.

The first display 852 and the second display 853 may display a state different from a state formed by rotating the short-circuiting control lever 854.

That is, when the short-circuiting control lever 854 is rotated to obscure the first display 852, the state displayed on the second display 853 may be an electrical connection state caused by the rotation of the short-circuiting control lever 854.

That is, when the short-circuiting control lever 854 is rotated to obscure the second display 853, the state displayed on the first display 852 may be an electrical connection state caused by the rotation of the short-circuiting control lever 854.

That is, the first display 852 and the second display 853 are alternately covered or exposed in each state. Accordingly, the user can determine whether each sub-module 10 is in a short-circuited state based on whether or not the first display 852 and the second display 853 are exposed.

The short-circuiting control lever 854 is manipulated to short-circuit the plurality of sub-modules 10 or release the short-circuited state at the same time. The short-circuiting control lever 854 may be rotated automatically or manually.

The short-circuiting control lever 854 is rotatably coupled to the indicator housing 851. The coupling is achieved by the pin member 855.

The short-circuiting control lever 854 is connected to the rotation shaft portion 841. When the short-circuiting control lever 854 is rotated, the rotation shaft portion 841 may also be rotated. As described above, the rotation is transmitted to the movable member 810 through the first and second links 842 and 843.

The short-circuiting control lever 854 extends by a predetermined length. In one implementation, the short-circuiting control lever 854 may extend by a length which is longer than a distance between the pin member 855 and the first and second displays 852 and 853.

Accordingly, the short-circuiting control lever 854 can be rotated to cover any one of the first display 852 or the second display 853 in the state of being rotatably coupled to the indicator housing 851 by the pin member 855.

The pin member 855 rotatably couples the short-circuiting control lever 854 to the indicator housing 851. The pin member 855 functions as a rotation shaft of the short-circuiting control lever 854.

The pin member 855 may be located at one end portion in a direction in which the short-circuiting control lever 854 extends. In one implementation, the pin member 855 may be located on one end portion of the short-circuiting control lever 854 in a direction away from, namely, opposite to the first and second displays 852 and 853.

Figure 21:
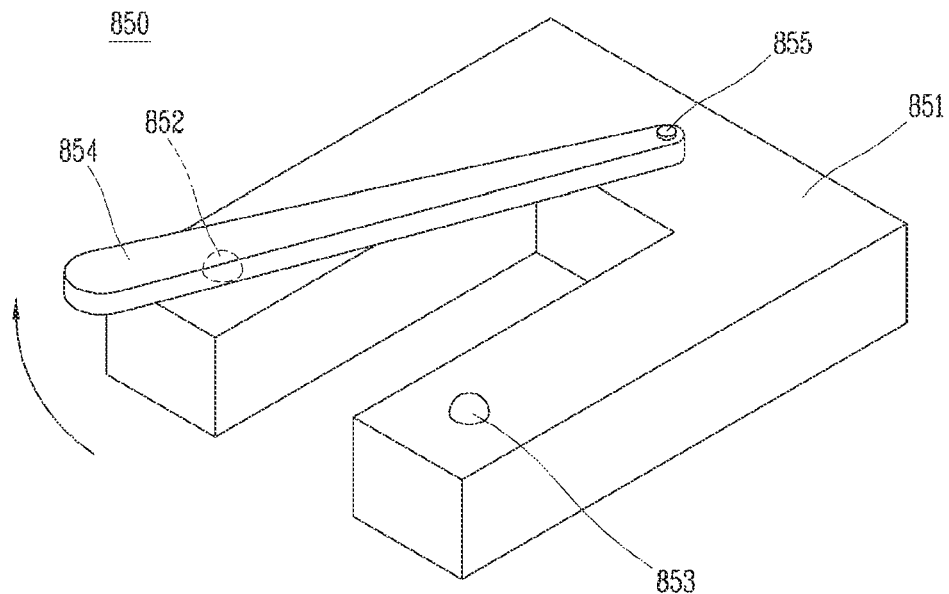
FIG. 21 is a schematic view illustrating a process in which a short-circuiting control lever of an indicator member provided in the short-circuiting to control part of FIG. 19 is rotated.
Figure 21:
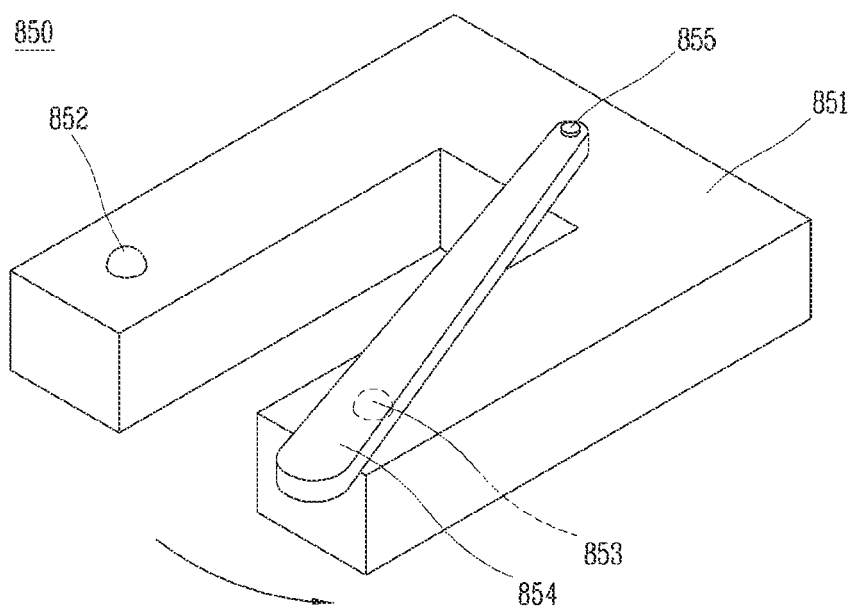

Referring to (a) of FIG. 21, a state in which the short-circuiting control lever 854 is rotated clockwise to cover the first display 852 is illustrated. That is, the second display 853 is exposed.

Referring to (a) of FIG. 21, a state in which the short-circuiting control lever 854 is rotated counterclockwise to cover the second display 853 is illustrated. That is, the second display 852 is exposed.

It will be understood that the illustration of the rotation shaft portion 841 is omitted in the implementation illustrated in FIG. 21.

As the short-circuiting control lever 854 is rotated, the rotation shaft portion 841 is also rotated. The rotation is transmitted to the movable member 810 through the first and second links 842 and 843, so that the movable member 810 is slid to the left or right.

As described above, the variable connector 830 is electrically in contact with any one or more of the short-circuiting blocks 820 adjacent to each other.

When the variable connector 830 is in contact with any one short-circuiting block 820, the respective sub-modules 10 may be maintained at different voltages. When the variable connectors 830 are in contact with all of the short-circuiting blocks 820 adjacent to each other, each sub-module 10 may be short-circuited and changed to the same voltage.

The movement of the variable connector 830 is achieved by the movable member 810. The movable member 810 is slidably coupled to the support portion 23. The variable connector 830 is coupled to the movable member 810 to be slid together with the movable member 810.

The movement of the movable member 810 is achieved by the rotation of the short-circuiting control lever 854 and the link member 840. The rotational motion of the short-circuiting control lever 854 is converted into the linear motion through the link member 840, such that the movable member 810 is slid.

The rotation of the short-circuiting control lever 854 is output by the first display 852 and the second display 853. When any one of the first display 852 and the second display 853 is covered by the short-circuiting control lever 854, the state according to the rotation of the short-circuiting control lever 854 can be displayed.

Accordingly, the plurality of sub-modules 10 can be easily short-circuited, and the user can easily recognize the short-circuited state.

10. Description of Cooling Passage Part 900 According to Implementation

The sub-module 10 according to the implementation includes the cooling passage part 900. The cooling passage part 900 communicates with the cooling plate 430 of the explosion-proof frame part 400. The cooling passage part 900 transfers a cooling fluid of low temperature to the cooling plate 430.

In addition, the cooling passage part 900 receives a cooling fluid that has exchanged heat with the IGBT 440 while flowing inside the cooling plate 430.

The cooling passage part 900 is installed in the sub-module 10 and the frame 20. Accordingly, the cooling passage part 900 may also be considered as a component included in the frame 20. In the following description, for convenience of explanation, it is assumed that the cooling passage part 900 is a component of the sub-module 10.

The term "low-temperature cooling fluid" used in the following description refers to a cooling fluid that is supplied from the outside and has not exchanged heat with the IGBT 440.

The term "high-temperature cooling fluid" used in the following description refers to a cooling fluid that has exchanged heat with the IGBT 440.

Hereinafter, the cooling passage part 900 according to the implementation will be described in detail, with reference to FIGS. 22 to 25.

Each of pipes 911, 912, 921, 922, 931, 932, and 950 to be described below may be formed in any shape capable of defining a passage (flow path) therein. In one implementation, the main pipe unit 910 may be configured as a pipe member.

In the illustrated implementation, the cooling passage part 900 includes a main pipe unit 910, a sub pipe unit 920, a branch pipe unit 930, a pipe connection unit 940, a valve connection pipe 950, and a residual water collection unit 960.

The main pipe unit 910 communicates with an external cooling fluid circulation device (not illustrated). A low-temperature cooling fluid may flow from the cooling fluid circulation device (not illustrated) to the main pipe unit 910. In addition, a high-temperature cooling fluid may flow from the main pipe unit 910 to the cooling fluid circulation device (not illustrated).

The main pipe unit 910 communicates with the sub pipe unit 920. The low-temperature cooling fluid flowed to the main pipe unit 910 may flow into the sub pipe unit 920. The high-temperature cooling fluid flowed to the sub pipe unit 920 may flow into the main pipe unit 910.

The main pipe unit 910 communicates with the branch pipe unit 930. The branch pipe unit 930 communicates with the sub pipe unit 920. Accordingly, the main pipe unit 910 and the sub pipe unit 920 may communicate with each other.

The main pipe unit 910 extends in one direction, namely, in the left and right direction in the illustrated implementation. Each end portion of the main pipe unit 910 in its extending direction is seated on the horizontal frame 22.

The single main pipe unit 910 may be provided for each frame 20. That is, as described above, the frame 20 may be provided in plurality stacked on one another. In this case, the single main pipe unit 910 may be provided for each stacked frame 20.

The main pipe unit 910 includes a main inlet pipe 911, a main outlet pipe 912, a main pipe fixing member 913, a fastening member 914, and a clearance space 915.

The low-temperature cooling fluid is introduced into the main inlet pipe 911 from the cooling fluid circulation device (not illustrated). The main inlet pipe 911 communicates with the cooling fluid circulation device (not illustrated).

The low-temperature cooling fluid introduced into the main inlet pipe 911 flows to the sub inlet pipe 921 through the branch inlet pipe 931. The main inlet pipe 911 communicates with the branch inlet pipe 931 and the sub inlet pipe 921.

The main outlet pipe 912 is located adjacent to the main inlet pipe 911.

The high-temperature cooling fluid is introduced into the main outlet pipe 912 from the sub outlet pipe 922 and the branch outlet pipe 932. The main outlet pipe 912 communicates with the branch outlet pipe 932 and the sub outlet pipe 922.

The high-temperature cooling fluid introduced into the main outlet pipe 912 flows to the cooling fluid circulation device (not illustrated). The main outlet pipe 912 communicates with the cooling fluid circulation device (not illustrated).

The main pipe fixing member 913 supports the main inlet pipe 911 and the main outlet pipe 912 on the horizontal frame 22. The main pipe fixing member 913 is seated on an upper surface of the horizontal frame 22.

The main pipe fixing member 913 may be provided in plurality. The plurality of main pipe fixing members 913 may be provided on the left horizontal frame 22 and the right horizontal frame 22, respectively.

The main pipe fixing member 913 extends in one direction, namely, in the front and rear direction in the illustrated implementation. In addition, a length of the main pipe fixing member 913 in the widthwise direction thereof, namely, in the left and right direction in the illustrated implementation may be shorter than or equal to a length of the horizontal frame 22 in the widthwise direction.

Through holes are formed through the main pipe fixing member 913. One side of the main inlet pipe 911 and one side of the main outlet pipe 912 in the longitudinal direction are coupled through the through holes, respectively.

The main pipe fixing member 913 includes a first part directly coupled to the horizontal frame 22 and a second part located on an upper side of the first part and coupled to the first part. That is, the first part is located between the second part and the horizontal frame 22.

The main pipe fixing member 913 includes fastening through portions 913a. The fastening through portions 913a are located adjacent to both end portions of the first part and the second part in the longitudinal direction. The fastening through portions 913a are formed in a penetrating manner at the positions in the up and down direction.

Fastening members (not illustrated) are fastened to the fastening through portions 913a. Accordingly, the first part and the second part can be coupled to each other.

Specifically, the first part is coupled to the horizontal frame 22 by the fastening member 914, and the main inlet pipe 911 and the main outlet pipe 912 are coupled through the through holes. Next, after the second part is seated on the first part, the main inlet pipe 911, and the main outlet pipe 912, the fastening members (not illustrated) may be fastened to the fastening through portions 913a.

It will be understood that a portion of each through hole is formed through the first part and the remaining portion of the through hole is formed through the second part.

The fastening member 914 fixes the main pipe fixing member 913 to the horizontal frame 22. Specifically, the fastening member 914 is coupled through a fastening hole (not illustrated) that is formed through the first part of the main pipe fixing member 913.

The fastening member 914 may be provided in plurality. In the illustrated implementation, two fastening members 914 are disposed at each of a front side and a rear side of the main pipe fixing member 913, so a total of four fastening members 914 are provided.

The clearance space 915 is a space defined between the first part and the second part of the main pipe fixing member 913. The clearance space 915 is defined so that surfaces of the first part and the second part facing each other are spaced apart by a predetermined distance. In a state in which the clearance space 915 is defined, the fastening members (not illustrated) are coupled through the fastening through portions 913a.

The clearance space 915 may compensate for an increase in volume that may be generated as the cooling fluid flows through the main inlet pipe 911 or the main outlet pipe 912. In addition, the clearance space 915 can reduce vibration generated in response to the operation of the sub-module 10, thereby preventing damage on the main inlet pipe 911 or the main outlet pipe 912 due to the vibration.

The sub pipe unit 920 communicates with the main pipe unit 910 and the pipe connection unit 940. The low-temperature cooling fluid introduced into the main pipe unit 910 may flow into the pipe connection unit 940 through the sub pipe unit 920. In addition, the high-temperature cooling fluid transferred from the pipe connection unit 940 may flow into the main pipe unit 910 through the sub pipe unit 920.

The sub pipe unit 920 communicates with the main pipe unit 910. The communication is achieved by the branch pipe unit 930 communicating with each of the main pipe unit 910 and the sub pipe unit 920. In addition, the sub pipe unit 920 communicates with the pipe connection unit 940.

The sub pipe unit 920 extends in one direction, namely, in the front and rear direction in the illustrated implementation. One side of the sub pipe unit 920, namely, a rear end portion in the illustrated implementation is connected to an end portion of the branch pipe unit 930. Another side of the sub pipe unit 920, namely, a front end portion in the illustrated implementation is connected to the pipe connection unit 940.

The sub pipe unit 920 may be provided in plurality. The plurality of sub pipe units 920 may be provided for each sub-module 10.

The sub pipe unit 920 includes a sub inlet pipe 921 and a sub outlet pipe 922.

The sub inlet pipe 921 is a passage through which the low-temperature cooling fluid introduced from the main inlet pipe 911 passes. The low-temperature cooling fluid may flow into the pipe connection unit 940 through the sub inlet pipe 921.

The sub outlet pipe 922 is a passage through which the high-temperature cooling fluid introduced from the pipe connection unit 940 passes. The high-temperature cooling fluid may flow into the main outlet pipe 912 through the sub outlet pipe 922.

The branch pipe unit 930 is disposed at a portion where the sub pipe unit 920 and the main pipe unit 910 communicate with each other.

The branch pipe unit 930 communicates with the main pipe unit 910 and the sub pipe unit 920. The branch pipe unit 930 communicates with each of the main pipe unit 910 and the sub pipe unit 920.

The branch pipe unit 930 may be formed in a joint structure. That is, an angle between one end portion at which the branch pipe unit 930 is connected to the main pipe unit 910 and another end portion at which the branch pipe unit 930 is connected to the sub pipe unit 920 may vary.

In one implementation, the angle between the one end portion and the another end portion of the branch pipe unit 930 may be a right angle.

Accordingly, the main pipe unit 910 and the sub pipe unit 920 may communicate with each other without deformation in shape.

The branch pipe unit 930 may be provided in plurality. The plurality of branch pipe units 930 may be provided for each sub-module 10.

The branch pipe unit 930 includes a branch inlet pipe 931 and a branch outlet pipe 932.

The branch inlet pipe 931 is a passage through which the low-temperature cooling fluid introduced into the main inlet pipe 911 flows to the sub inlet pipe 921. The branch inlet pipe 931 communicates with each of the main inlet pipe 911 and the sub inlet pipe 921.

The branch outlet pipe 932 is a passage through which the high-temperature cooling fluid introduced into the sub outlet pipe 922 flows to the main outlet pipe 912. The branch outlet pipe 932 communicates with each of the main outlet pipe 912 and the sub outlet pipe 922.

The pipe connection unit 940 allows the sub pipe unit 920 and the valve connection pipe 950 to communicate with each other. The pipe connection unit 940 communicates with each of the sub pipe unit 920 and the valve connection pipe 950.

Also, the pipe connection unit 940 supports the sub pipe unit 920 and the valve connection pipe 950. This can result in stably maintaining the coupling state between the sub pipe unit 920 and the valve connection pipe 950.

The pipe connection unit 940 may be provided in plurality. The plurality of pipe connection units 940 may be provided for each sub-module 10.

The pipe connection unit 940 includes an end portion connection member 941, a pipe support member 942, and a pipe fixing member 943.

The end portion connection member 941 allows the sub pipe unit 920 and the valve connection pipe 950 to be coupled to each other such that an end portion of the sub pipe unit 920 and an end portion of the valve connection pipe 950 which face each other can communicate with each other. The end portion connection member 941 is located between the sub pipe unit 920 and the valve connection pipe 950.

The end portion connection member 941 communicates with each of the sub pipe unit 920 and the valve connection pipe 950. The cooling fluid can flow from the sub pipe unit 920 to the valve connection pipe 950 or vice versa through the end portion connection member 941.

The end portion connection member 941 includes a first end portion connection member 941a and a second end portion connection member 941b.

The first end portion connection member 941a is connected to the end portion of the sub pipe unit 920. The first end portion connection member 941a communicates with the sub pipe unit 920.

Figure 25:
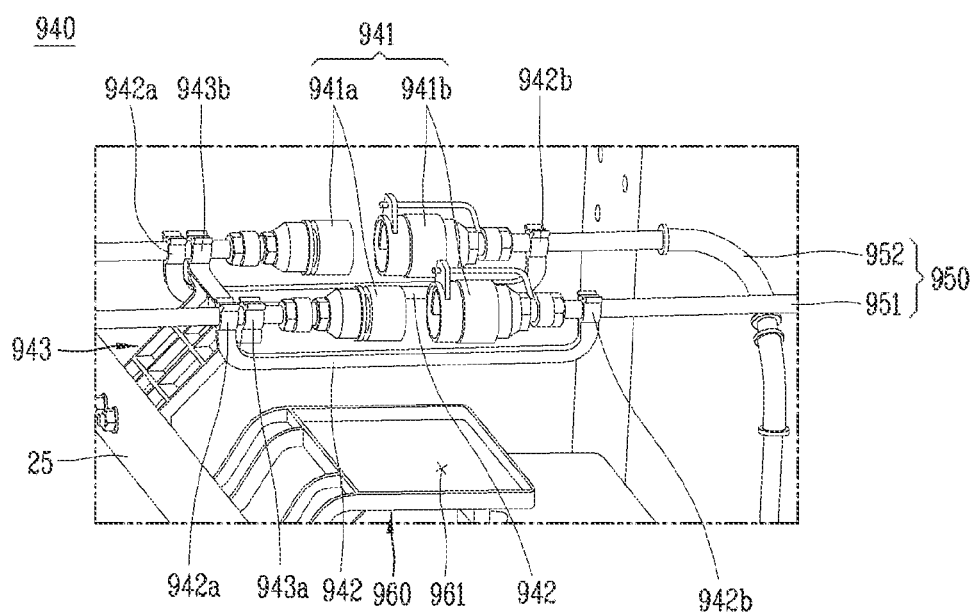
FIG. 25 is a partially enlarged perspective view illustrating a connection relationship between a pipe connection unit and a valve connection pipe of the cooling passage part of FIG. 22.

As illustrated in FIG. 25, the first end portion connection member 941a may be provided in plurality. The plurality of first end portion connection members 941a are coupled to respective end portions of the sub inlet pipe 921 and the sub outlet pipe 922 facing the valve connecting pipe 950.

The second end portion connection member 941b is connected to the end portion of the valve connection pipe 950. The second end portion connection member 941b communicates with the valve connection pipe 950.

As illustrated in FIG. 25, the second end portion connection member 941b may be provided in plurality. The plurality of second end portion connection members 941b are coupled to respective end portions of the valve inlet pipe 951 and the valve outlet pipe 952 facing the sub pipe unit 920.

An end portion of the first end portion connection member 941a and an end portion of the second end connection member 941b which face each other may be coupled to each other. The first end portion connection member 941a and the second end portion connection member 941b communicate with each other.

The pipe support member 942 supports the sub pipe unit 920 and the valve connection pipe 950. The pipe support member 942 is coupled to each of the sub pipe unit 920 and the valve connection pipe 950.

As will be described later, the sub pipe unit 920 may be fixed by a pipe fixing member 943 coupled to the fixing frame 25. The pipe support member 942 simultaneously supports the stably fixed sub pipe unit 920 and valve connection pipe 950.

Accordingly, the valve connection pipe 950 can also be stably supported, which may result in stably maintaining the connected state between the sub pipe unit 920 and the valve connection pipe 950.

In the illustrated implementation, the pipe support member 942 is located below the sub pipe unit 920 and the valve connection pipe 950. The position of the pipe support member 942 may vary.

The pipe support member 942 extends in a direction in which the sub pipe unit 920 extends, namely, in the front and rear direction in the illustrated implementation.

The pipe support member 942 may be formed of a material capable of being deformed in shape. In one implementation, the pipe support member 942 may be formed of a synthetic resin. Accordingly, even if vibration is generated as the sub-module 10 is operated, the shape of the pipe support member 942 can be deformed and the vibration can be buffered accordingly.

One side of the pipe support member 942 in its extending direction, namely, the front side in the illustrated implementation extends up to the sub pipe unit 920. The front end portion of the pipe support member 942 is bent toward the sub pipe unit 920.

A first clip portion 942a is provided on the bent portion. The first clip portion 942a includes a pair of curved surfaces facing each other. A predetermined space is defined between the curved surfaces. One side of the sub pipe unit 920 facing the end portion connection member 941 is detachably inserted into the predetermined space.

Another side of the pipe support member 942 in its extending direction, namely, the rear side in the illustrated implementation extends up to the valve connection pipe 950. The rear end portion of the pipe support member 942 is bent toward the valve connection pipe 950.

A second clip portion 942b is provided on the bent portion. The second clip portion 942b includes a pair of curved surfaces facing each other. A predetermined space is defined between the curved surfaces. One side of the valve connection pipe 950 facing the end portion connection member 941 is detachably inserted into the predetermined space.

The pipe fixing member 943 fixes the sub pipe unit 920. The pipe fixing member 943 is coupled to the sub pipe unit 920.

The pipe fixing member 943 may be formed of a material capable of being deformed in shape. In one implementation, the pipe fixing member 943 may be formed of a synthetic resin. Accordingly, even if vibration is generated as the sub-module 10 is operated, the shape of the pipe fixing member 943 can be deformed and the vibration can be buffered accordingly.

The pipe fixing member 943 is coupled to the fixing frame 25. Specifically, one side of the pipe fixing member 943 facing the capacitor assembly 100 is fastened to the fixing frame 25.

The pipe fixing member 943 extends from the one side toward the sub pipe unit 920. The pipe fixing member 943 may include a vertical portion and an inclined portion.

The vertical portion is a portion where the pipe fixing member 943 is in contact with and coupled to the fixing frame 25. The vertical portion may extend along one side of the fixing frame 25, namely, along the rear surface in the illustrated implementation.

The inclined portion extends toward the sub pipe unit 920 from an upper end portion of the vertical portion. The inclined portion extends at a predetermined angle with the vertical portion. In one implementation, the predetermined angle may be an obtuse angle.

A first fixing portion 943a is formed on one side of an upper end portion of the inclined portion. The first fixing portion 943a includes a pair of curved surfaces facing each other. A predetermined space is defined between the curved surfaces. One side of the sub inlet pipe 921 facing the end portion connection member 941 is detachably inserted into the predetermined space.

A second fixing portion 943b is formed on another side of the upper end portion of the inclined portion. The second fixing portion 943b includes a pair of curved surfaces facing each other. A predetermined space is defined between the curved surfaces. One side of the sub outlet pipe 922 facing the end portion connection member 941 is detachably inserted into the predetermined space.

In summary, the sub pipe unit 920 and the valve connection pipe 950 are fixed and supported by the pipe connection unit 940. This can result in stably maintaining the coupling state between the sub pipe unit 920 and the valve connection pipe 950.

The valve connection pipe 950 allows the pipe connection unit 940 and the cooling plate 430 to communicate with each other. The valve connection pipe 950 communicates with the pipe connection unit 940 and the cooling plate 430.

The valve connection pipe 950 may be provided in plurality. The plurality of valve connection pipes 950 communicate with an inlet 431 and the pipe connection unit 940, and an outlet 432, and the pipe connection unit 940, respectively.

The valve connection pipe 950 extends between the pipe connection unit 940 and the cooling plate 430. The valve connection pipe 950 may be provided in plurality. The plurality of valve connection pipes 950 may be provided for each sub-module 10.

The valve connection pipe 950 includes a valve inlet pipe 951 and a valve outlet pipe 952.

The low-temperature refrigerant fluid introduced through the sub inlet pipe 921 flows into the valve inlet pipe 951. The valve inlet pipe 951 communicates with the inner space of the cooling plate 430 through the inlet 431.

The introduced low-temperature cooling fluid flows into the inner space of the cooling plate 430 through the inlet 431.

The valve outlet pipe 952 is located adjacent to the valve inlet pipe 951.

The high-temperature cooling fluid that has exchanged heat with the IGBT 440 while flowing through the cooling plate 430 is introduced into the valve outlet pipe 952. The valve outlet pipe 952 communicates with the inner space of the cooling plate 430 through the outlet 432.

The introduced high-temperature cooling fluid flows to the main outlet pipe 912 through the valve outlet pipe 952.

The residual water collection unit 960 collects residual water discharged from the pipe connection unit 940. The residual water collection unit 960 may be located below a point where the first end portion connection member 941a and the second end portion connection member 941b are coupled to each other.

The residual water collection unit 960 is coupled to the capacitor assembly 100. Specifically, the residual water collection unit 960 is coupled to a bracket member disposed on an upper surface of the capacitor assembly 100.

The residual water collection unit 960 may be detachably coupled to the capacitor assembly 100. When residual water exceeding a predetermined capacity is collected by the residual water collection unit 960, the user can detach the residual water connection unit 960 to discharge the collected residual water.

The residual water collection unit 960 may be provided in plurality. The plurality of residual water collection units 960 may be provided for each sub-module 10.

The residual water collection unit 960 extends upwardly from the capacitor assembly 100. Specifically, the residual water collection unit 960 includes a first part extending parallel to the upper surface of the capacitor assembly 100, a second part extending upwardly from the first part at a predetermined angle with the first part, and a third part extending horizontally from the second part.

The residual water connection unit 960 includes a residual water collection space 961. The residual water collection space 961 is a space in which residual water dropped (leaked) from the pipe connection unit 940 is collected. The residual water collection space 961 is recessed into the third part by a predetermined distance.

As described above, the cooling passage part 900 circulates the cooling fluid for cooling the IGBT 440. The low-temperature cooling fluid flows from the cooling fluid circulation device (not illustrated) to the cooling plate 430 sequentially through the main inlet pipe 911, the branch inlet pipe 931, the sub inlet pipe 921, the pipe connection unit 940, and the valve inlet pipe 951.

The low-temperature cooling fluid introduced into the cooling plate 430 exchanges heat with the IGBT 440 while flowing through the inner space of the cooling plate 430. The heat generated in the IGBT 440 is transferred to the low-temperature cooling fluid. Accordingly, the low-temperature cooling fluid changes into the high-temperature cooling fluid.

The high-temperature cooling fluid is discharged from the cooling plate 430. The discharged high-temperature cooling fluid flows into the cooling fluid circulation device (not illustrated) sequentially through the valve outlet pipe 952, the pipe connection unit 940, the sub outlet pipe 922, the branch outlet pipe 932, and the main outlet pipe 912.

Accordingly, the heat generated in the IGBT 440 can be discharged by the cooling fluid. Accordingly, the IGBT 440 can be maintained at an appropriate temperature, so that operation reliability of the sub-module 10 can be improved.

Also, the sub pipe unit 920 and the valve connection pipe 950 are supported by the pipe support member 942. In addition, the sub pipe unit 920 is fixed by the pipe fixing member 943.

This can prevent the release of each coupled component of the cooling passage part 900 due to the vibration generated as the sub-module 10 is operated.

The residual water collection unit 960 is provided below the pipe connection unit 940. The residual water collection unit 960 collects the residual water dropped from the pipe connection unit 940. Accordingly, the dropped residual water can be prevented from flowing into the capacitor assembly 100 or the valve assembly 200.

This can prevent the components of the sub-module 10 from being damaged due to a randomly leaked cooling fluid.

Although it has been described above with reference to the preferred implementations of the present disclosure, it will be understood that those skilled in the art are able to variously modify and change the present disclosure without departing from the scope of the invention described in the claims below.

- 1: Modular Multilevel Converter
- 10: Sub Module
- 20: Frame
- 21: Vertical frame
- 22: Horizontal frame
- 23: Support portion
- 24: Insulating member
- 25: Fixed frame
- 100: Capacitor assembly
- 110: Capacitor housing
- 120: Capacitor connector
- 121: First capacitor connector
- 122: Second capacitor connector
- 200: Valve assembly
- 210: Valve cover
- 220: Valve connector
- 230: Input bus bar
- 231: First input bus bar
- 232: Second input bus bar
- 240: Bypass switch
- 250: Output bus bar
- 260: Insulating housing
- 261: First wall
- 262: Second wall
- 263: Third wall
- 264: Fourth wall
- 270: Insulating layer
- 280: Printed circuit board
- 300: Grounding part
- 310: Grounding rod unit
- 310a: First grounding rod unit
- 310b: Second grounding rod unit
- 311: Body portion
- 312: Coupling portion
- 313: Grounding conductor
- 314: Grounding wire
- 315: Sealing portion
- 316: Resistor portion
- 320: Grounding connector
- 321: First grounding connector
- 322: Second grounding connector
- 330: Grounding protrusion
- 331: First grounding protrusion
- 332: Second grounding protrusion
- 340: Grounding wire
- 341: PCB grounding wire
- 342: Housing grounding wire
- 343: Bus bar grounding wire
- 400: Explosion-proof frame part
- 410: Case unit
- 411: Protrusion
- 412: Grounding rod through hole
- 413: IGBT accommodating portion
- 413a: First IGBT accommodating portion
- 413b: Second IGBT accommodating portion
- 413c: Partition wall
- 414: Inner wall
- 414a: First inner wall
- 414b: Second inner wall
- 415: Outer wall
- 415a: First outer wall
- 415b: Second outer wall
- 416: Internal communication groove
- 416a: First internal communication groove 416b: Second internal communication groove
417: External communication groove
417a: First external communication groove
417b: Second external communication groove
418: Buffer space
418a: First buffer space
418b: Second buffer space
419: Edge portion
420: Electric connection bus bar
421: First electric connection bus bar
422: Second electric connection bus bar
430: Cooling plate
431: Inlet
432: Outlet
440: IGBT
441: First IGBT
442: Second IGBT
500: Rail assembly
510: Cart unit
510a: Capacitor cart unit
510b: Valve cart unit
511: Cart body
511a: Elastic member coupling part
512: Extension portion
513: Round portion
513a: Cart hollow portion
514: Wheel portion
514a: Wheel body
514b: Disk portion
514c: Cart coupling portion
520: Bracket unit
521: Horizontal portion
522: Vertical portion
530: Fastening unit
531: Lever fastening member
532: Wheel fastening member
540: Rail unit
541: Rail body
542: Rail curved portion
542a: First rail curved portion
542b: Second rail curved portion
542c: Third rail curved portion
542d: Side limiting portion
542e: Top limiting portion
543: Rail extension portion
543a: Fastening hole
544: Step portion
544a: Guide space
545: Support portion
600: Separation prevention part
610: Stopper member
611: Stopper body
612: Locking plate
613: Wheel coupling portion
614: Elastic member coupling hole
620: Rotation bearing member
630: Elastic member
631: Cart connection portion
632: Stopper connection portion
640: Blocking plate
641: Blocking fastening member
650: Stop groove
651: First surface
652: Second surface
700: Installation and separation part
710: Lever member
711: Extension portion
711a: First extension portion
711b: Second extension portion
712: Knob
720: Lever coupling member
721: Lever insertion hole
730: Lever Insertion Groove
731: First lever insertion groove
732: Second lever insertion groove
800: Short-circuiting control part
810: Movable member
811: Extension body
812: End portion insertion groove
820: Short-circuiting block
821: Short-circuiting wire
822: Movable member support portion
822a: First portion
822b: Second portion
823: Contact portion
830: Variable connector
831: First connector end portion
832: Second connector end portion
840: Link member
841: Rotation shaft portion
842: First link
843: Second link
850: Indicator member
851: Indicator housing
852: First display
853: Second display
854: Short-circuiting control lever
855: Pin member
900: Cooling passage part
910: Main pipe unit
911: Main inlet pipe
912: Main outlet pipe
913: Main pipe fixing member
913a: Fastening through portion
914: Fastening member
915: Clearance space
920: Sub pipe unit
921: Sub inlet pipe
922: Sub outlet pipe
930: Branch pipe unit
931: Branch inlet pipe
932: Branch outlet pipe
940: Pipe connection unit
941: End portion connection member
941a: First end portion connection member
941b: Second end portion connection member
942: Pipe support member
942a: First clip portion
942b: Second clip portion
943: Pipe fixing member
943a: First fixing portion
943b: Second fixing portion
950: Valve connection pipe
951: Valve inlet pipe
952: Valve outlet pipe
960: Residual water collection unit
961: Residual water collection space

The invention claimed is:
1. A sub-module comprising:
a variable connector electrically connected to external electronic equipment;
a movable member coupled to the variable connector and extending in one direction; and a short-circuiting block electrically brought into contact with or spaced apart from the variable connector, wherein the electronic equipment is seated on one surface of a frame, wherein the short-circuiting block is coupled to another surface of the frame, and wherein the movable member is coupled to the another surface of the frame to be slidable in the one direction or in a direction opposite to the one direction, and wherein the short-circuiting block is provided in plurality disposed to be spaced apart from each other by a predetermined distance, and wherein the variable connector is located between adjacent short-circuiting blocks of the plurality of short-circuiting blocks, and moved together with the movable member when the movable member is slid in the one direction or the opposite direction to the one direction, so as to be located at:

a first position where the variable connector is electrically brought into contact with at least one of the adjacent short-circuiting blocks; and a second position where the variable connector is spaced apart from all of the adjacent short-circuiting blocks, and wherein surfaces, facing each other, of the adjacent short-circuiting blocks are inclined away from each other in a direction toward the movable member.

2. The sub-module of claim 1, wherein the electronic equipment is provided in plurality, and wherein the plurality of electronic equipment is electrically connected to a plurality of variable connectors, respectively.

3. The sub-module of claim 2, wherein the plurality of electronic equipment electrically connected to the short-circuiting blocks adjacent to each other, respectively, are short-circuited to each other when the variable connector is electrically brought into contact with the short-circuiting blocks.

4. The sub-module of claim 2, wherein the electronic equipment is a capacitor assembly accommodating a capacitor element therein.

5. The sub-module of claim 1, wherein the short-circuiting block has a trapezoidal shape with a cross-section in which an extension length of one surface coupled to the frame in the one direction is longer than an extension length of another surface facing the one surface in the one direction.

6. The sub-module of claim 1, wherein the variable connector extends in the one direction.

7. The sub-module of claim 6, wherein the variable connector comprises:

a first connector end portion that is an end portion facing any one of the short-circuiting blocks adjacent to each other; and a second connector end portion that is an end portion located opposite to the first connector end portion and facing another one of the short-circuiting blocks adjacent to each other.

8. The sub-module of claim 7, wherein the first connector end portion is electrically brought into contact with the one of the short-circuiting blocks adjacent to each other, and wherein the second connector end portion is electrically brought into contact with or spaced apart from the another short-circuiting block when the movable member is slid in the one direction or the opposite direction to the one direction.

9. The sub-module of claim 8, wherein each of the first connector end portion and the second connector end portion is formed such that one side facing the frame is rounded.

10. The sub-module of claim 1, further comprising:

a link member coupled to the movable member; and a short-circuiting control lever coupled to the link member, and wherein the movable member is moved in the one direction or the opposite direction to the one direction when the short-circuiting control lever is rotated.

11. The sub-module of claim 10, wherein the link member comprises:

a rotation shaft portion coupled to the short-circuiting control lever;

a first link coupled to the rotation shaft portion to perform an orbiting motion according to a rotation of the rotation shaft portion; and a second link coupled to the first link to perform a translational motion by the orbiting motion of the first link, and wherein the movable member is coupled to the second link.

12. A sub-module comprising:

a variable connector electrically connected to external electronic equipment;

a movable member coupled to the variable connector and extending in one direction; and a short-circuiting block electrically brought into contact with or spaced apart from the variable connector, wherein the electronic equipment is seated on one surface of a frame, wherein the short-circuiting block is coupled to another surface of the frame, and wherein the movable member is coupled to the another surface of the frame to be slidable in the one direction or in a direction opposite to the one direction, and wherein the short-circuiting block is provided in plurality disposed to be spaced apart from each other by a predetermined distance, and wherein the variable connector is located between adjacent short-circuiting blocks of the plurality of short-circuiting blocks, and moved together with the movable member when the movable member is slid in the one direction or the opposite direction to the one direction, so as to be located at:

a first position where the variable connector is electrically brought into contact with at least one of the adjacent short-circuiting blocks; and a second position where the variable connector is spaced apart from all of the adjacent short-circuiting blocks, and wherein the variable connector extends in the one direction, wherein the variable connector comprises:

a first connector end portion that is an end portion facing any one of the short-circuiting blocks adjacent to each other; and a second connector end portion that is an end portion located opposite to the first connector end portion and facing another one of the short-circuiting blocks adjacent to each other, and wherein the variable connector includes a portion extending between the first connector end portion and the second connector end portion, and wherein the first connector end portion and the second connector end portion each form an obtuse angle with the portion and extend toward the frame, such that a cross-section thereof has a shape of a part of a trapezoid.

13. A sub-module comprising:
a variable connector electrically connected to external electronic equipment;
a movable member coupled to the variable connector and extending in one direction; and
a short-circuiting block electrically brought into contact with or spaced apart from the variable connector,
wherein the electronic equipment is seated on one surface of a frame,
wherein the short-circuiting block is coupled to another surface of the frame, and
wherein the movable member is coupled to the another surface of the frame to be slidable in the one direction or in a direction opposite to the one direction, and
wherein the short-circuiting block is provided in plurality disposed to be spaced apart from each other by a predetermined distance, and
wherein the variable connector is located between adjacent short-circuiting blocks of the plurality of short-circuiting blocks, and moved together with the movable member when the movable member is slid in the one direction or the opposite direction to the one direction, so as to be located at:
a first position where the variable connector is electrically brought into contact with at least one of the adjacent short-circuiting blocks; and
a second position where the variable connector is spaced apart from all of the adjacent short-circuiting blocks, and
wherein the movable member comprises a plurality of end portion insertion grooves formed therethrough and extending in the one direction, the plurality of end portion insertion grooves spaced apart from each other by a predetermined distance, and
wherein the variable connector is disposed to face the frame with the movable member interposed therebetween, and extends between the end portion insertion grooves adjacent to each other.

14. The sub-module of claim 13, wherein the variable connector extends in the one direction,
wherein any one of end portions of the variable connector in the extending direction extends through one of the end portion insertion grooves adjacent to each other, and
wherein another one of the end portions of the variable connector in the extending direction extends through another one of the end portion insertion grooves adjacent to each other.

15. A sub-module comprising:
a variable connector electrically connected to external electronic equipment;
a movable member coupled to the variable connector and extending in one direction;
a short-circuiting block electrically brought into contact with or spaced apart from the variable connector;
a link member coupled to the movable member;
a short-circuiting control lever coupled to the link member; and
an indicator housing to which the short-circuiting control lever is rotatably coupled,
wherein the electronic equipment is seated on one surface of a frame,
wherein the short-circuiting block is coupled to another surface of the frame, and
wherein the movable member is coupled to the another surface of the frame to be slidable in the one direction or in a direction opposite to the one direction, and
wherein the short-circuiting block is provided in plurality disposed to be spaced apart from each other by a predetermined distance, and
wherein the variable connector is located between adjacent short-circuiting blocks of the plurality of short-circuiting blocks, and moved together with the movable member when the movable member is slid in the one direction or the opposite direction to the one direction, so as to be located at:
a first position where the variable connector is electrically brought into contact with at least one of the adjacent short-circuiting blocks; and
a second position where the variable connector is spaced apart from all of the adjacent short-circuiting blocks, and
wherein the movable member is moved in the one direction or the opposite direction to the one direction when the short-circuiting control lever is rotated, and
wherein the indicator housing comprises a first display and a second display spaced apart from the first display by a predetermined distance.

16. The sub-module of claim 15, wherein the first display is located to be biased in one direction in which the short-circuiting control lever is rotated, and
wherein the second display is located to be biased in a direction opposite to the one direction in which the short-circuiting control lever is rotated.

17. The sub-module of claim 16, wherein the short-circuiting control lever is located to cover the first display when the short-circuiting control lever is rotated at a predetermined angle in the one direction, and
wherein the short-circuiting control lever is located to cover the second display when the short-circuiting control lever is rotated at a predetermined angle in the opposite direction to the one direction.

* * * * *